(12) United States Patent
Bairo

(10) Patent No.: US 11,405,575 B2
(45) Date of Patent: Aug. 2, 2022

(54) SOLID-STATE IMAGING ELEMENT, COMPARATOR, AND ELECTRONIC DEVICE

(71) Applicant: Sony Semiconductor Solutions Corporation, Kanagawa (JP)

(72) Inventor: Masaaki Bairo, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 81 days.

(21) Appl. No.: 16/955,905

(22) PCT Filed: Nov. 28, 2018

(86) PCT No.: PCT/JP2018/043770
§ 371 (c)(1),
(2) Date: Jun. 19, 2020

(87) PCT Pub. No.: WO2019/130963
PCT Pub. Date: Jul. 4, 2019

(65) Prior Publication Data
US 2021/0021778 A1   Jan. 21, 2021

(30) Foreign Application Priority Data
Dec. 26, 2017   (JP) .............................. JP2017-248889

(51) Int. Cl.
*H04N 5/378* (2011.01)
*H01L 27/146* (2006.01)
(Continued)

(52) U.S. Cl.
CPC ....... *H04N 5/378* (2013.01); *H01L 27/14605* (2013.01); *H01L 27/14612* (2013.01);
(Continued)

(58) Field of Classification Search
CPC ......... H01L 27/14605; H01L 27/14612; H01L 27/14625; H01L 27/146; H01L 27/14601;
(Continued)

(56) References Cited

U.S. PATENT DOCUMENTS 4,463,383 A * 7/1984 Soneda ................ H03G 1/0017
330/257
7,418,683 B1 * 8/2008 Sonnard ................ G06F 30/398
716/122
(Continued)

FOREIGN PATENT DOCUMENTS

JP    2013-090305 A    5/2013
JP    2015-138851 A    7/2015
(Continued)

*Primary Examiner* — Albert H Cutler
(74) *Attorney, Agent, or Firm* — Michael Best & Friedrich LLP

(57) ABSTRACT

A solid-state imaging element of the present disclosure includes: a pixel array in which a plurality of unit pixels is arranged in a matrix shape, the plurality of unit pixels each including a photoelectric conversion unit; and an analog-to-digital conversion unit that converts an analog pixel signal into a digital signal, the analog pixel signal being output from each of the plurality of unit pixels of the pixel array. Then, the analog-to-digital conversion unit includes a comparator that includes a differential input unit and an active load of the differential input unit, the differential input unit using, as an input, a prescribed reference signal and the analog pixel signal. At least one transistor that configures the active load includes a plurality of control terminals that controls current. The plurality of control terminals is electrically connected in common.

15 Claims, 32 Drawing Sheets

(51) Int. Cl.
*H04N 5/357* (2011.01)
*H04N 5/374* (2011.01)
*H04M 1/02* (2006.01)
*H04N 5/225* (2006.01)

(52) U.S. Cl.
CPC ....... *H01L 27/14643* (2013.01); *H04N 5/357* (2013.01); *H04N 5/374* (2013.01)

(58) Field of Classification Search
CPC ......... H01L 27/14609; H01L 27/14614; H01L 27/14643; H04M 1/02; H04M 1/0264; H04N 5/225; H04N 5/2254; H04N 5/2257; H04N 5/335; H04N 5/357; H04N 5/365; H04N 5/3651; H04N 5/3658; H04N 5/369; H04N 5/374; H04N 5/378; H04N 5/379
See application file for complete search history.

(56) References Cited

U.S. PATENT DOCUMENTS

| | | | |
|---|---|---|---|
| 2008/0192127 A1* | 8/2008 | Sakai | H04N 5/335 348/222.1 |
| 2010/0032671 A1* | 2/2010 | Marshall | H01L 21/823437 257/48 |
| 2011/0215868 A1* | 9/2011 | Thakker | H03F 3/45475 330/252 |
| 2012/0056670 A1* | 3/2012 | Slavov | H03F 3/217 330/251 |
| 2014/0232916 A1* | 8/2014 | Nagai | H01L 27/14634 348/302 |
| 2014/0291482 A1* | 10/2014 | Tanaka | H03K 5/2481 250/208.1 |
| 2015/0331434 A1* | 11/2015 | Lintonen | G05F 1/468 323/313 |

FOREIGN PATENT DOCUMENTS

| | | |
|---|---|---|
| JP | 2016-085222 A | 5/2016 |
| JP | 2017-069231 A | 4/2017 |

\* cited by examiner

FIG. 11

| | STRUCTURE OF PMOS' THAT CONFIGURE ACTIVE LOAD | |
|---|---|---|
| | LAYOUT IN REFERENCE EXAMPLE L/W=0.5/2μm FOUR-PARALLEL CONNECTION | LAYOUT IN EXAMPLE 1 L/W=0.5/2μm FOUR-SERIAL CONNECTION |
| MUTUAL CONDUCTANCE $gm_p$ OF ACTIVE LOAD | 1 | APPROX. 0.15 |
| NOISE COMPONENT $V_{n\_n}$ OF DIFFERENTIAL INPUT UNIT | 1 | 1 |
| NOISE COMPONENT $(gm_p/gm_n) \times V_{n\_p}$ OF ACTIVE LOAD | 1 | APPROX. 0.40 |
| ENTIRE NOISE $V_n$ OF COMPARATOR | 1 | APPROX. 0.85 |
| VARIATION IN OUTPUT OFFSET VOLTAGE $\sigma_{Vout}$ | 1 | APPROX. 0.65 |

LAYOUT OF COMMON CENTROIDAL ARRANGEMENT

SOLID-STATE IMAGING ELEMENT, COMPARATOR, AND ELECTRONIC DEVICE

TECHNICAL FIELD

The present disclosure relates to a solid-state imaging element, a comparator, and an electronic device.

BACKGROUND ART

Examples of a solid-state imaging element that captures an image include a charge coupled device (CCD) image sensor and a complementary metal oxide semiconductor (CMOS) image sensor. In recent years, attention has been paid to a CMOS image sensor that can be manufactured by using an existing CMOS process without requiring special capital investment, and adoption in a camera system incorporated into a portable telephone or a monitoring system has rapidly progressed.

A CMOS image sensor includes an analog-to-digital conversion unit that converts (performs analog-to-digital (A/D) conversion on) an analog pixel signal (an electric signal) that has been output from a unit pixel (hereinafter simply referred to as a "pixel" in some cases) that performs photoelectric conversion into a digital signal. As the analog-to-digital conversion unit of the CMOS image sensor, a column parallel type analog-to-digital conversion unit (hereinafter referred to as a column parallel analog-to-digital conversion unit in some cases) that is capable of performing analog-to-digital conversion in parallel on pixel signals that have been output from two or more pixels, e.g., all of the pixels, from among a plurality of pixels arranged in a row has been adopted in response to a request for the speeding-up of processing speed, or the like.

The column parallel analog-to-digital conversion unit is configured, for example, by arranging, in a row direction, a plurality of analog-to-digital converters (A/D converters), e.g., a number of analog-to-digital converters that is the same as the number of pixel columns. Then, an analog-to-digital converter for each of the columns performs analog-to-digital conversion on an electric signal that has been output from a unit pixel in a corresponding pixel column. An example of an analog-to-digital converter that configures the column parallel analog-to-digital conversion unit is what is called a reference signal comparison type analog-to-digital converter that includes a comparator and a counter and that performs analog-to-digital conversion on a pixel signal by comparing a prescribed reference signal with an analog pixel signal that has been output from a unit pixel.

As the reference signal comparison type analog-to-digital converter, a single slope type analog-to-digital converter is known (see, for example, Patent Document 1). In the single slope type analog-to-digital converter, a reference signal that changes in level at a constant inclination, such as a RAMP signal, is compared with a pixel signal that has been output from a unit pixel, in a comparator that includes a differential input unit that includes, for example, a field effect transistor, and an active load of the differential input unit. Then, the counter counts a time period that is required for the level of the reference signal to change to match the level of the pixel signal. By doing this, analog-to-digital conversion is performed on an analog pixel signal (an electric signal) that has been output from a unit pixel.

CITATION LIST

Patent Document

Patent Document 1: Japanese Patent Application Laid-Open No. 2013-90305

SUMMARY OF THE INVENTION

Problems to be Solved by the Invention

Meanwhile, an example of an index indicating whether the image quality of a CMOS image sensor is high or low is a temporal flicker of an image that has been sensed. This temporal flicker of the image occurs because a signal level of an electric signal detected from each of the pixels temporally fluctuates at random while the electric signal passes through a peripheral circuit. One example of the cause of this is random noise of a differential input unit or an active load that configures a comparator. It is known that large random noise causes sensed image data to remarkably flicker.

This flicker of image data is reduced by reducing the random noise of the differential input unit or the active load that configures the comparator and that serves as a noise source. It is known that the noise power of this random noise is inversely proportional to the area of a control terminal of a transistor that configures the comparator. Stated another way, if the area of the control terminal of the transistor is large, the noise power of the random noise can be reduced. However, an increase in the area of the control terminal of the transistor causes an increase in the circuit area of the comparator.

Accordingly, it is an object of the present disclosure to provide a solid-state imaging element, a comparator, and an electronic device including the solid-state imaging element that have high performance, by suppressing an increase in a circuit area and reducing noise in an analog-to-digital converter.

Solutions to Problems

A solid-state imaging element of the present disclosure to achieve the object described above includes:
a pixel array in which a plurality of unit pixels is arranged in a matrix shape, the plurality of unit pixels each including a photoelectric conversion unit; and
an analog-to-digital conversion unit that converts an analog pixel signal into a digital signal, the analog pixel signal being output from each of the plurality of unit pixels of the pixel array,
the analog-to-digital conversion unit includes a comparator that includes a differential input unit and an active load of the differential input unit, the differential input unit using, as an input, a prescribed reference signal and the analog pixel signal,
at least one transistor that configures the active load includes a plurality of control terminals that controls current, and
the plurality of control terminals is electrically connected in common.

A comparator of the present disclosure to achieve the object described above includes:
a differential input unit that uses, as an input, a prescribed reference signal and an analog pixel signal; and an active load of the differential input unit, at least one transistor that configures the active load includes a plurality of control terminals that controls current, and the plurality of control terminals is electrically connected in common.

An electronic device of the present disclosure to achieve the object described above includes the solid-state imaging element having the configuration above.

BRIEF DESCRIPTION OF DRAWINGS

FIG. 11 is a diagram in which an effect of improvements in the random noise of a comparator and a variation in output voltage is compared between a case where the layout of Example 1 is used and a case where the layout of the reference example is used.

MODES FOR CARRYING OUT THE INVENTION

Figure 1:
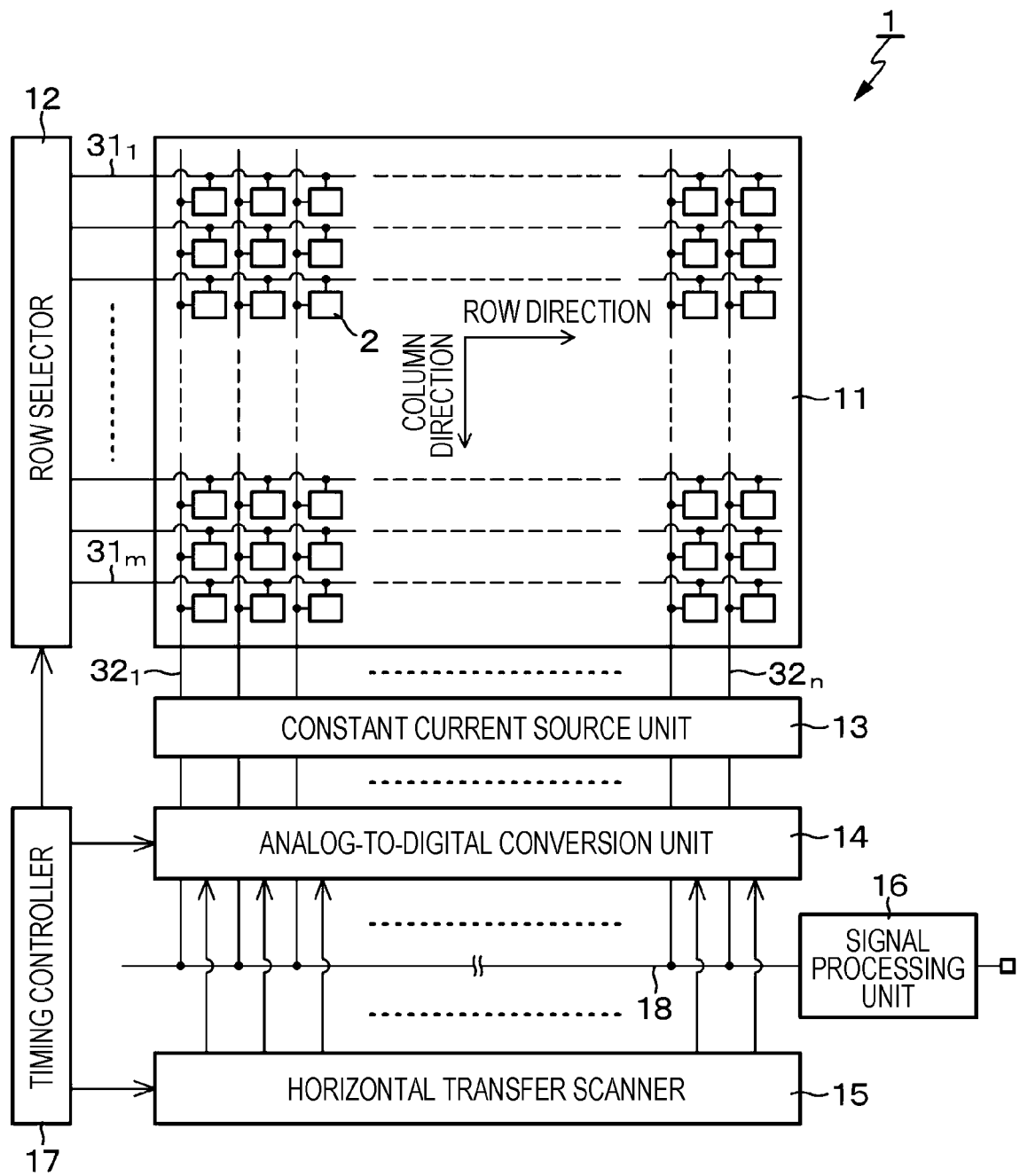
FIG. 1 is a block diagram illustrating an outline of a basic configuration of a CMOS image sensor of the present disclosure.

Modes for carrying out a technology of the present disclosure (hereinafter referred to as "embodiments") are described in detail below with reference to the drawings. The technology of the present disclosure is not limited to the embodiments, and various numerical values, materials, or the like in the embodiments are examples. In the description below, it is assumed that the same element or elements that have the same function are denoted by the same reference sign, and a duplicate description is omitted. Note that description will be provided in the order described below.

1. General description of solid-state imaging element, comparator, and electronic device of the present disclosure
2. Solid-state imaging element of the present disclosure
2-1. Configuration example of CMOS image sensor
2-2. Configuration example of unit pixel
2-3. Configuration example of analog-to-digital conversion unit
2-4. Chip structure
2-4-1. Flatly placed type chip structure (what is called flatly placed structure)

2-4-2. Stacked type chip structure (what is called stacked structure)

2-5. Comparator 2-5-1. Circuit configuration example of comparator 2-5-2. Random noise of MOS type field effect transistor 2-6. First embodiment (example where transistor that configures comparator includes field effect transistor)

2-6-1. Example 1 (example where one of transistors that configure active load includes field effect transistor)

2-6-2. Example 2 (variation of Example 1: example where one field effect transistor is formed in one active region)

2-6-3. Example 3 (variation of Example 1: example where a plurality of field effect transistors is formed in one active region)

2-6-4. Example 4 (variation of Example 1: example of combination of parallel connection and serial connection of two or more field effect transistors)

2-6-5. Example 5 (variation of Example 1: example of combination of serial connection and parallel connection of two or more field effect transistors)

2-6-6. Example 6 (variation of Example 1: example where dummy gate terminals are disposed)

2-6-7. Example 7 (variation of Example 6: example where dummy gate terminals are disposed between field effect transistors that configure circuit)

2-6-8. Example 8 (example where both field effect transistors that configure active load include field effect transistor)

2-7. Second embodiment (example where transistor that configures comparator includes Fin-FET)

2-7-1. Example 9 (example where one of transistors that configure active load includes one Fin-FET)

2-7-2. Example 10 (example where a plurality of Fin-FETs connected in series is included)

2-7-3. Example 11 (example where a plurality of Fin-FETs connected in parallel is included)

2-7-4. Example 12 (example where sets of Fin-FETs connected in series are connected in parallel)

2-7-5. Example 13 (example where sets of Fin-FETs connected in parallel are connected in series)

2-8. Third embodiment (example where transistor that configures a comparator includes a bipolar transistor)

2-8-1. Example 14 (example where one bipolar transistor is formed in one active region)

2-8-2. Example 15 (example where a plurality of bipolar transistors is formed in one active region)

2-8-3. Example 16 (variation of Example 15: example of serial connection)

3. Examples of application of comparator 3-1. Application Example 1 (example of application to analog switch)

3-2. Application Example 2 (example of application to triangular wave generation circuit)

3-3. Application Example 3 (example of application to digital-to-analog converter)

4. Variations

5. Utilization examples

6. Examples of application of technology according to the present disclosure 6-1. Electronic device of the present disclosure (example of imaging device)

6-2. Example of utilization in moving body

7. Configuration that the present disclosure can employ

<General Description of Solid-State Imaging Element, Comparator, and Electronic Device of the Present Disclosure>

In a solid-state imaging element, a comparator, and an electronic device of the present disclosure, a configuration can be employed in which at least one transistor that configures an active load includes a plurality of field effect transistors including a plurality of control terminals. Then, in the plurality of field effect transistors, a configuration can be employed in which drain regions and source regions are alternately connected in series and all of the gate terminals are commonized.

In the solid-state imaging element, the comparator, and the electronic device of the present disclosure that include the preferred configurations described above, a configuration can be employed in which the plurality of field effect transistors is connected in series via an active region. Then, a configuration can be employed in which the plurality of field effect transistors is connected in series via the active region. Furthermore, a configuration can be employed in which the plurality of field effect transistors is dispersedly disposed in active regions different from each other and the active regions different from each other are connected by a wiring line.

Furthermore, in the solid-state imaging element, the comparator, and the electronic device of the present disclosure that include the preferred configurations described above, a configuration can be employed in which a dummy gate terminal is disposed in an active region where the field effect transistor is not formed.

Furthermore, in a solid-state imaging element, a comparator, and an electronic device of the present disclosure, a configuration can be employed in which at least one transistor that configures an active load includes a plurality of bipolar transistors including a plurality of control terminals. Then, in the plurality of bipolar transistors, a configuration can be employed in which emitter regions and collector regions are alternately connected in series and all of the base terminals are commonized.

In the solid-state imaging element, the comparator, and the electronic device of the present disclosure that include the preferred configurations described above, a configuration can be employed in which the plurality of bipolar transistors is dispersedly disposed in active regions different from each other, and is connected in series by a wiring line. Then, a configuration can be employed in which the plurality of bipolar transistors is connected in series by the wiring line, across the active regions different from each other. Furthermore, a configuration can be employed in which the plurality of bipolar transistors is disposed in the same active region and a base terminal is commonized among the plurality of bipolar transistors.

Furthermore, in a solid-state imaging element, a comparator, and an electronic device of the present disclosure, a configuration can be employed in which at least one transistor that configures an active load includes a Fin-FET.

<Solid-State Imaging Element of the Present Disclosure>

First, a basic configuration of a solid-state imaging element of the present disclosure is described. Here, description is provided by using, as an example the solid-state imaging element, a complementary metal oxide semiconductor (CMOS) image sensor that is one type of a solid-state imaging element of an X-Y address scheme. The CMOS image sensor is an image sensor that has been made by utilizing or partially using a CMOS process.

[Configuration Example of CMOS Image Sensor]

FIG. 1 is a block diagram illustrating an outline of a basic configuration of a CMOS image sensor of the present disclosure. A CMOS image sensor 1 of the present disclosure includes a pixel array 11 in which unit pixels (hereinafter simply referred to as "pixels" in some cases) 2 each including a photoelectric conversion unit are two-dimensionally arranged in a row direction and a column direction, i.e., in a matrix shape, and a peripheral circuit unit of the pixel array 11. Here, the row direction refers to an arraying direction of unit pixels 2 in a pixel row (what is called a horizontal direction), and the column direction refers to an arraying direction of unit pixels 2 in a pixel column (what is called a vertical direction). The unit pixel 2 performs photoelectric conversion to generate and store a photocharge according to an amount of received light.

The peripheral circuit unit of the pixel array 11 is configured, for example, by a row selector 12, a constant current source unit 13, an analog-to-digital conversion unit 14, a horizontal transfer scanner 15, a signal processing unit 16, a timing controller 17, and the like.

In the pixel array 11, pixel driving lines $31_1$ to $31_m$ (hereinafter collectively referred to as "pixel driving lines 31" in some cases) are wired to respective pixel rows of matrix-shaped pixel arraying along the row direction. Furthermore, vertical signal lines $32_1$ to $32_n$ (hereinafter collectively referred to as "vertical signal lines 32" in some cases) are wired to respective pixel columns along the column direction. The pixel driving line 31 transmits a driving signal for driving at the time of reading a signal from the unit pixel 2. In FIG. 1, the pixel driving line 31 is illustrated as a single wiring line, but is not limited to a single wiring line. One end of the pixel driving line 31 is connected to an output end that corresponds to each of the rows of the row selector 12.

Respective circuit units of the peripheral circuit unit of the pixel array 11, i.e., the row selector 12, the constant current source unit 13, the analog-to-digital conversion unit 14, the horizontal transfer scanner 15, the signal processing unit 16, and the timing controller 17, are described below.

The row selector 12 is configured by a shift register, an address decoder, or the like, and controls scanning of a pixel row or an address of the pixel row in selecting each of the pixels 2 of the pixel array 11. A specific configuration of this row selector 12 is not illustrated; however, in general, the row selector 12 includes two scanning systems, a reading scanning system and a sweeping scanning system.

The reading scanning system sequentially and selectively scans the unit pixels 2 of the pixel array 11 in row units in order to read pixel signals from the unit pixels 2. The pixel signal read from the unit pixel 2 is an analog signal. The sweeping scanning system performs sweeping scanning on a read row on which the reading scanning system will perform reading scanning, earlier than reading scanning by a time period of a shutter speed.

Due to sweeping scanning performed by this sweeping scanning system, an unnecessary charge is swept out from the photoelectric conversion unit of the unit pixel 2 in the read row, and this causes the photoelectric conversion unit to be reset. Then, due to sweeping out of the unnecessary charge (resetting) performed by this sweeping scanning system, what is called an electronic shutter operation is performed. Here, the electronic shutter operation refers to an operation to discard a photocharge of the photoelectric conversion unit and newly start exposure (start storing photocharge).

The constant current source unit 13 includes a set of current sources I each including a MOS transistor connected to each of the vertical signal lines $32_1$ to $32_n$ for each of the pixel columns (see FIG. 2), and supplies a bias current through each of the vertical signal lines $32_1$ to $32_n$ to each of the pixels 2 in a pixel row that has been selectively scanned by the row selector 12.

The analog-to-digital conversion unit 14 includes a set of a plurality of analog-to-digital converters that is provided to correspond to the respective vertical signal lines $32_1$ to $32_n$, and is a column parallel type analog-to-digital conversion unit that converts an analog pixel signal output from each of the pixel columns into an N-bit digital signal. As the analog-to-digital converter in the column parallel analog-to-digital conversion unit 14, a single slope type analog-to-digital converter is used that is one example of a reference signal comparison type analog-to-digital converter.

The horizontal transfer scanner 15 is configured by a shift register, an address decoder, or the like, and controls scanning of a pixel column or an address of the pixel column in reading a signal of each of the pixels 2 of the pixel array 11. Under the control of this horizontal transfer scanner 15, the pixel signal that has been converted into a digital signal by the analog-to-digital conversion unit 14 is read to a horizontal transfer line 18 having a width of 2N bits in units of a pixel column.

The signal processing unit 16 performs various types of signal processing, such as amplification processing or arithmetic processing, for example, on a pixel signal supplied through the horizontal transfer line 18, and outputs the pixel signal as an output signal of the present CMOS image sensor 1.

The timing controller 17 generates a variety of timing signals, clock signals, control signals, and the like, and performs driving control on the row selector 12, the constant current source unit 13, the analog-to-digital conversion unit 14, the horizontal transfer scanner 15, the signal processing unit 16, and the like on the basis of these generated signals.

[Circuit Configuration Example of Unit Pixel]

Figure 2:
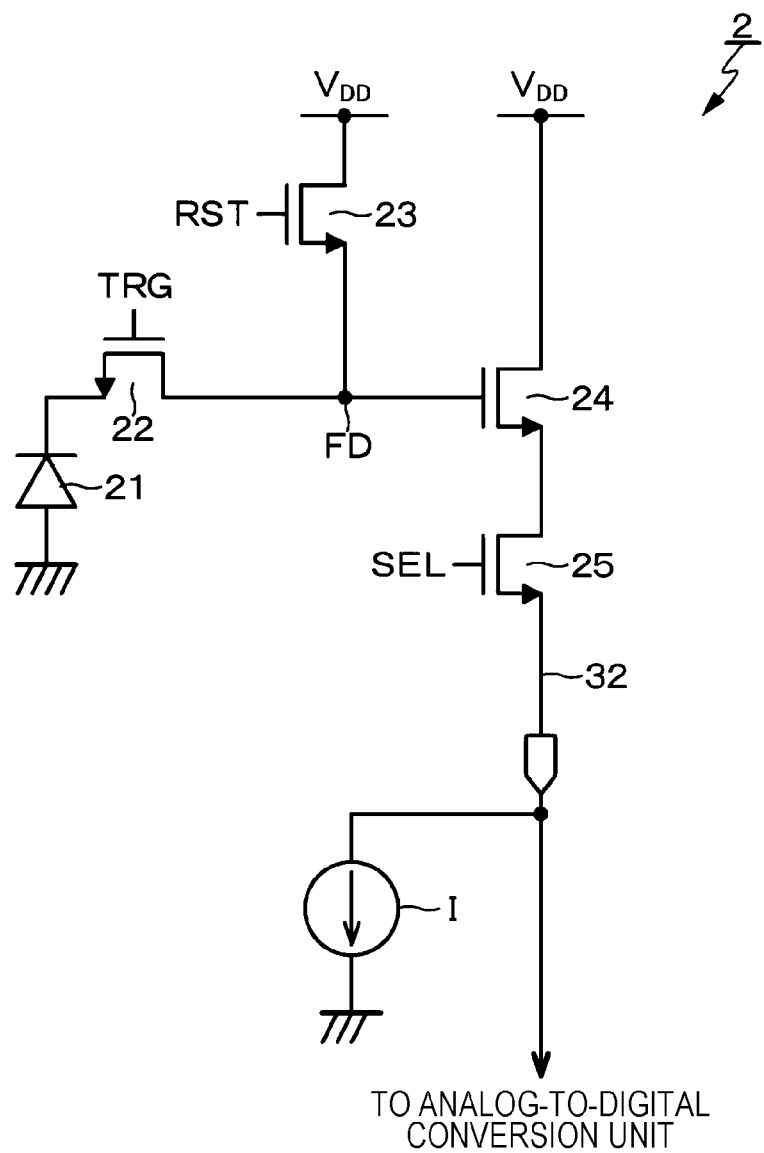
FIG. 2 is a circuit diagram illustrating one example of a circuit configuration of a unit pixel.

FIG. 2 is a circuit diagram illustrating one example of a circuit configuration of the unit pixel 2. The unit pixel 2 includes, for example, a photodiode 21 as the photoelectric conversion unit. The unit pixel 2 has a pixel configuration including a transfer transistor 22, a reset transistor 23, an amplification transistor 24, and a selection transistor 25 in addition to the photodiode 21.

Note that, for example, an N-channel MOS type field effect transistor (FET) is used here as four transistors, the transfer transistor 22, the reset transistor 23, the amplification transistor 24, and the selection transistor 25. However, a conductivity type combination of the four transistors 22 to 25 described here as an example is an example, and this combination is not restrictive.

A plurality of pixel driving lines serving as the pixel driving lines 31 described above is wired up to the unit pixels 2 described above to be commonized in units of respective pixels 2 in the same pixel row. This plurality of pixel driving lines is connected to output ends that correspond to the respective pixel rows of the row selector 12, in units of a pixel row. The row selector 12 appropriately outputs a transfer signal TRG, a reset signal RST, and a selection signal SEL to the plurality of pixel driving lines.

In the photodiode 21, an anode terminal is connected to a lower-potential side power supply (for example, a ground), and the photodiode 21 photoelectrically converts received light into an amount of photocharge (here, photoelectrons) that corresponds to an amount of the received light, and stores the photocharge. A cathode terminal of the photodiode 21 is electrically connected to the gate terminal of the amplification transistor 24 via the transfer transistor 22. Here, a region that a gate terminal of the amplification transistor 24 is electrically connected to is a floating diffusion (a floating diffusion region/an impurity diffusion region) FD. The floating diffusion FD is a charge-to-voltage conversion unit that converts charge into voltage.

The transfer signal TRG that causes a higher level (for example, a $V_{DD}$ level) to be active is given to a gate terminal of the transfer transistor 22 from the row selector 12. The transfer transistor 22 enters into a conductive state in response to the transfer signal TRG to transfer, to the floating diffusion FD, the photocharge that has been obtained due to photoelectric conversion performed by the photodiode 21 and has been stored in the photodiode 21.

The reset transistor 23 is connected between a node of a higher-potential side power supply $V_{DD}$ and the floating diffusion FD. The reset signal RST that causes a higher level to be active is given to a gate terminal of the reset transistor 23 from the row selector 12. The reset transistor 23 enters into a conductive state in response to the reset signal RST, and resets the floating diffusion FD by discarding the charge of the floating diffusion FD to the node of the voltage $V_{DD}$.

In the amplification transistor 24, a gate terminal and a drain terminal are respectively connected to the floating diffusion FD and the node of the higher-potential side power supply $V_{DD}$. The amplification transistor 24 serves as an input unit of a source follower that reads a signal obtained due to photoelectric conversion performed by the photodiode 21. Stated another way, in the amplification transistor 24, a source terminal is connected to the vertical signal line 32 via the selection transistor 25. Then, the amplification transistor 24 and the current source I connected to one end of the vertical signal line 32 configure the source follower that converts the voltage of the floating diffusion FD into the potential of the vertical signal line 32.

In the selection transistor 25, for example, a drain terminal and a source terminal are respectively connected to the source terminal of the amplification transistor 24 and the vertical signal line 32. The selection signal SEL that causes a higher level to be active is given to a gate terminal of the selection transistor 25 from the row selector 12. The selection transistor 25 enters into a conductive state in response to the selection signal SEL to cause the unit pixel 2 to enter into a selected state, and transmits, to the vertical signal line 32, a signal that has been output from the amplification transistor 24.

Note that a circuit configuration can be employed in which the selection transistor 25 is connected between the node of the higher-potential side power supply $V_{DD}$ and the drain terminal of the amplification transistor 24. Furthermore, in the present example, a 4-Tr configuration that includes, as pixel circuits of the unit pixel 2, four transistors (Tr's), the transfer transistor 22, the reset transistor 23, the amplification transistor 24, and the selection transistor 25, has been used as an example, but this is not restrictive. For example, a 3-Tr configuration can be employed in which the selection transistor 25 is omitted and the amplification transistor 24 is configured to have a function of the selection transistor 25, or a 5-Tr or more configuration that has increased in the number of transistors can be employed as needed.

[Configuration Example of Analog-to-Digital Conversion Unit]

Figure 3:
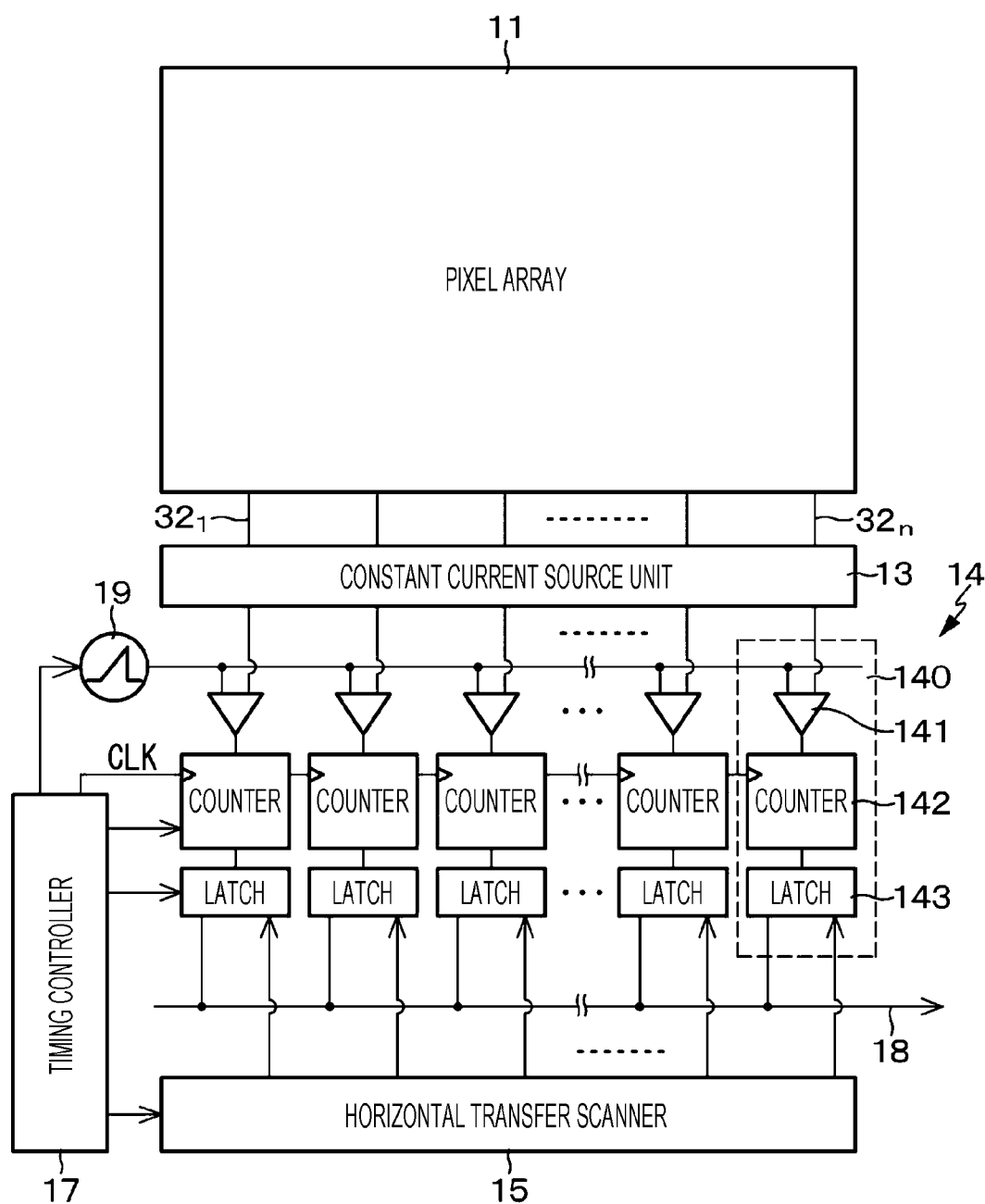
FIG. 3 is a block diagram illustrating one example of a configuration of a column parallel analog-to-digital conversion unit.

Next, a configuration example of the column parallel analog-to-digital conversion unit 14 is described. FIG. 3 is a block diagram illustrating one example of a configuration of the column parallel analog-to-digital conversion unit 14. The analog-to-digital conversion unit 14 in the CMOS image sensor 1 of the present disclosure includes a set of a plurality of single slope type analog-to-digital converters that is provided to correspond to the respective vertical signal lines $32_1$ to $32_n$. Here, description is provided by using, as an example, a single slope type analog-to-digital converter 140 in an n-th column.

The single slope type analog-to-digital converter 140 has a circuit configuration including a comparator 141, a counter circuit 142, and a latch circuit 143. The single slope type analog-to-digital converter 140 uses a reference signal having what is called a RAMP waveform (a slope waveform) that gradually changes in a voltage value with the lapse of time. The reference signal having the RAMP waveform is generated by a reference signal generator 19. The reference signal generator 19 can be configured by using, for example, a digital-to-analog conversion (DAC) circuit.

The comparator 141 uses, as a comparison input, a pixel signal read from the unit pixel 2, uses, as a reference input, the reference signal generated by the reference signal generator 19, and compares both signals. Then, in the comparator 141, for example, an output enters into a first state (for example, a higher level) when the reference signal is greater than the pixel signal, and the output enters into a second state (for example, a lower level) when the reference signal is smaller than or equal to the pixel signal. Therefore, an output signal of the comparator 141 is a pulse signal having a pulse width that corresponds to the magnitude of a level of the pixel signal.

The counter circuit 142 is given a clock signal CLK from the timing controller 17 at the same timing as a timing of starting the supply of the reference signal to the comparator 141. Then, the counter circuit 142 performs a counting operation in synchronization with the clock signal CLK to measure a period of the pulse width of an output pulse of the comparator 141, i.e., a period from the start of a comparison operation to the end of the comparison operation. A counting result (a count value) of this counter circuit 142 is a digital value obtained by digitalizing the analog pixel signal.

The latch circuit 143 latches the digital value serving as the counting result of the counter circuit 142. Then, under the driving of the horizontal transfer scanner 15, the latched digital value is output to the horizontal transfer line 18.

As described above, in the column parallel analog-to-digital conversion unit 14 including a set of the single slope type analog-to-digital converters 140, a digital value is obtained from information relating to a time period during which a magnitude relationship changes between a reference signal that is generated by the reference signal generator 19 and has an analog value that gradually changes and an analog pixel signal that is output from the unit pixel 2. Note that, in the example described above, an analog-to-digital conversion unit 14 in which the analog-to-digital converters 140 are disposed to have a one-to-one relationship with pixel columns has been described as an example. However, an analog-to-digital conversion unit 14 in which the analog-to-digital converters 140 are disposed in units of a plurality of pixel columns can be employed.

[Chip Structure]

Examples of a chip (semiconductor integrated circuit) structure of the CMOS image sensor 1 of the present disclosure having the configuration described above include a flatly placed type chip structure and a stacked type chip structure. In both CMOS image sensors 1 that respectively have the flatly placed chip structure and the stacked type chip structure, the unit pixel 2 can have a reverse-surface irradiation type pixel structure in which light emitted from a reverse-surface side that is opposite to a front-surface side is captured, when it is assumed that a substrate surface on a side on which a wiring layer is disposed is a front surface. The flatly placed type chip structure and the stacked type chip structure are described below.

(Flatly Placed Type Chip Structure)

Figure 4:
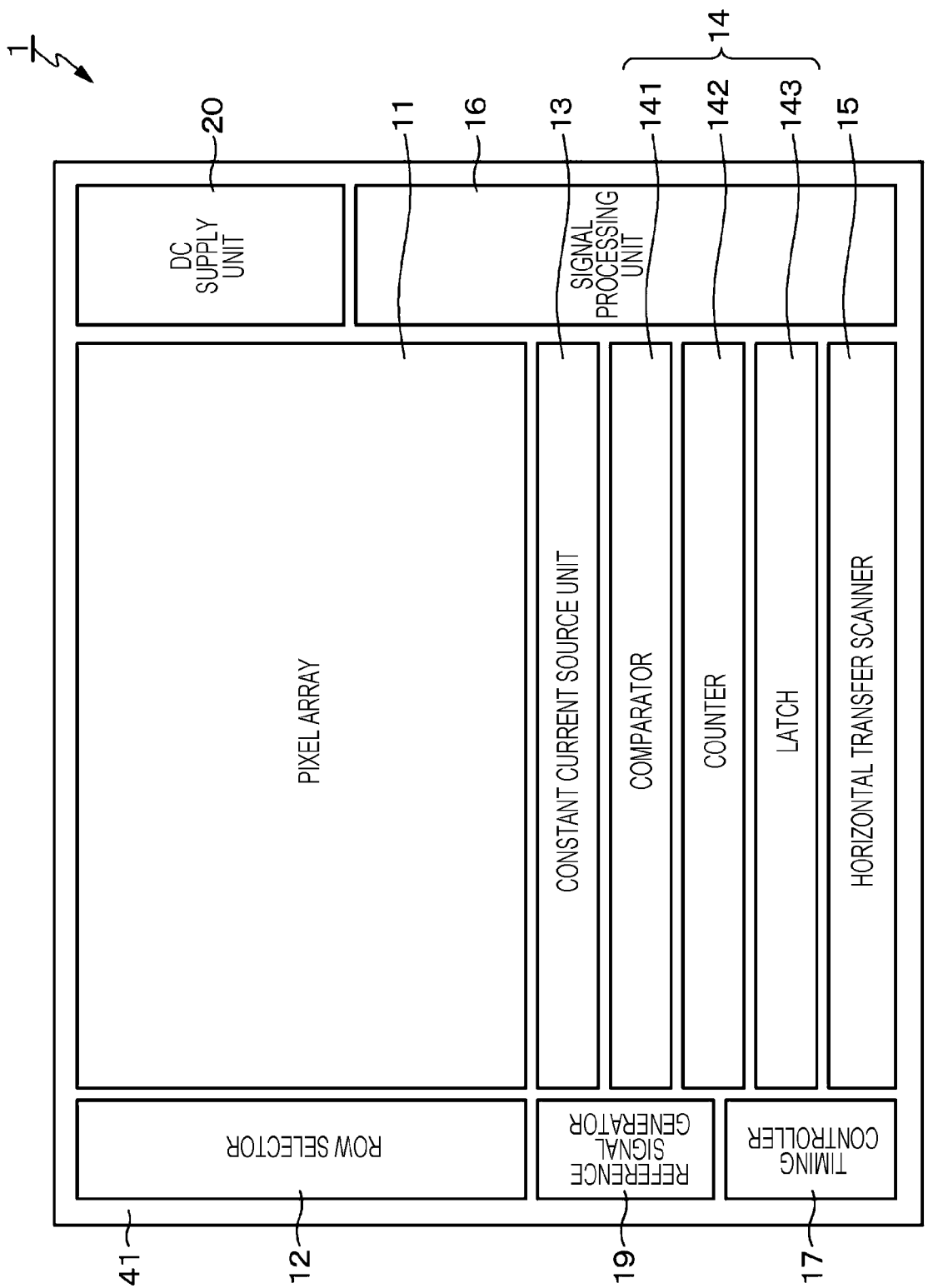
FIG. 4 is a plan view illustrating an outline of a flatly placed type chip structure of a CMOS image sensor of the present disclosure.

FIG. 4 is a plan view illustrating an outline of the flatly placed type chip structure of the CMOS image sensor 1 of the present disclosure. As illustrated in FIG. 4, the flatly placed type chip structure, what is called a flatly placed structure, is a structure in which a peripheral circuit part of the pixel array 11 in which the unit pixels 2 are arranged in a matrix shape is formed on the same semiconductor substrate 41 as a semiconductor substrate 41 on which the pixel array 11 is formed. Specifically, the row selector 12, the constant current source unit 13, the analog-to-digital conversion unit 14, the horizontal transfer scanner 15, the signal processing unit 16, the timing controller 17, the reference signal generator 19, a DC supply unit 20, and the like are formed on the same semiconductor substrate 41 as a semiconductor substrate 41 on which the pixel array 11 is formed.

(Stacked Type Chip Structure)

Figure 5:
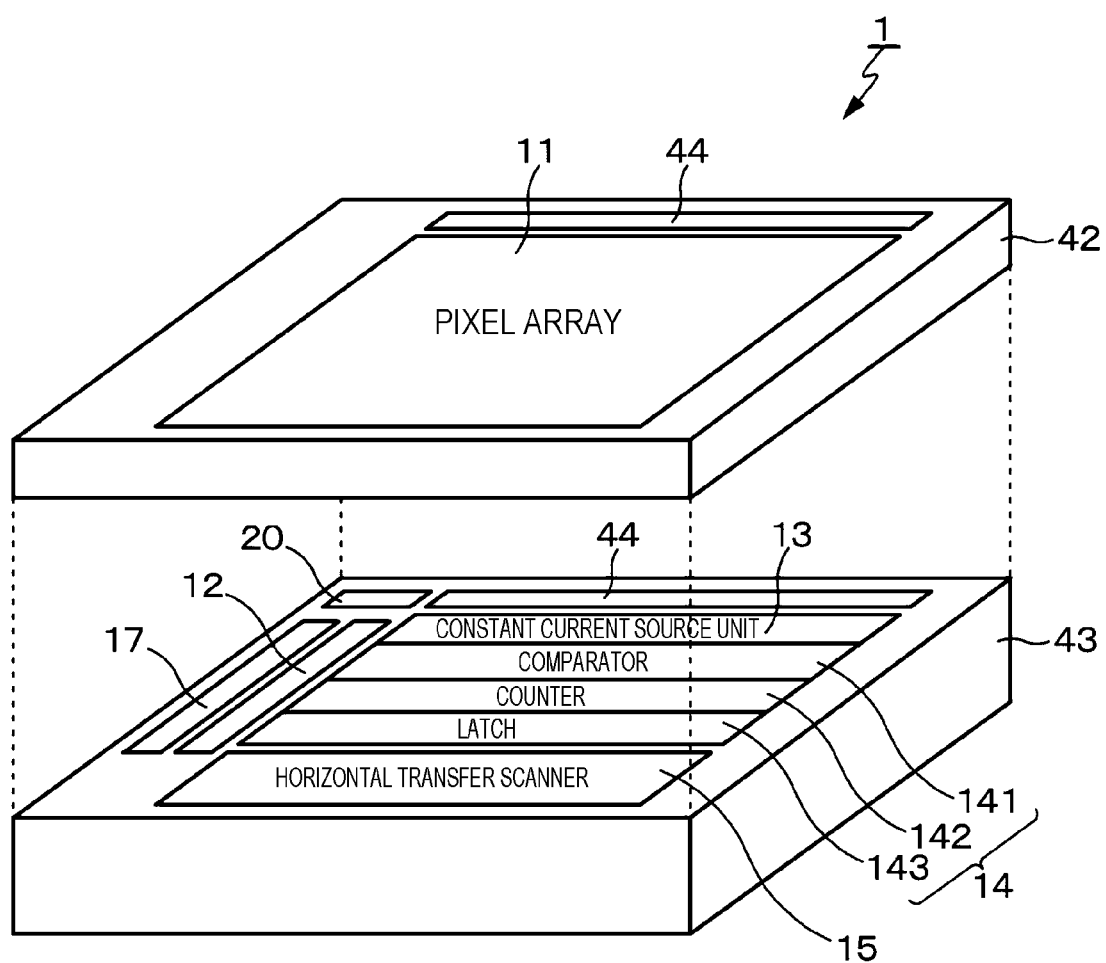
FIG. 5 is an exploded perspective view illustrating an outline of a stacked type chip structure of a CMOS image sensor of the present disclosure.

FIG. 5 is an exploded perspective view illustrating an outline of a stacked type chip structure of the CMOS image sensor of the present disclosure. As illustrated in FIG. 5, the stacked type chip structure, what is called a stacked structure, is a structure in which at least two semiconductor substrates, a first semiconductor substrate 42 and a second semiconductor substrate 43, have been stacked. In this stacked structure, the pixel array 11 is formed on the first semiconductor substrate 42 in a first layer. Furthermore, a circuit part including the row selector 12, the constant current source unit 13, the analog-to-digital conversion unit 14, the horizontal transfer scanner 15, the signal processing unit 16, the timing controller 17, the reference signal generator 19, the DC supply unit 20, and the like is formed on the second semiconductor substrate 43 in a second layer. Then, the first semiconductor substrate 42 in the first layer and the second semiconductor substrate 43 in the second layer are electrically connected through a via 44.

By employing the CMOS image sensor 1 having this stacked structure, it is sufficient if the first semiconductor substrate 42 has a size (an area) that is large enough to form the pixel array 11. Therefore, the size (the area) of the first semiconductor substrate 42 in the first layer can be reduced, and this enables a reduction in the size of the entirety of a chip. Moreover, a process that is suitable for the making of the unit pixel 2 can be applied to the first semiconductor substrate 42 in the first layer, and a process that is suitable for the making of the circuit part can be applied to the second semiconductor substrate 43 in the second layer. Therefore, there is an advantage in which a process of manufacturing the CMOS image sensor 1 can be optimized. In particular, an advanced process can be applied to the making of the circuit part.

Note that a two-layer stacked structure in which the first semiconductor substrate 42 and the second semiconductor substrate 43 have been stacked has been described as an example here. However, the stacked structure is not limited to a two-layer structure, and can be a structure including three or more layers. Then, in the case of a stacked structure including three or more layers, the circuit part including the row selector 12, the constant current source unit 13, the analog-to-digital conversion unit 14, the horizontal transfer scanner 15, the signal processing unit 16, the timing controller 17, the reference signal generator 19, the DC supply unit 20, and the like can be dispersedly formed on semiconductor substrates in a second layer and the layers that follow.

[Comparator]

Meanwhile, it is known that, if random noise is large in a differential input unit that configures the comparator 141 or its active load in the single slope type analog-to-digital converter 140 described above, sensed image data is caused to remarkably flicker.

(Circuit Configuration Example of Comparator)

Figure 6A:
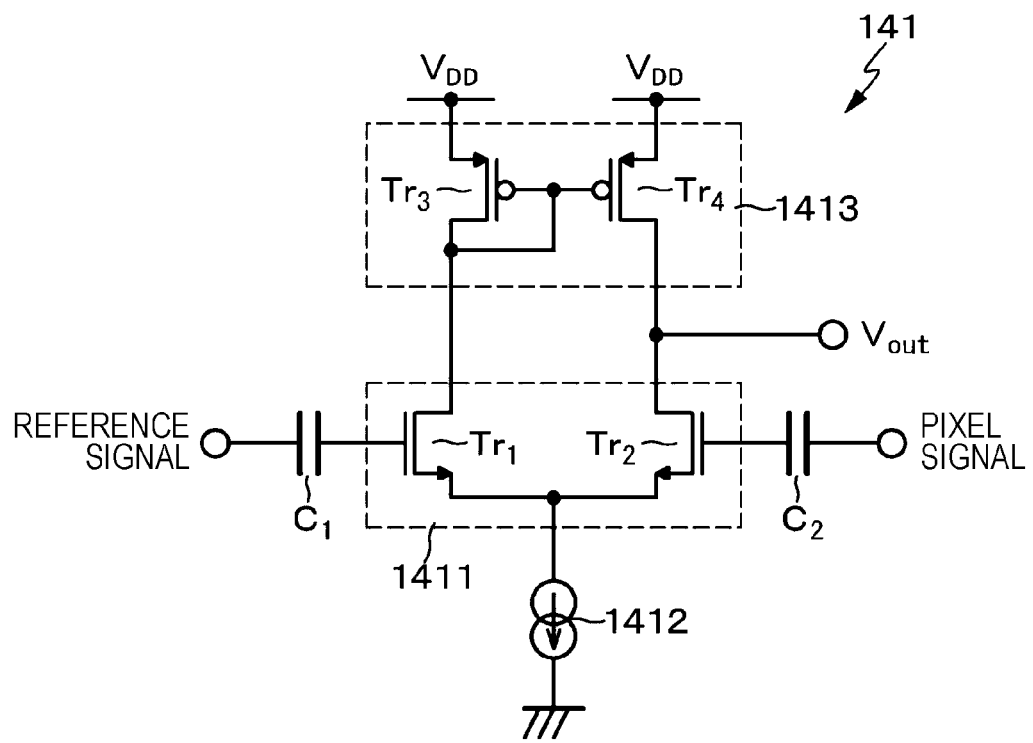
FIG. 6A is a circuit diagram illustrating one example of a circuit configuration of a comparator including a field effect transistor.

One example of a circuit configuration of the comparator 141 is illustrated in FIG. 6A. The comparator 141 has a circuit configuration including a differential input unit 1411, a constant current source 1412, and an active load 1413. The differential input unit 1411 includes, for example, N-channel MOS type field effect transistors (FETs) $Tr_1$ and $Tr_2$ to which a source terminal is connected in common. A reference signal is input to a gate terminal of the MOS type field effect transistor $Tr_1$ via a capacitive element $C_1$, and a pixel signal is input to a gate terminal of the MOS type field effect transistor $Tr_2$ via a capacitive element $C_2$.

The constant current source 1412 is connected between a source common connection node of the MOS type field effect transistors $Tr_1$ and $Tr_2$ and a node of a reference potential (for example, a ground potential). The active load 1413 includes P-channel MOS type field effect transistors $Tr_3$ and $Tr_4$ that are connected between respective drain terminals of the MOS type field effect transistors $Tr_1$ and $Tr_2$ and nodes of power supply voltages $V_{DD}$.

In the active load 1413, respective gate terminals of the MOS type field effect transistors $Tr_3$ and $Tr_4$ are connected in common. Furthermore, in the MOS type field effect transistor $Tr_3$, the gate terminal and a drain terminal are connected in common. Stated another way, the MOS type field effect transistors $Tr_3$ and $Tr_4$ configure a current mirror circuit. Then, an output $V_{out}$ is derived from each drain common connection node of the field effect transistor $Tr_2$ and the field effect transistor $Tr_4$.

(Random Noise of MOS Type Field Effect Transistor)

In the comparator 141 having the configuration described above, the flicker of sensed image data is reduced by reducing the random noise of a MOS type field effect transistor serving as a noise source. In general, the random noise of the MOS type field effect transistor is flicker noise (1/f noise), random telegraph noise (RTN), and thermal noise (see, for example, Reference Document 1).

Reference Document 1: P. Martin-Gonthier, et al., "RTS noise impact in CMOS image sensors readout circuit", ICECS 2009, Pages: 928-931

Figure 6B:
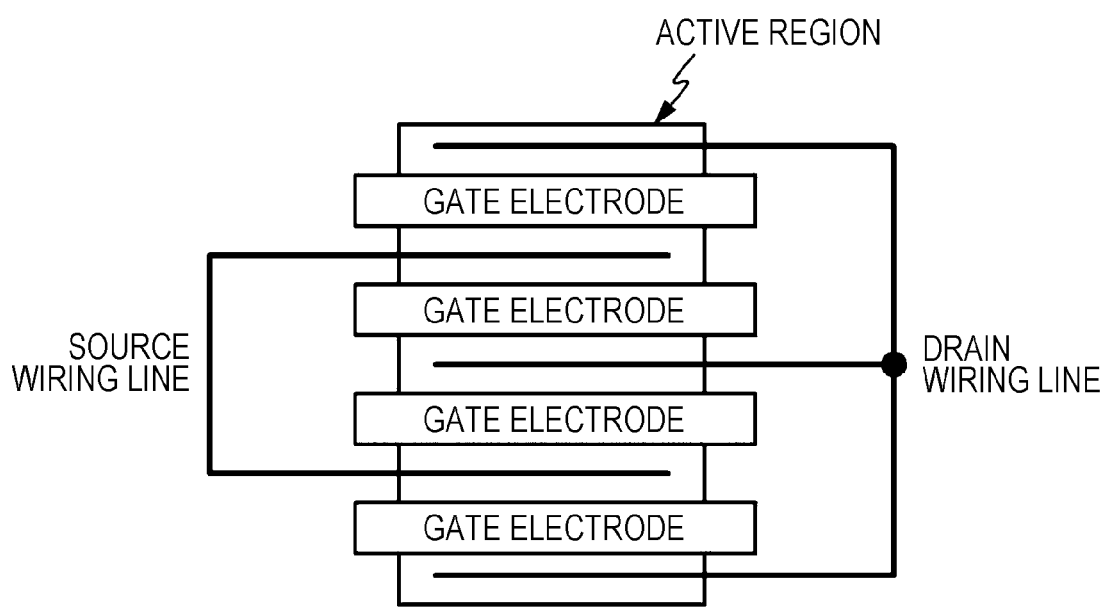
FIG. 6B is a plan view illustrating a layout of a multi-finger structure.

It is known that the noise power of flicker noise or random telegraph noise is inversely proportional to the area of a gate terminal of a MOS type field effect transistor. Accordingly, from among the MOS type field effect transistors $Tr_1$ to $Tr_4$ that configure the comparator 141, the field effect transistors $Tr_3$ and $Tr_4$ of the active load 1413 serving as a noise source are caused to have, for example, a multi-finger structure in which a plurality of field effect transistors is connected in parallel, as illustrated in FIG. 6B, and the area of a gate terminal of the entirety of a field effect transistor is increased. By doing this, flicker noise or random telegraph noise is reduced, and the temporal fluctuation of sensed image data can be reduced.

According to the utilization of the CMOS image sensor in a variety of fields, improvements in functioning and performance are requested, and one example of this request is a reduction in noise of the CMOS image sensor. Simultaneously, it is also strongly requested that the size of a device mounted with the CMOS image sensor be reduced. In view of this, in a method for reducing noise by increasing the area of a gate terminal of a MOS type field effect transistor of the active load 1413 serving as a noise source, a circuit area is also increased, as described above, and therefore it is difficult to simultaneously achieve a reduction in size of a device.

In addition, in order to achieve improvements in functioning of a product, a fine process in which a high-performance MOS type field effect transistor has been mounted also needs to be used as a semiconductor process for manufacturing a CMOS image sensor, and in CMOS processes of 28-nm generation and generations that follow, a high dielectric constant/metal gate (high-k/metal gate) process has been introduced instead of a silicon oxynitride (SiON)/polysilicon (PolySi) gate process (see, for example, Reference Document 2)

Reference Document 2: S. Morvan, et al., "Gate-last integration on planar FDSOI MOSFET: Impact of mechanical boosters and channel orientations", 2013 IEEE International Electron Devices Meeting, Pages: 20.3.1-20.3.4

This high-k/metal gate process is characterized, for example, by a process of embedding a metal material into a gate terminal forming region of a MOS type field effect transistor, polishing the metal material by using a chemical-mechanical polishing (CMP) technology to flatten the metal material, and forming a gate terminal.

However, in the case of the high-k/metal gate process, as the planar size of the gate terminal forming region increases, a polished amount of metal material increases. Therefore, in a case where the gate terminal has a large area, the metal material is significantly lost, and this causes a reduction in a yield. Accordingly, in the high-k/metal gate process, it is difficult to form a MOS type field effect transistor having a large gate area on a semiconductor substrate.

In view of the above, in a case where an attempt is made to reduce noise according to a drend of improvements in functioning/a reduction in size of a CMOS image sensor, it is becoming difficult to use a method for increasing the area of a gate terminal of a MOS type field effect transistor serving as a noise source in a circuit, and a method for reducing noise without an increase in a circuit area has been requested. A case where the comparator 141 includes a MOS type field effect transistor has been used as an example here, but the similar is applied to a case where a bipolar transistor is included.

Accordingly, in the CMOS image sensor 1 of the present disclosure, the configuration described below is employed in order to suppress an increase in a circuit area and reduce noise in an analog-to-digital converter including a comparator that includes a differential input unit and an active load of the differential input unit. Stated another way, at least one transistor that configures an active load includes a plurality of control terminals that controls current. Then, the plurality of control terminals is electrically connected in common.

As described above, by employing a configuration in which a plurality of control terminals of at least one transistor that configures an active load is electrically connected in common, transconductance of the active load can be reduced, as described later. Therefore, an increase in a circuit area can be suppressed, and noise can be reduced. A transistor that configures the active load can include a MOS type field effect transistor, or can include a bipolar transistor. The plurality of control terminals that controls current is a gate terminal in the case of the MOS type field effect transistor, and is a base terminal in the case of the bipolar transistor.

Specific examples for suppressing an increase in a circuit area and reducing noise in an analog-to-digital converter including a comparator that includes a differential input unit and an active load of the differential input unit are described below.

First Embodiment

A first embodiment of the present disclosure is an example where a transistor that configures the comparator 141 includes a field effect transistor. Specific examples of the first embodiment are described below as Example 1 to Example 8.

Example 1

Figure 7A:
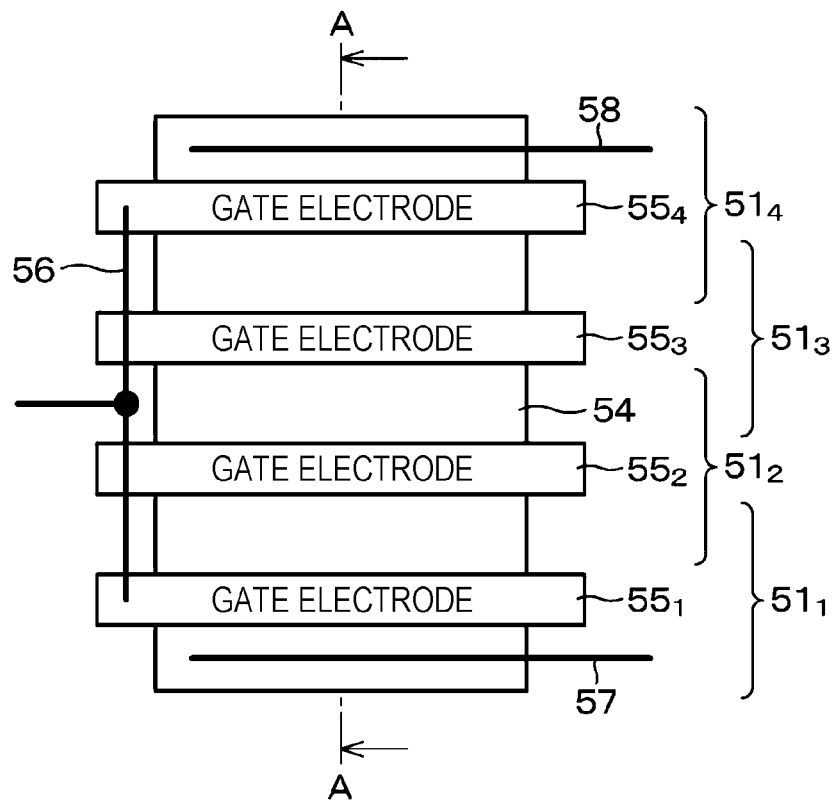
FIG. 7A is a plan view illustrating a layout of a principal part of an active load in Example 1.
Figure 8:
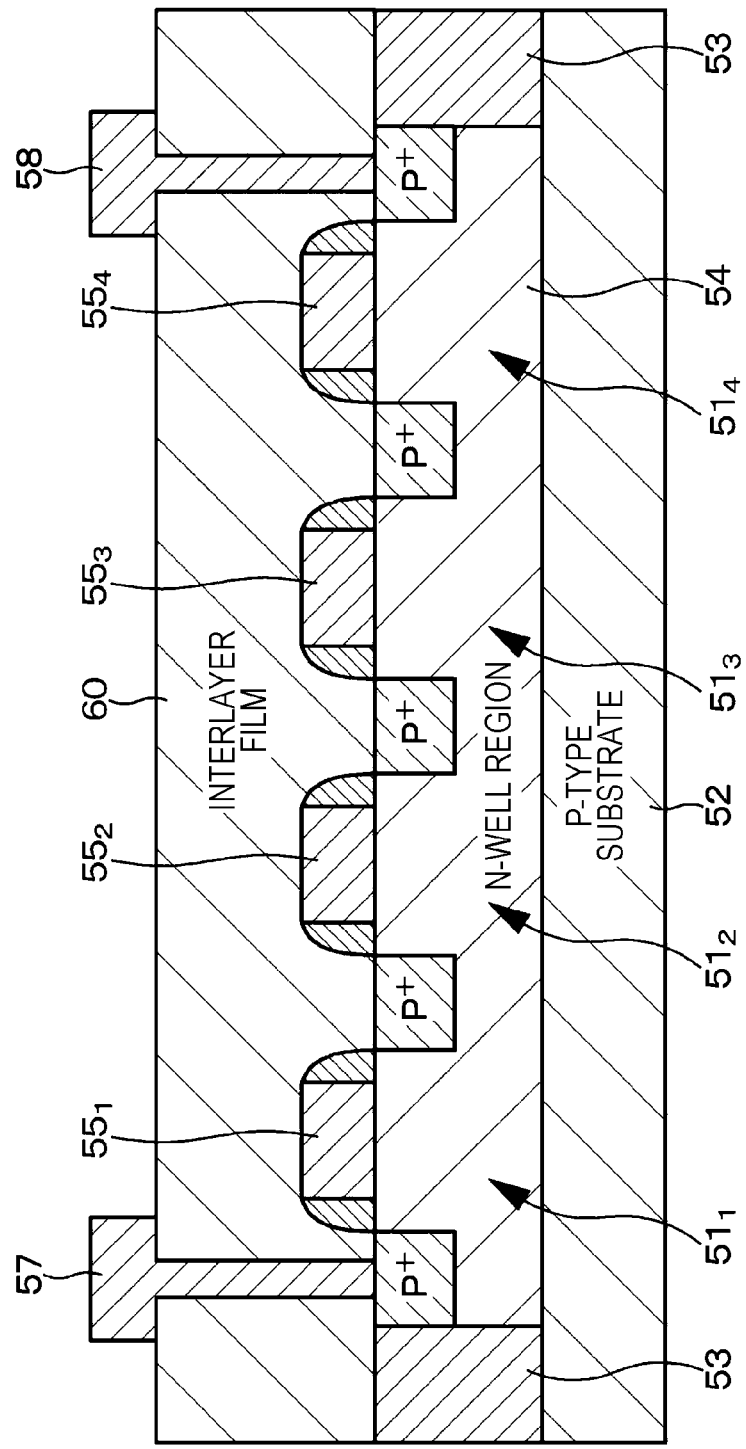
FIG. 8 is a sectional view illustrating a section that is taken along line A-A of FIG. 7A and is viewed in an arrow direction.

Example 1 is an example where one transistor $Tr_4$ of transistors that configure the active load 1413 includes a field effect transistor. FIG. 7A illustrates a layout of a principal part of an active load in Example 1, and FIG. 8 illustrates a sectional view of a section that is taken along line A-A of FIG. 7A and is viewed in an arrow direction. Here, a configuration of one P-channel MOS type field effect transistor (hereinafter abbreviated as a "PMOS transistor") $Tr_4$ of P-channel MOS type field effect transistors that configure the active load 1413 in the circuit configuration illustrated in FIG. 6A of the comparator 141 is described as an example.

The PMOS transistor $Tr_4$ that configures the active load 1413 in Example 1 has a configuration in which, for example, four PMOS transistors $51_1$, $51_2$, $51_3$, and $51_4$ having an arbitrary gate length and an arbitrary gate width are connected in series to have a common active region. Specifically, the four PMOS transistors $51_1$, $51_2$, $51_3$, and $51_4$ are formed in an active region 54 that includes an N-well region surrounded by an element separator 53 on a P-type semiconductor substrate 52, and are connected in series via the active region 54.

Stated another way, the PMOS transistor $Tr_4$ in Example 1 includes, for example, four gate terminals (illustrated as gate electrodes in the drawings; the similar is applied to respective examples described below) $55_1$, $55_2$, $55_3$, and $55_4$, as control terminals that control current. Then, a configuration is employed in which the four gate terminals $55_1$, $55_2$, $55_3$, and $55_4$ are electrically connected in common by a wiring line 56, no contacts are present among the respective gate terminals $55_1$, $55_2$, $55_3$, and $55_4$, and drain regions and source regions are alternately connected in series. $P^+$ regions at both ends in the active region 54 that serve as the source region and the drain region are electrically connected to a source terminal 57 and a drain terminal 58 that penetrate an interlayer film 60.

Figure 7B:
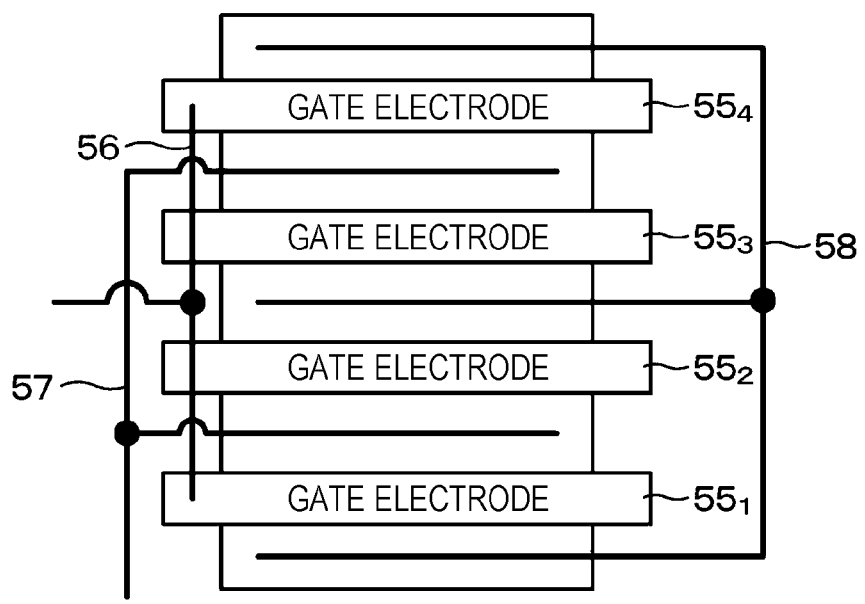
FIG. 7B is a plan view illustrating a layout of a multi-finger structure in a reference example.

Incidentally, FIG. 7B illustrates, as a reference example, a layout in a case where four PMOS transistors $51_1$, $51_2$, $51_3$, and $51_4$ having a gate length and a gate width that are the same as a gate length and a gate width in the active load 1413 in Example 1 are designed in a multi-finger structure.

In a comparison between Example 1 of FIG. 7A and the reference example of FIG. 7B, both layout areas are not different from each other. However, in the layout of Example 1, in contrast to the layout of the reference example, the four PMOS transistors $51_1$, $51_2$, $51_3$, and $51_4$ are connected in series with respect to a source/drain direction. Accordingly, channel resistance increases, and therefore the transconductance gm of the active load 1413 decreases.

Figure 9:
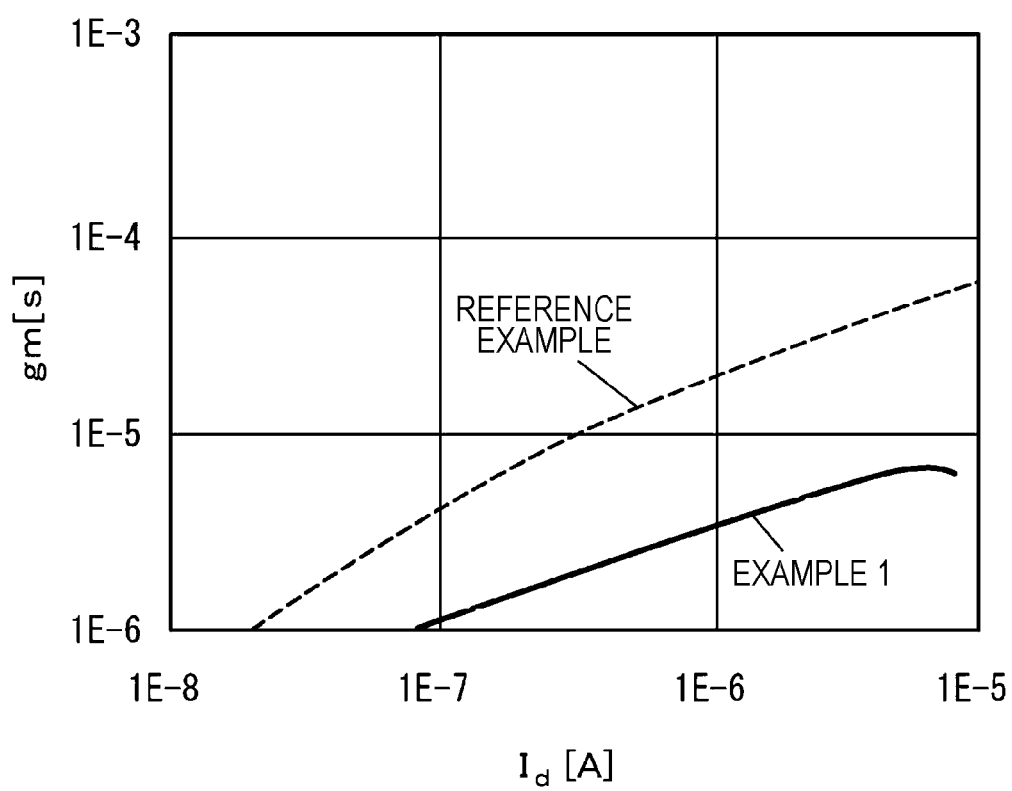
FIG. 9 is a diagram illustrating transconductances gm with respect to a drain current Id in cases where four PMOS transistors are made according to the layout of Example 1 and according to the layout of the reference example.

FIG. 9 illustrates transconductances gm with respect to a drain current Id in cases where four PMOS transistors $51_1$, 51₂, 51₃, and 51₄ having, for example, a gate length of 0.5 µm and a gate width of 2 µm are made according to the layout of Example 1 and the layout of the reference example. As is apparent from FIG. 9, in the case of the layout of Example 1, a transconductance gm at a drain current Id of about 1 µA decreases by 1 digit in comparison with the layout of the reference example.

As described above, a decrease in the transconductance gm of the active load 1413 enables a reduction in noise of the comparator 141 itself (a reduction in noise). This is described in detail below.

In the circuit configuration illustrated in FIG. 6A of the comparator 141, it is assumed that, in an N-channel MOS-type field effect transistor (hereinafter abbreviated as an "NMOS transistor") Tr₂ that configures the differential input unit 1411, a random noise component is $V_{n\_n}^2$ and transconductance is $gm_{\_n}$. It is also assumed that, in the PMOS transistor Tr₄ that configures the active load 1413, a random noise component of is $V_{n\_p}^2$ and transconductance is $gm_{\_p}$. In this case, the entire random noise $V_n^2$ output from the comparator 141 is expressed by Formula (1) described below.

$$\overline{V_n^2} \propto \overline{V_{n\_n}^2} + \left(\frac{gm_{\_p}}{gm_{\_n}}\right)^2 \overline{V_{n\_p}^2} \quad (1)$$

Stated another way, the entire random noise $V_n^2$ output from the comparator 141 is expressed as the sum of the random noise component $V_{n\_n}^2$ of the differential input unit 1411 and the random noise component $V_{n\_p}^2$ of the active load 1413. The random noise component $V_{n\_p}^2$ of the active load 1413 contributes to the random noise $V_n^2$ of the comparator 141 in proportion to the transconductance $gm_{\_p}$ of the PMOS transistor Tr₄ that configures the active load 1413.

Figure 10:
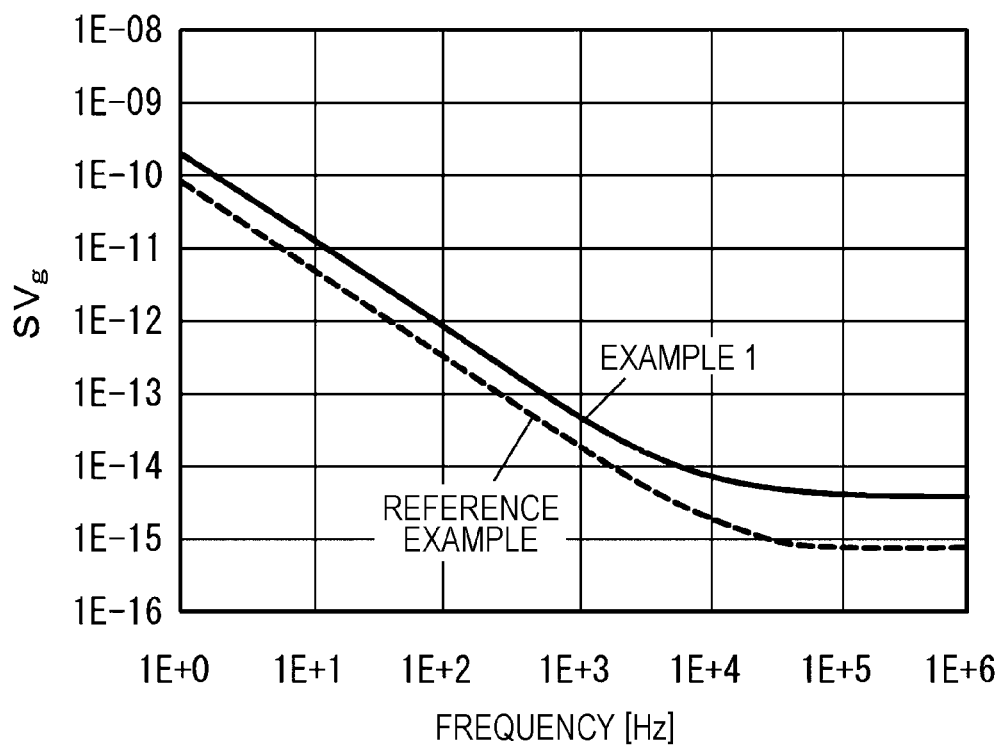
FIG. 10 is a diagram illustrating a random noise spectrum of a transistor itself that configures an active load, by using gate input-referred noise $SV_g$.

FIG. 10 illustrates a random noise spectrum of a transistor itself that configures the active load 1413, by using gate input-referred noise $SV_g$. As is apparent from FIG. 10, the random noise of the transistor itself that configures the active load 1413 is larger in the layout of Example 1 than in the layout of the reference example, and therefore the random noise component $V_{n\_p}^2$ itself of the active load 1413 increases.

However, the transconductance $gm_{\_p}$ of the active load 1413 decreases, and therefore $(gm_{\_p}/gm_{\_n})^2 \times V_{n\_p}^2$ decreases. Thus, the random noise component $V_{n\_n}^2$ of the differential input unit 1411 is the same in the layout of Example 1 and the layout of the reference example, but the random noise $V_n^2$ of the entirety of the comparator 141 decreases in the layout of Example 1 in comparison with the case of the layout of the reference example.

In addition, by applying a technology in Example 1, a standard deviation of a variation in output offset voltage of the comparator 141 can also be improved. Here, a variation in output offset voltage is an amount indicating a degree of variation in output voltage of the comparator 141 that is generated due to a variation in characteristics of an element that configures the comparator 141. If a standard deviation of this variation in output offset voltage is large, fixed pattern noise increases. A variation in output offset voltage becomes more remarkable as a transistor that configures the comparator 141 has a larger variation in threshold voltage.

In the circuit configuration illustrated in FIG. 6A of the comparator 141, it is assumed that, in the NMOS transistor Tr₂ that configures the differential input unit 1411, a standard deviation of a variation in threshold voltage is $\sigma_{Vth\_n}$ and transconductance is $gm_{\_n}$. It is also assumed that, in the PMOS transistor Tr₄ that configures the active load 1413, a standard deviation of a variation in threshold voltage is $\sigma_{Vth\_p}$ and transconductance is $gm_{\_p}$. In this case, a standard deviation $\sigma_{Vout}$ of a variation of output offset voltage of the comparator 141 is expressed by Formula (2) described below.

$$\sigma_{Vout}^2 \propto \sigma_{Vth\_n}^2 + \left(\frac{gm_{\_p}}{gm_{\_n}}\right)^2 \sigma_{Vth\_p}^2 \quad (2)$$

Stated another way, the standard deviation $\sigma_{Vout}$ of a variation in output offset voltage of the comparator 141 is determined by the sum of a variation in threshold voltage $\sigma_{Vth\_n}$ of the NMOS transistor Tr₂ of the differential input unit 1411 and a standard deviation $\sigma_{Vth\_p}$ of a variation in threshold voltage of the PMOS transistor Tr₄ of the active load 1413. The standard deviation $\sigma_{Vth\_p}$ of a variation in threshold voltage of the PMOS transistor Tr₄ of the active load 1413 contributes to the standard deviation $\sigma_{Vout}$ of a variation in output offset voltage in proportion to the transconductance $gm_{\_p}$.

A variation in threshold voltage generally depends on the gate area of a MOS type field effect transistor. Accordingly, a variation in threshold voltage of a PMOS transistor that configures the active load 1413 is equal in the layout of Example 1 and the layout of the reference example. Thus, the standard deviation $\sigma_{Vth\_n}$ of a variation in threshold voltage of the NMOS transistor Tr₂ that configures the differential input unit 1411 is the same in the layout of Example 1 and the layout of the reference example, and therefore the standard deviation $\sigma_{Vout}$ of a variation in output offset voltage decreases in the layout of Example 1 in comparison with the case of the layout of the reference example.

FIG. 11 illustrates an effect of improvements in random noise and a variation in output voltage of the comparator 141 in a case where the layout of Example 1 is used, in comparison with a case where the layout of the reference example is used. Here, a ratio of a channel length L to a channel width W of the PMOS transistor Tr₄ that configures the active load 1413 is assumed, for example, in such a way that L/W=0.5/2 µm. Then, it is assumed that, in the case of the layout of the reference example, transconductance $gm_{\_p}$ of the active load 1413, a noise component $V_{n\_n}$ of the differential input unit 1411, a noise component $(gm_{\_p}/gm_{\_n}) \times V_{n\_p}$ of the active load 1413, the entire noise $V_n$ of the comparator 141, and a standard deviation $\sigma_{Vout}$ of a variation in output offset voltage are 1.

In this case, in the comparator 141 in a case where the layout of Example 1 is used, it is expected that the transconductance $gm_{\_p}$ of the active load 1413 will be improved by about 85% and the noise component $(gm_{\_p}/gm_{\_n}) \times V_{n\_p}$ will be improved by about 60%. It is also expected that the entire noise $V_n$ of the comparator 141 will be improved by about 15% and the standard deviation $\sigma_{Vout}$ of a variation in output offset voltage will be improved by about 35%.

Example 2

Figure 12A:
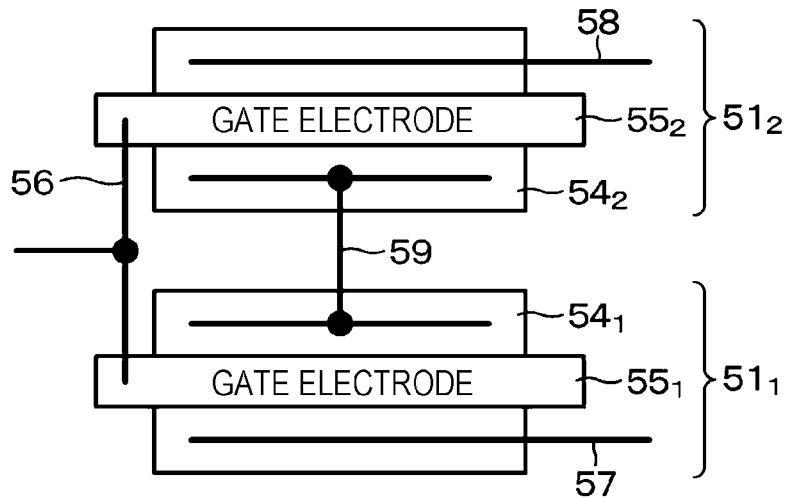
FIG. 12A is a plan view illustrating a layout of a principal part of an active load in Example 2.

Example 2 is a variation of Example 1, and is an example where active regions are separated from each other and one transistor is formed in each of the active regions, i.e., an example where a plurality of transistors is dispersedly disposed in active regions different from each other. FIG. 12A illustrates a layout of a principal part of an active load in Example 2.

A PMOS transistor $Tr_4$ that configures an active load 1413 in Example 2 has a structure in which one PMOS transistor is formed in each of, for example, two active regions $54_1$ and $54_2$ that have been electrically separated from each other.

Specifically, gate terminals $55_1$ and $55_2$ are respectively disposed in a plurality (for example, two) of active regions $54_1$ and $54_2$, and two PMOS transistors $51_1$ and $51_2$ are formed. Then, in the two PMOS transistors $51_1$ and $51_2$, the active region $54_1$ and the active region $54_2$ are connected by a wiring line 59 and the two gate terminals $55_1$ and $55_2$ that control current are electrically connected in common by a wiring line 56.

In other words, the active load 1413 in Example 2 has a structure in which the PMOS transistor $Tr_4$ is divided into, for example, two PMOS transistors $51_1$ and $51_2$ and these PMOS transistors $51_1$ and $51_2$ are connected in series.

Here, a case where an active region electrically separates into two active regions, one gate terminal is disposed in each of the active regions, and two PMOS transistors $51_1$ and $51_2$ in total are configured has been described as an example. However, the number of transistors is not limited to two, and may be three or more. In this case, similarly, in three or more PMOS transistors, three gate terminals that control current are respectively disposed in three or more active regions that have been separated from each other, and are electrically connected in common by the wiring line 56.

Figure 12B:
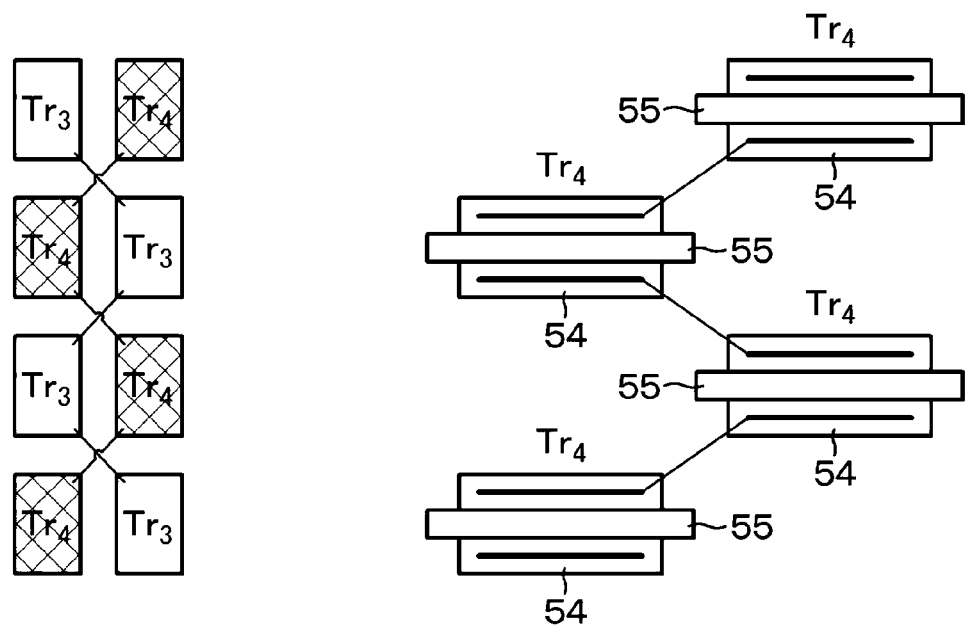
FIG. 12B is a layout diagram illustrating one example of common centroidal arrangement.

By employing the structure described above of the PMOS transistor $Tr_4$ in Example 2, in the comparator 141 illustrated in FIG. 6A, the PMOS transistor $Tr_3$ and the PMOS transistor $Tr_4$ can have a layout of common centroidal arrangement in which the centers of gravity of arrangement of both transistors match each other, as illustrated in FIG. 12B. By employing such a layout, a relative variation in characteristics between the PMOS transistor $Tr_3$ and the PMOS transistor $Tr_4$ can be reduced, and therefore a variation in an output of the comparator 141 can be reduced.

Operation and effects in Example 3 to Example 5 described later are similar to operation and effects in Example 2 described above. The PMOS transistor $Tr_4$ can be divided to have a variety of layouts, as described in Example 2 and Example 3 to Example 5 described later, on the basis of the balance with a channel width W required to obtain characteristics requested in designing a circuit.

Example 3

Figure 13:
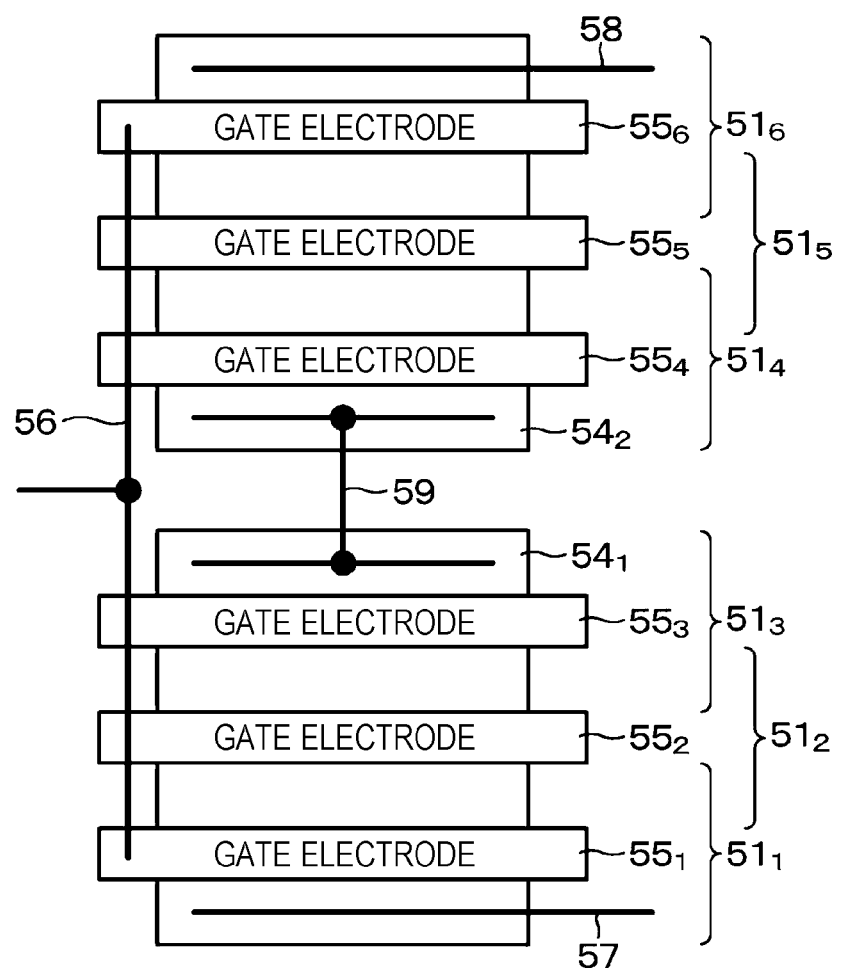
FIG. 13 is a plan view illustrating a layout of a principal part of an active load in Example 3.

Example 3 is a variation of Example 1, and is an example where active regions are separated from each other and a plurality of transistors is formed in each of the active regions. FIG. 13 illustrates a layout of a principal part of an active load in Example 3.

A PMOS transistor $Tr_4$ that configures an active load 1413 in Example 3 has a structure in which a plurality (for example, three) of PMOS transistors is formed in each of, for example, two active regions $54_1$ and $54_2$ that have been electrically separated from each other.

Specifically, three gate terminals $55_1$, $55_2$, and $55_3$ are disposed in the active region $54_1$, and three PMOS transistors $51_1$, $51_2$, and $51_3$ are formed. Furthermore, three gate terminals $55_4$, $55_5$, and $55_6$ are disposed in the active region $54_2$, and three PMOS transistors $51_4$, $51_5$, and $51_6$ are formed.

The three PMOS transistors $51_1$, $51_2$, and $51_3$ formed in the active region $54_1$ are connected in series to each other via the active region $54_1$, and the three PMOS transistors $51_4$, $51_5$, and $51_6$ formed in the active region $54_2$ are connected in series to each other via the active region $54_2$. Then, the active region $54_1$ and the active region $54_2$ are connected by a wiring line 59, and therefore the six PMOS transistors $51_1$ to $51_6$ are connected in series. Furthermore, in the six PMOS transistors $51_1$ to $51_6$, the six gate terminals $55_1$ to $55_6$ that control current are electrically connected in common by a wiring line 56.

Here, a case where an active region electrically separates into two active regions, three gate terminals are disposed in each of the active regions, and the six PMOS transistors $51_1$ to $51_6$ in total are configured has been described as an example. However, the number of transistors is not limited to six. For example, a configuration can be employed in which three or more gate terminals are disposed in each of two active regions that have been electrically separated from each other, or a configuration can be employed in which an active region electrically separates into three or more active regions and two gate terminals or three or more gate terminals are disposed in each of the active regions. In both cases, in a plurality of PMOS transistors, a plurality of gate terminals that controls current is electrically connected in common by the wiring line 56.

Example 4

Figure 14:
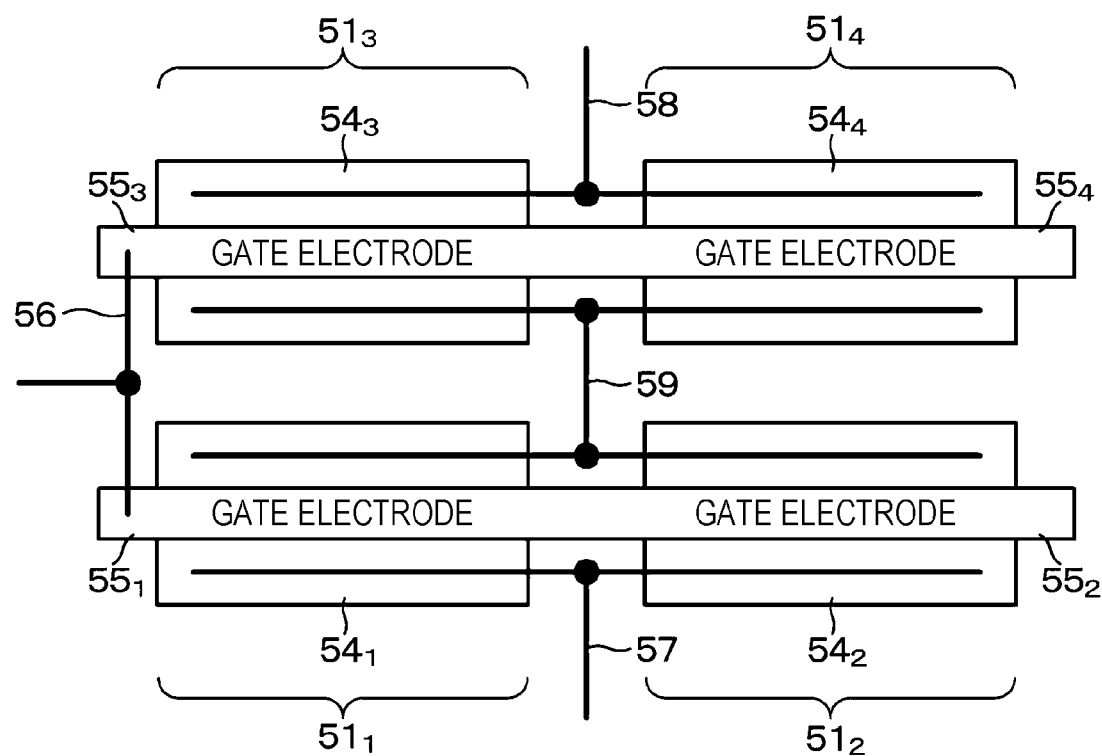
FIG. 14 is a plan view illustrating a layout of a principal part of an active load in Example 3.

Example 4 is a variation of Example 1, and is an example of a combination of a parallel connection and a serial connection of two or more transistors. FIG. 14 illustrates a layout of a principal part of an active load in Example 4.

A PMOS transistor $Tr_4$ that configures an active load 1413 in Example 4 has a structure in which one PMOS transistor is formed in each of, for example, four active regions $54_1$ to $54_4$ that have been electrically separated from each other.

Specifically, a gate terminal $55_1$ is disposed in the active region $54_1$, and a PMOS transistor $51_1$ is formed. A gate terminal $55_2$ is disposed in the active region $54_2$, and a PMOS transistor $51_2$ is formed. Then, the respective gate terminals $55_1$ and $55_2$ become a common terminal, and source regions and drain regions are respectively electrically connected in common to each other, and therefore the PMOS transistor $51_1$ and the PMOS transistor $51_2$ have a parallel connection configuration.

Furthermore, a gate terminal $55_3$ is disposed in the active region 543, and a PMOS transistor $51_3$ is formed. A gate terminal $55_4$ is disposed in the active region $54_4$, and a PMOS transistor $51_4$ is formed. Then, the respective gate terminals $55_3$ and $55_4$ become a common terminal, and source regions and drain regions are respectively electrically connected in common, and therefore the PMOS transistor $51_3$ and the PMOS transistor $51_4$ have a parallel connection configuration.

In the configuration described above, the PMOS transistor $51_1$ and the PMOS transistor $51_2$ that have been connected in parallel and the PMOS transistor $51_3$ and the PMOS transistor $51_4$ that have been connected in parallel are connected in series by a wiring line 59. Stated another way, the PMOS transistor $Tr_4$ that configures the active load 1413 in Example 4 has a configuration in which a parallel connection set of the PMOS transistor $51_1$ and the PMOS transistor $51_2$ and a parallel connection set of the PMOS transistor $51_3$ and the PMOS transistor $51_4$ are connected in series. Then, the gate terminals $55_1$ and $55_2$ and the gate terminals $55_3$ and $55_4$ that control current are electrically connected in common by a wiring line 56.

Here, a case where the number of transistors connected in parallel is two has been described as an example. However, the number of transistors connected in parallel is not limited to two, and can be three or more. Similarly, the number of serial connections among parallel connection sets is not limited to two, and can be three or more.

Example 5

Figure 15:
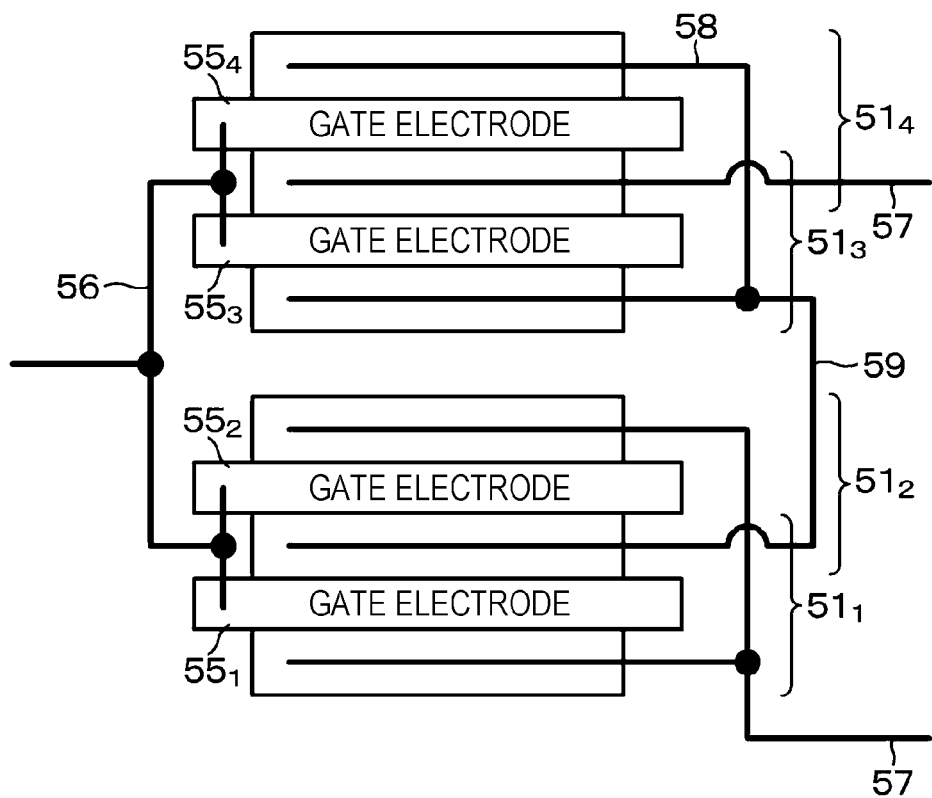
FIG. 15 is a plan view illustrating a layout of a principal part of an active load in Example 4.

Example 5 is a variation of Example 1, and is an example of a combination of a serial connection and a parallel connection of two or more transistors. FIG. 15 illustrates a layout of a principal part of an active load in Example 5.

A PMOS transistor $Tr_4$ that configures an active load 1413 in Example 5 has a structure in which a plurality (for example, two) of PMOS transistors is formed in each of, for example, two active regions $54_1$ and $54_2$ that have been electrically separated from each other.

Specifically, two gate terminals $55_1$ and $55_2$ are disposed in the active region $54_1$, and two PMOS transistors $51_1$ and $51_2$ are formed. Then, in these PMOS transistors $51_1$ and $51_2$, the respective gate terminals $55_1$ and $55_2$ and source regions are respectively electrically connected in common to each other. Therefore, the PMOS transistor $51_1$ and the PMOS transistor $51_2$ are connected in series to each other.

Furthermore, two gate terminals $55_3$ and $55_4$ are disposed in the active region $54_2$, and two PMOS transistors $51_3$ and $51_4$ are formed. Then, in these PMOS transistors $51_3$ and $51_4$, the respective gate terminals $55_3$ and $55_4$ and source regions are respectively electrically connected in common to each other. Therefore, the PMOS transistor $51_3$ and the PMOS transistor $51_4$ are connected in series to each other.

In the configuration described above, the PMOS transistor $51_1$ and the PMOS transistor $51_2$ that have been connected in series and the PMOS transistor $51_3$ and the PMOS transistor $51_4$ that have been connected in series are connected in parallel by a wiring line 59. Stated another way, the PMOS transistor $Tr_4$ that configures the active load 1413 in Example 5 has a configuration in which a serial connection set of the PMOS transistor $51_1$ and the PMOS transistor $51_2$ and a serial connection set of the PMOS transistor $51_3$ and the PMOS transistor $51_4$ are connected in parallel. Then, the gate terminals $55_1$ and $55_2$ and the gate terminals $55_3$ and $55_4$ that control current are electrically connected in common by a wiring line 56.

Example 6

Figure 16:
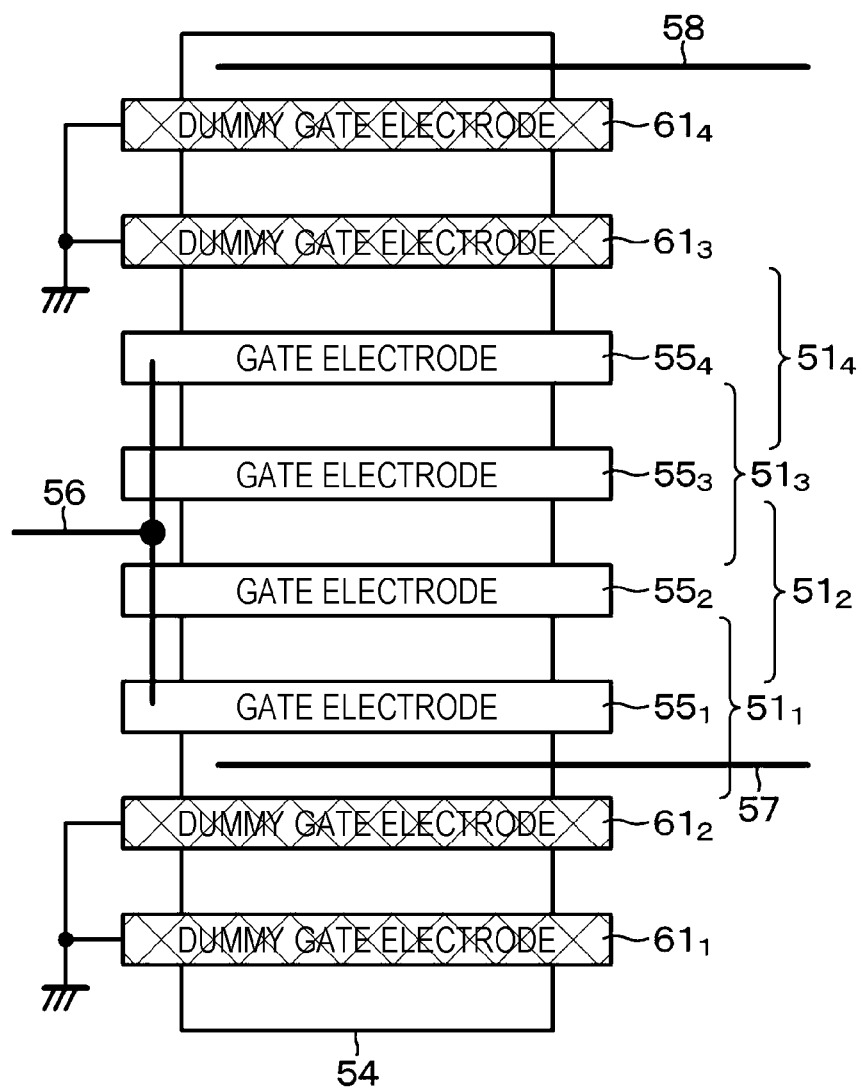
FIG. 16 is a plan view illustrating a layout of a principal part of an active load in Example 6.

Example 6 is a variation of Example 1, and is an example where dummy gate terminals are disposed in an active region. FIG. 16 illustrates a layout of a principal part of an active load in Example 6.

A PMOS transistor $Tr_4$ that configures an active load 1413 in Example 6 has a structure in which, in an active region $54_1$, a plurality (for example, four) of gate terminals $55_1$ to $55_4$ is disposed and a plurality (for example, four) of dummy gate terminals $61_1$ to $61_4$ is disposed.

Specifically, four gate terminals $55_1$ to $55_4$ are disposed in the active region $54_1$, and four PMOS transistors $51_1$ to $51_4$ are formed. Then, the four gate terminals $55_1$ to $55_4$ that control current are electrically connected in common by a wiring line 56.

Furthermore, two dummy gate terminals $61_1$ and $61_2$ are disposed on a side of one end in the same active region $54_1$, and two dummy gate terminals $61_3$ and $61_4$ are disposed on a side of the other end. These dummy gate terminals $61_1$ to $61_4$ are normally given a ground potential. However, in some cases, the dummy gate terminals $61_1$ to $61_4$ are set in a floating state.

By employing the PMOS transistor $Tr_4$ that configures the active load 1413 in Example 6, the following operation and effects can be obtained. By disposing the dummy gate terminals $61_1$ to $61_4$ around the PMOS transistors $51_1$ to $51_4$ that configure a circuit, a density of the disposition of gate terminals becomes constant, and therefore density dependence can be alleviated. As a result, a processing variation is reduced, and the precision of processing can be improved. Therefore, a variation in characteristics of the PMOS transistor $Tr_4$ can be reduced. Operation and effects in Example 7 are similar to the operation and effects described above.

Example 7

Figure 17:
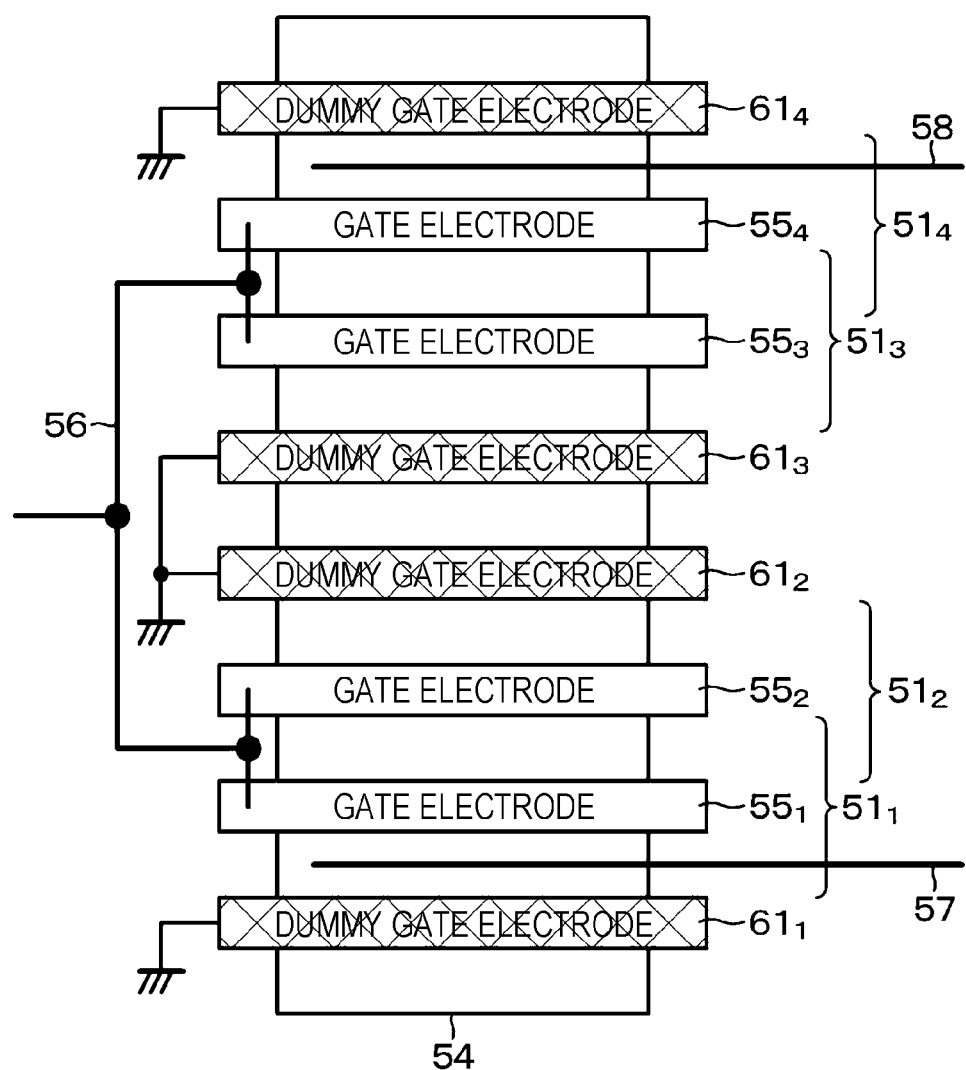
FIG. 17 is a plan view illustrating a layout of a principal part of an active load in Example 7.

Example 7 is a variation of Example 6, and is an example where, in disposing dummy gate terminals in an active region, dummy gate terminals are disposed among transistors that configure a circuit. FIG. 17 illustrates a layout of a principal part of an active load in Example 7.

In Example 6, a configuration is employed in which the dummy gate terminals $61_1$ to $61_4$ are disposed in a peripheral part of transistors that configure a circuit, and specifically, on both sides of the four PMOS transistors $51_1$ to $51_4$ that have been formed in the center within the active region $54_1$.

In contrast, in Example 7, a configuration is employed in which, for example, two dummy gate terminals $61_2$ and $61_3$ are disposed between PMOS transistors $51_1$ and $51_2$ and PMOS transistors $51_3$ and $51_4$ and dummy gate terminals $61_1$ and $61_4$ are disposed on sides of both ends within an active region $54_1$.

Then, the gate terminals $55_1$ and $55_2$ and the gate terminals $55_3$ and $55_4$ that control current are electrically connected in common by a wiring line 56. Furthermore, the dummy gate terminals $61_1$ to $61_4$ are given, for example, a ground potential.

In the case of a PMOS transistor $Tr_4$ that configures an active load 1413 in Example 7, similarly, operation and effects that are similar to the operation and effects of the PMOS transistor $Tr_4$ that configures the active load 1413 in Example 6 can be obtained. Stated another way, density dependence can be alleviated, and therefore the precision of processing can be improved.

Example 8

Example 1 to Example 7 are examples where one PMOS transistor $Tr_4$ of the PMOS transistors that configure the active load 1413 in the circuit configuration illustrated in FIG. 6A of the comparator 141 includes a field effect transistor. In contrast, Example 8 is an example where both PMOS transistors $Tr_3$ and $Tr_4$ that configure an active load 1413 include a field effect transistor.

Figure 18:
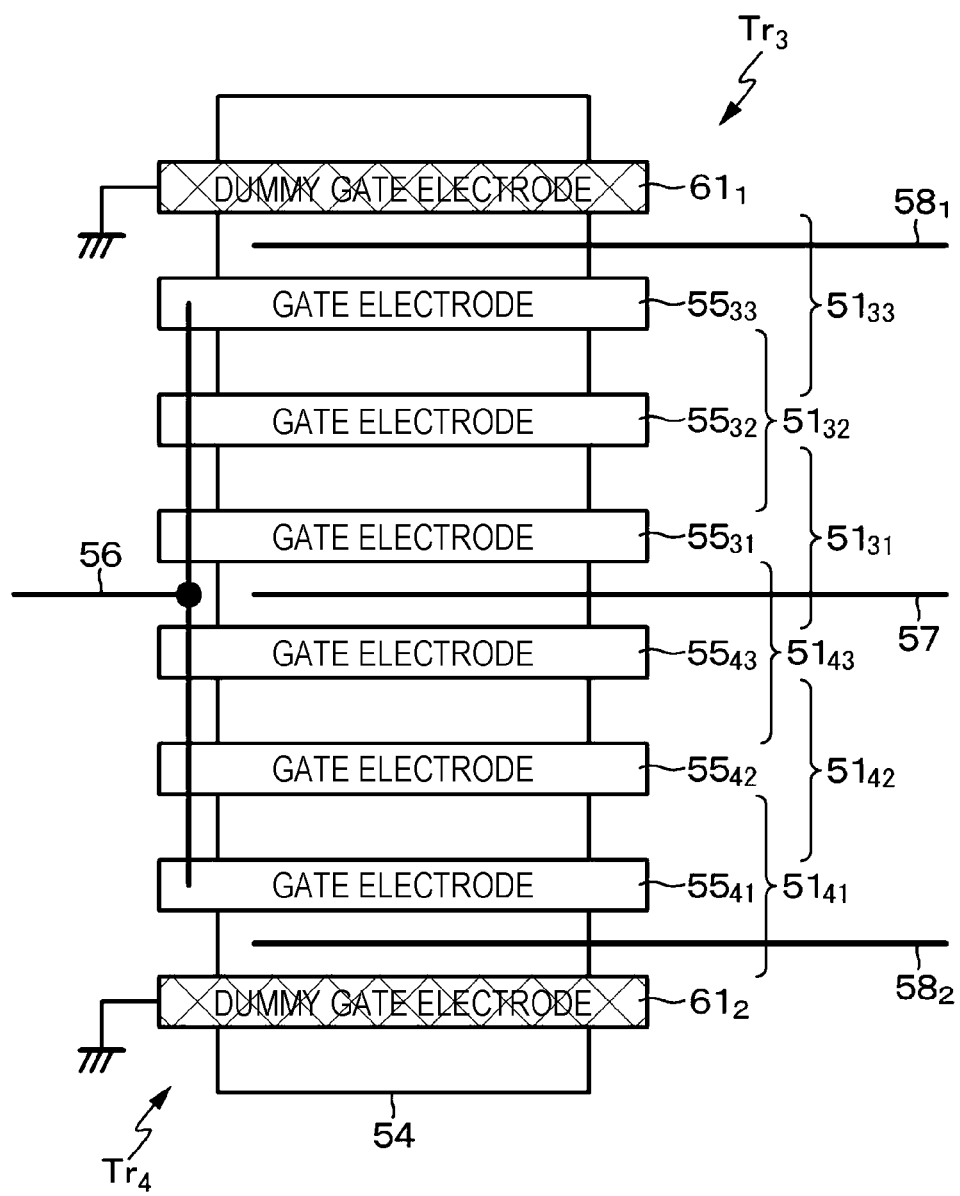
FIG. 18 is a plan view illustrating a layout of a principal part of an active load in Example 8.

FIG. 18 illustrates a layout of a principal part of an active load in Example 8. An active load 1413 in Example 8 has a structure in which both PMOS transistors $Tr_3$ and $Tr_4$ each include a plurality (for example, three) of PMOS transistors, and are formed in the same active region $54_1$.

Specifically, three gate terminals 5531 to 5533 are disposed in the active region $54_1$, and three PMOS transistors 5131 to 5133 of the PMOS transistor $Tr_3$ are formed. Three gate terminals 5541 to 5543 are disposed to be adjacent to the PMOS transistor $Tr_3$ in the same active region $54_1$, and three PMOS transistors 5141 to 5143 of the PMOS transistor $Tr_4$ are formed. Furthermore, dummy gate terminals $61_1$ and $61_2$ are disposed on sides of both ends of the active region $54_1$. These dummy gate terminals $61_1$ and $61_2$ are given, for example, a ground potential.

As described above, the active load 1413 in Example 8 has a structure in which each of the PMOS transistors $Tr_3$ and $Tr_4$ includes a plurality (in this example, three) of PMOS transistors that is connected in series and both PMOS transistors $Tr_3$ and $Tr_4$ have a common active region. Then, drain terminals 581 and 582 are drawn from sides of both ends of the active region $54_1$, and a source terminal 57 is a terminal common to both PMOS transistors $Tr_3$ and $Tr_4$.

The active load 1413 in Example 8 has a structure in which a source region is commonized between the PMOS transistor $Tr_3$ and the PMOS transistor $Tr_4$ that configure the active load 1413 and the source terminal 57 is drawn out as a common terminal, and this enables a reduction in the circuit area of the entirety of the active load 1413.

Second Embodiment

A second embodiment of the present disclosure is an example where a transistor that configures a comparator 141 includes a Fin-FET. The Fin-FET can be formed in a high dielectric constant/metal gate (high-k/metal gate) process. The Fin-FET has a transistor structure in which a planar type transistor has been extended to have a stereoscopic structure and high-speed operation performance and power saving performance have been improved. The technology of the present disclosure, i.e., a technology in which a transistor that configures an active load 1413 includes a plurality of control terminals (gate terminals) and the plurality of control terminals is electrically connected in common, can also be applied to this case. Specific examples of the second embodiment are described below as Example 9 to Example 13.

Example 9

Figure 19A:
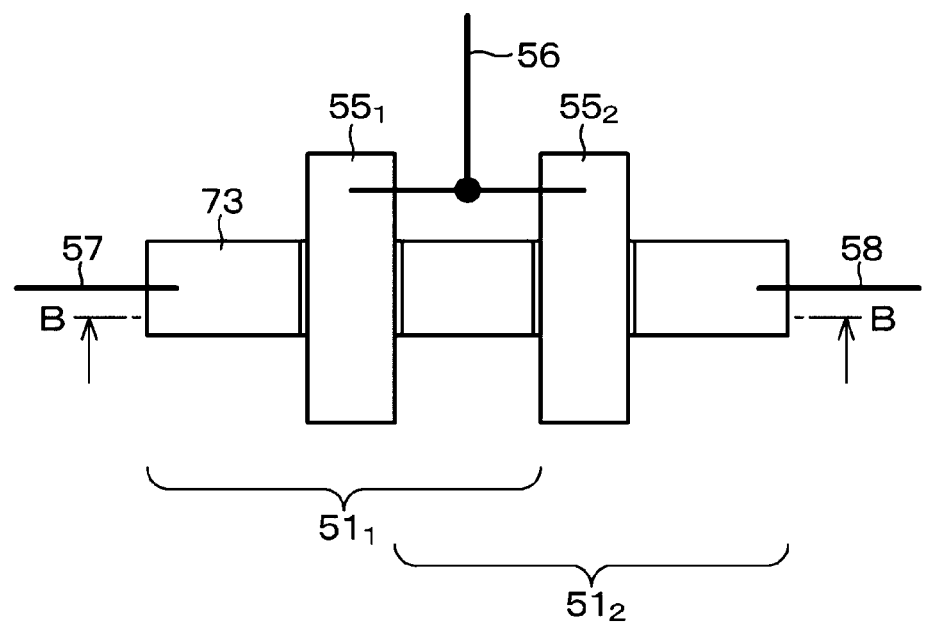
FIG. 19A is a plan view illustrating a layout of a principal part of an active load in Example 9.
Figure 19B:
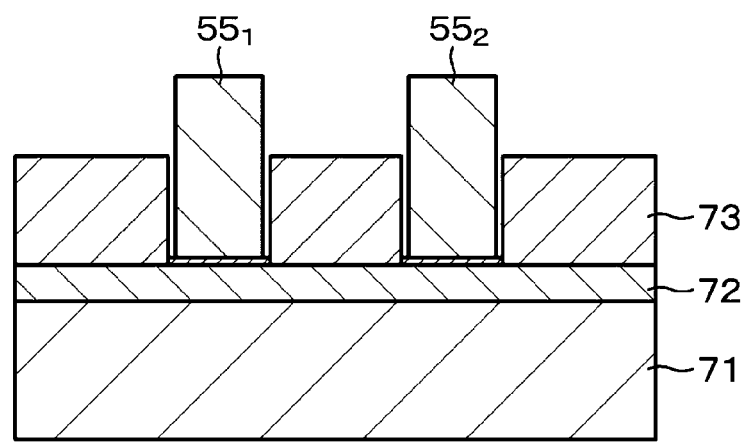
FIG. 19B is a sectional view illustrating a section that is taken along line B-B of FIG. 19A and is viewed in an arrow direction.

Example 9 is an example where one transistor $Tr_4$ of transistors that configure an active load 1413 includes one Fin-FET. FIG. 19A illustrates a layout of a principal part of an active load in Example 9, and FIG. 19B illustrates a sectional view of a section that is taken along line B-B of FIG. 19A and is viewed in an arrow direction.

A PMOS transistor $Tr_4$ that configures the active load 1413 in Example 9 has a structure in which an insulating film 72 is formed on a semiconductor substrate 71 and a fin 73 is provided on the insulating film 72. Then, a plurality (for example, two) of gate terminals $55_1$ and $55_2$ is disposed in recesses of the fin 73, and two PMOS transistors $51_1$ and $51_2$ are formed. Then, both ends of the fin 73 that serve as a source region and a drain region are electrically connected to a source terminal 57 and a drain terminal 58. Furthermore, the two gate terminals $55_1$ and $55_2$ that control current are electrically connected in common by a wiring line 56.

As described above, the PMOS transistor $Tr_4$ that configures the active load 1413 in Example 9 includes one Fin-FET in which two or more gate terminals are disposed, and has a structure in which all of the gate terminals that control current are electrically connected in common (commonized).

Example 10

Figure 20A:
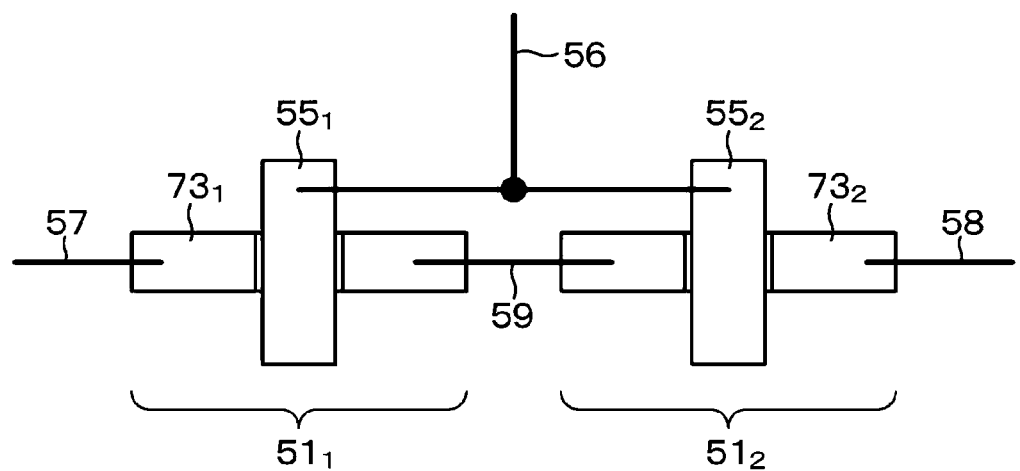
FIG. 20A is a plan view illustrating a layout of a principal part of an active load in Example 10.

Example 10 is a variation of Example 9, and is an example where one transistor $Tr_4$ of transistors that configure an active load 1413 includes a plurality of Fin-FETs connected in series. FIG. 20A illustrates a layout of a principal part of an active load in Example 10.

Example 9 indicates, as an example, a case where the PMOS transistor $Tr_4$ includes one Fin-FET. In contrast, a PMOS transistor $Tr_4$ that configures an active load 1413 in Example 10 has a structure in which a plurality (for example, two) of Fin-FETs is connected in series. Specifically, two fins $73_1$ and $73_2$ are connected in series by a wiring line 59, and gate terminals $55_1$ and $55_2$ that are disposed in these fins $73_1$ and $73_2$ are electrically connected in common by a wiring line 56.

As described above, the PMOS transistor $Tr_4$ that configures the active load 1413 in Example 10 has a structure in which two or more Fin-FETs are connected in series by a wiring line and all of the gate terminals that control current are electrically connected in common by a wiring line.

Example 11

Figure 20B:
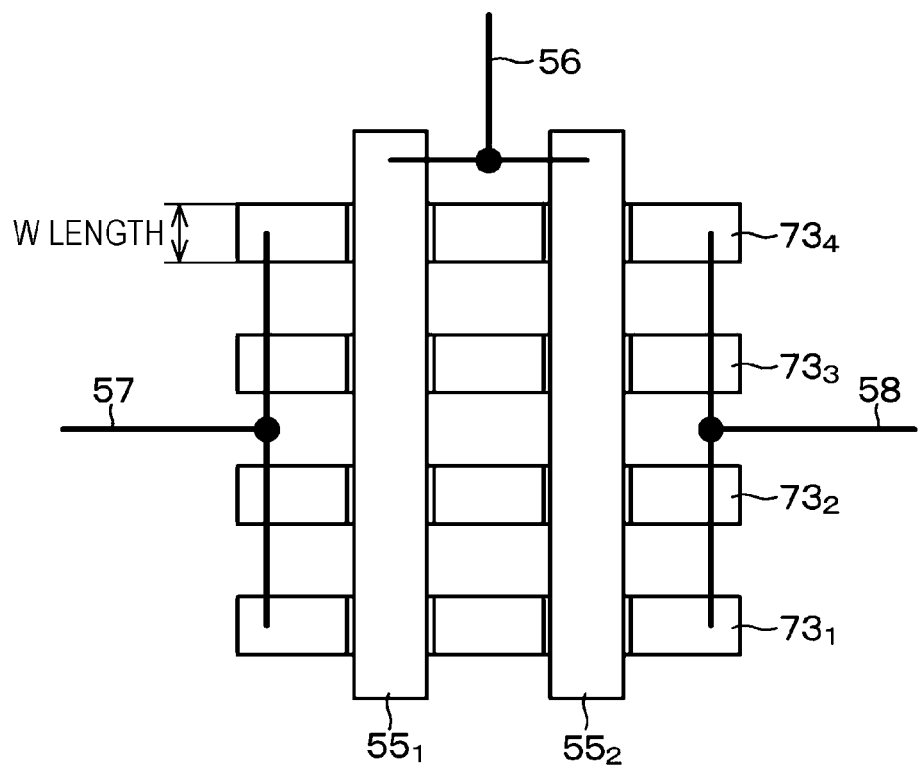
FIG. 20B is a plan view illustrating a layout of a principal part of an active load in Example 11.

Example 11 is a variation of Example 9, and is an example where one transistor $Tr_4$ of transistors that configure an active load 1413 includes a plurality of Fin-FETs connected in parallel. FIG. 20B illustrates a layout of a principal part of an active load in Example 11.

A PMOS transistor $Tr_4$ that configures an active load 1413 in Example 11 has a structure in which a plurality (for example, four) of PMOS transistors $Tr_4$ that each configure the active load 1413 in Example 9 is connected in parallel. Specifically, four fins $73_1$ to $73_4$ are disposed in parallel, respective source regions are connected in common by a source wiring line 57, and respective drain regions are connected in common by a drain wiring line 58. Furthermore, each of the gate terminals $55_1$ and $55_2$ is a terminal common to the four fins $73_1$ to $73_4$, and both gate terminals $55_1$ and $55_2$ are electrically connected in common by a wiring line 56.

As described above, the PMOS transistor $Tr_4$ that configures the active load 1413 in Example 11 has a structure in which two or more Fin-FETs are connected in parallel and all of the gate terminals that control current are electrically connected in common.

Example 12

Figure 21A:
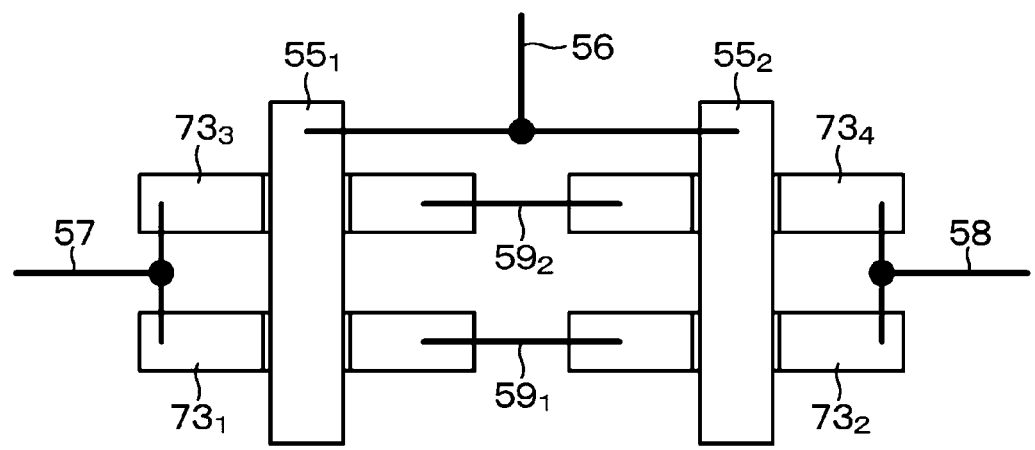
FIG. 21A is a plan view illustrating a layout of a principal part of an active load in Example 12.

Example 12 is a variation of Example 10, and is an example where one transistor $Tr_4$ of transistors that configure an active load 1413 is configured by connecting, in parallel, a plurality of sets of Fin-FETs connected in series. FIG. 21A illustrates a layout of a principal part of an active load in Example 12.

A PMOS transistor $Tr_4$ that configures an active load 1413 in Example 12 has a structure in which a plurality (for example, two) of PMOS transistors $Tr_4$ that each configure the active load 1413 in Example 10 is connected in parallel. Specifically, two fins $73_1$ and $73_2$ are connected in series by a wiring line 591. Similarly, two fins $73_3$ and $73_4$ are connected in series by a wiring line 5992. Then, a gate terminal $55_1$ is disposed across the fin $73_1$ and the fin $73_3$, a gate terminal $55_2$ is disposed across the fin $73_2$ and the fin $73_4$, and the gate terminals $55_1$ and $55_2$ are electrically connected in common by a wiring line 56.

As described above, the PMOS transistor $Tr_4$ that configures the active load 1413 in Example 12 has a structure in which two or more Fin-FETs connected in series are connected in parallel and all of the gate terminals that control current are electrically connected in common.

Example 13

Figure 21B:
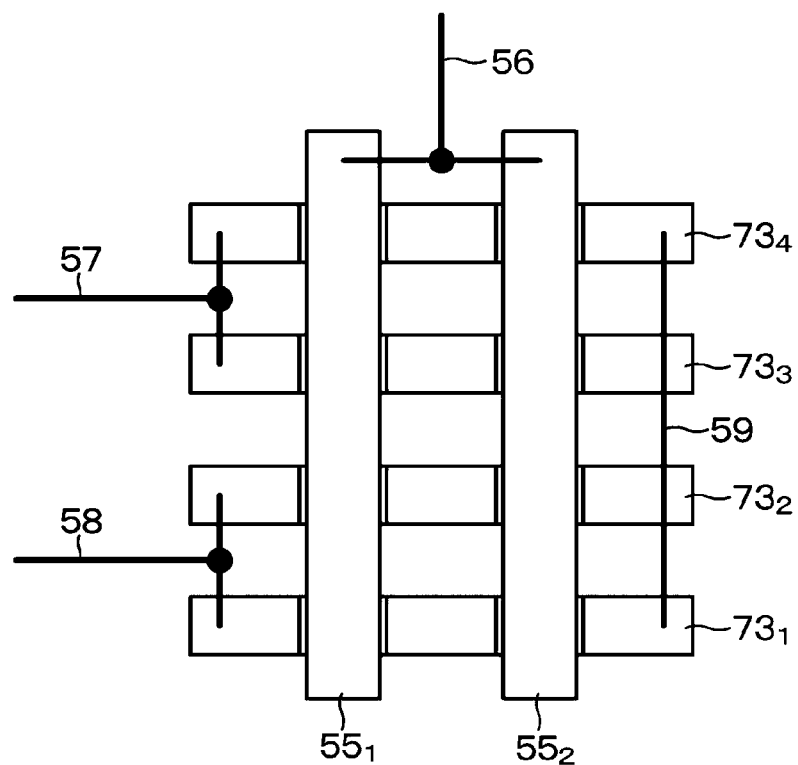
FIG. 21B is a plan view illustrating a layout of a principal part of an active load in Example 13.

Example 13 is a variation of Example 9, and is an example where one transistor $Tr_4$ of transistors that configure an active load 1413 is configured by connecting, in series, a plurality of sets of Fin-FETs connected in parallel. FIG. 21B illustrates a layout of a principal part of an active load in Example 13.

A PMOS transistor $Tr_4$ that configures an active load 1413 in Example 13 has a structure in which a plurality (for example, two) of PMOS transistors $Tr_4$ that each configure the active load 1413 in Example 9 is connected in parallel and a plurality (for example, two) of parallel connection sets described above is connected in series. Specifically, four fins $73_1$ to $73_4$ are disposed in parallel, and one ends of the respective four fins $73_1$ to $73_4$ are connected in common by a wiring line 59. Then, the fin $73_1$ and the fin $73_2$ form a set, and are connected in parallel by a drain wiring line 58. The fin $73_3$ and the fin $73_4$ form a set, and are connected in parallel by a source wiring line 57. Furthermore, each of the gate terminals $55_1$ and $55_2$ is a terminal common to the four fins $73_1$ to $73_4$, and both gate terminals $55_1$ and $55_2$ are electrically connected in common by a wiring line 56.

As described above, the PMOS transistor $Tr_4$ that configures the active load 1413 in Example 13 has a structure in which two or more Fin-FETs are connected in parallel, two or more parallel connection sets of Fin-FETs described above are connected in series, and all of the gate terminals that control current are electrically connected in common.

As described above, the PMOS transistor $Tr_4$ that configures the active load 1413 in Example 12 has a structure in which two or more Fin-FETs connected in series are connected in parallel and all of the gate terminals that control current are electrically connected in common.

In the case of the second embodiment described above in which a transistor that configures a comparator 141 includes a Fin-FET, similarly to the cases of Example 2 to Example 5 described above, a layout of common centroidal arrangement can be employed. By employing the layout of common centroidal arrangement, operation and effects that are similar to operation and effects in the cases of Example 2 to Example 5 can be obtained.

In addition, a width of a fin 73 of the Fin-FET has a fixed value that is not freely variable due to the problem of processing, but a total channel length W can be set to be longer by employing Example 11 (FIG. 20B) to Example 13 (FIG. 21B). This enable a further reduction in noise or a reduction in a variation in transistor characteristics.

In addition, a Fin-FET that is formed in the high dielectric constant/metal gate process has a limited maximum value of the gate length of a transistor. Therefore, it is difficult to increase a drain resistance $R_{ds}$ $(=1/g_{ds})$ in comparison with a conventional planer structure. An increase in the drain resistance $R_{ds}$ is a characteristic that is important to secure the stability of an operation of an analog circuit using a MOS type field effect transistor. By connecting a plurality of transistors in series and increasing a total gate length, a drain resistance $R_{ds}$ that is similar to a drain resistance in a former generation can be obtained in addition to a reduction in noise. For this purpose, a variety of layouts, as described in Example 9 to Example 13, can be used on the basis of the balance with a channel width W required to obtain characteristics requested in designing a circuit.

Third Embodiment

Figure 22:
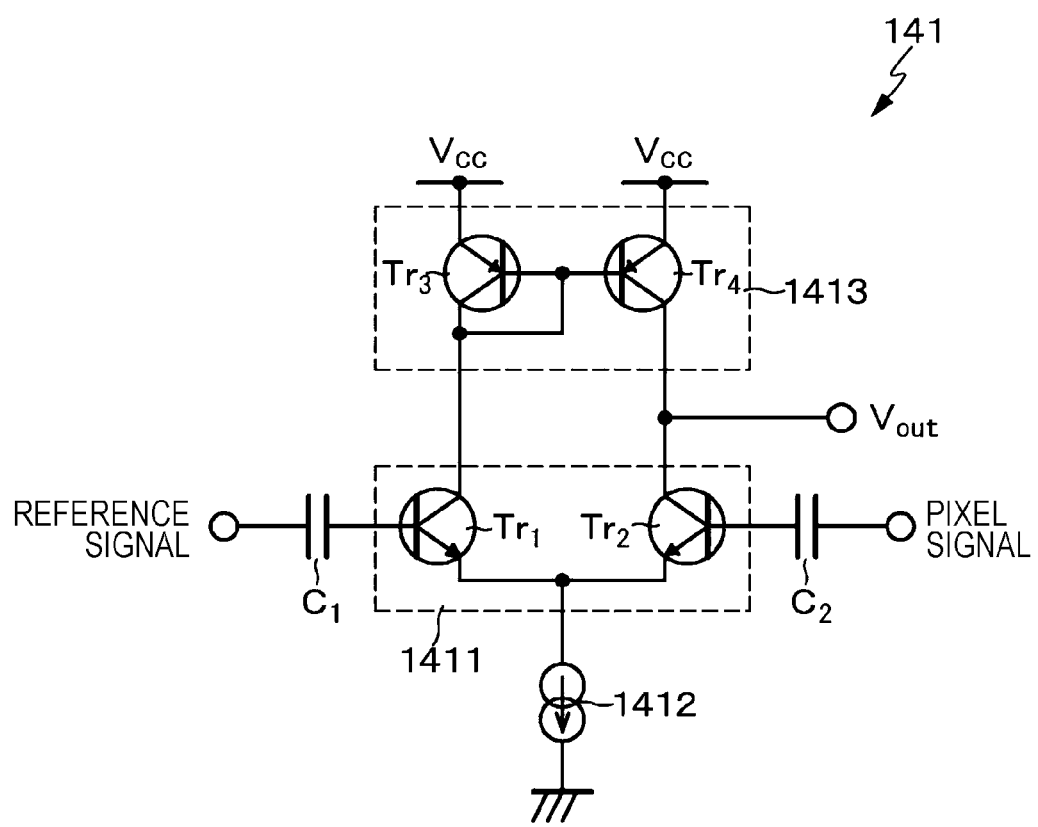
FIG. 22 is a circuit diagram illustrating one example of a circuit configuration of a comparator including a bipolar transistor.

A third embodiment of the present disclosure is an example where a transistor that configures a comparator 141 includes a bipolar transistor. FIG. 22 illustrates one example of a circuit configuration of the comparator 141 including a bipolar transistor.

In the comparator 141 in the present example, a differential input unit 1411 includes, for example, NPN bipolar transistors $Tr_{11}$ and $Tr_{12}$ for which emitter terminals are connected in common. A reference signal is input to a base terminal of the bipolar transistor $Tr_{11}$ via a capacitive element $C_1$, and a pixel signal is input to a base terminal of the bipolar transistor $Tr_{12}$ via a capacitive element $C_2$. A constant current source 1412 is connected between an emitter common connection node of the bipolar transistors $Tr_{11}$ and $Tr_{12}$ and a node of a reference potential (for example, a ground potential).

An active load 1413 includes PNP bipolar transistors $Tr_{13}$ and $Tr_{14}$ that are connected between respective collector terminals of the bipolar transistors $Tr_{11}$ and $Tr_{12}$ and nodes of power supply voltages $V_{cc}$. In the bipolar transistors $Tr_{13}$ and $Tr_{14}$, respective base terminals are connected in common. Furthermore, in the bipolar transistor $Tr_{13}$, the base terminal and a collector terminal are connected in common. Stated another way, the bipolar transistors $Tr_{13}$ and $T_{14}$ configure a current mirror circuit. Then, an output $V_{out}$ is derived from each collector common connection node of the bipolar transistor $Tr_{12}$ and the bipolar transistor $Tr_{14}$.

Specific examples of the third embodiment for suppressing an increase in a circuit area and reducing noise in an analog-to-digital converter 140 including the comparator 141 having the configuration described above are described below as Example 14 to Example 16.

Example 14

Figure 23:
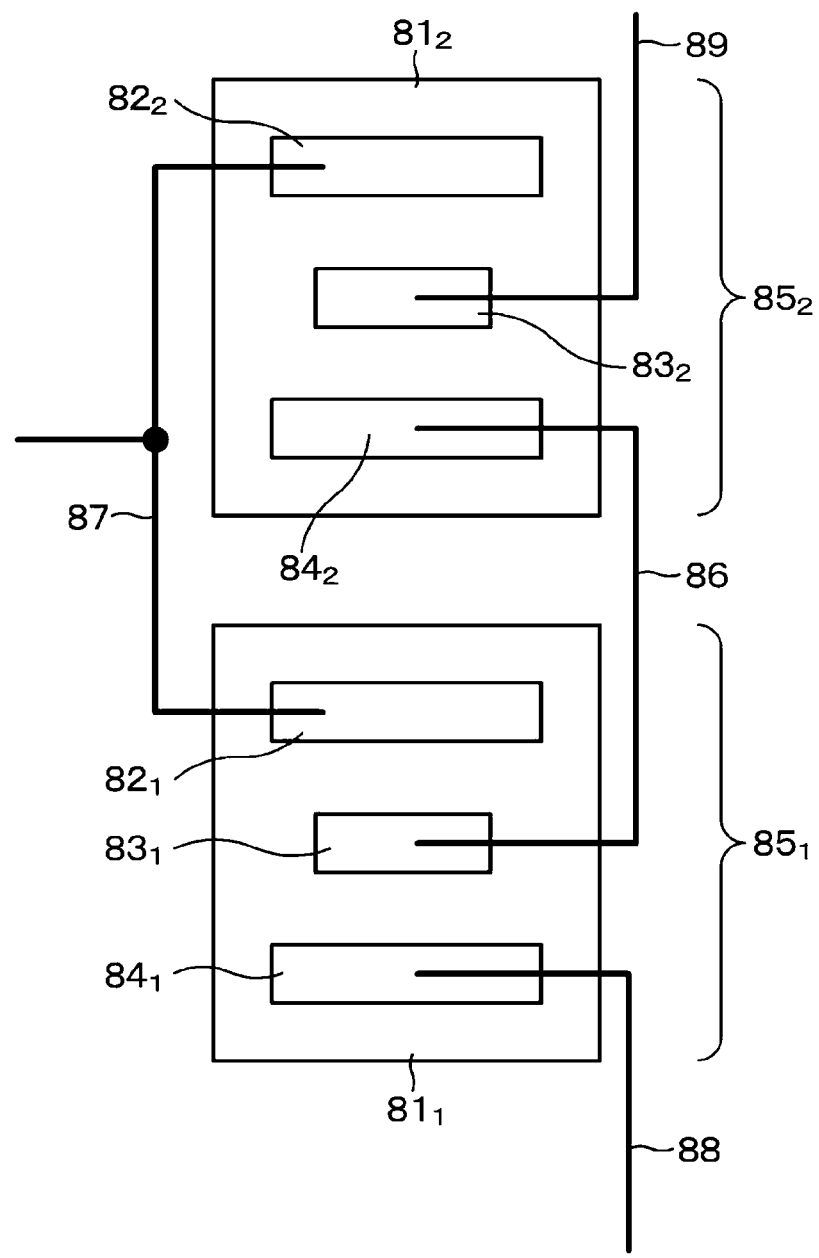
FIG. 23 is a plan view illustrating a layout of a principal part of an active load in Example 14.

Example 14 is an example where active regions are separated from each other and one bipolar transistor is formed in each of the active regions. FIG. 23 illustrates a layout of a principal part of an active load in Example 14.

A bipolar transistor $Tr_{14}$ that configures an active load 1413 in Example 14 includes a plurality (for example, two) of PNP bipolar transistors, and has a structure in which emitter terminals and collector terminals are alternately connected in series and all of the base terminals that control current are commonized.

Specifically, an active region separates into two active regions, and in one active region $81_1$, a bipolar transistor $85_1$ that includes a base terminal $82_1$, an emitter terminal $83_1$, and a collector terminal $84_1$ is formed. Furthermore, in the other active region $81_2$, a bipolar transistor $85_2$ that includes a base terminal $82_2$, an emitter terminal $83_2$, and a collector terminal $84_2$ is formed. Stated another way, the bipolar transistor $85_1$ and the bipolar transistor $85_2$ are disposed to be dispersed in the active region 1 and the active region $81_2$ that are different from each other.

Then, in the active regions 1 and $81_2$ different from each other, the emitter terminal $83_1$ of the bipolar transistor $85_1$ and the collector terminal $84_2$ of the bipolar transistor $85_2$ are connected by a wiring line 86, and the base terminals $82_1$ and $82_2$ that control current are electrically connected in common by a wiring line 87, and are commonized. Furthermore, the collector terminal $84_1$ of the bipolar transistor $85_1$ is connected to a collector wiring line 88, and the emitter terminal $83_2$ of the bipolar transistor $85_2$ is connected to an emitter wiring line 89.

Example 15

Figure 24:
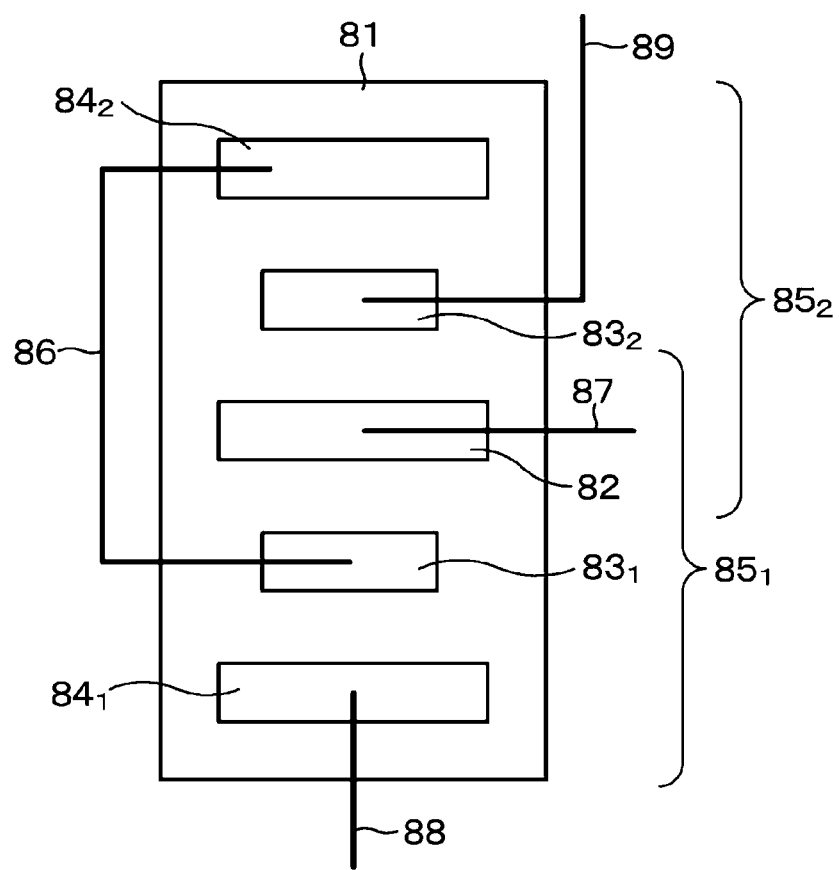
FIG. 24 is a plan view illustrating a layout of a principal part of an active load in Example 15.

Example 15 is an example where a plurality of bipolar transistors is formed in one active region. FIG. 24 illustrates a layout of a principal part of an active load in Example 15.

A bipolar transistor $Tr_{14}$ that configures an active load 1413 in Example 15 has a structure in which two bipolar transistors having a common base terminal are disposed in one active region and an emitter terminal and a collector terminal of the two bipolar transistors are connected in series. Specifically, two bipolar transistors $85_1$ and $85_2$ are disposed in one active region 81, and base terminals of these bipolar transistors $85_1$ and $85_2$ are a common base terminal 82. Then, an emitter terminal $83_1$ of the bipolar transistor $85_1$ and a collector terminal $84_2$ of the bipolar transistor $85_2$ are connected by a wiring line 86.

In the bipolar transistor $Tr_{14}$ that configures the active load 1413 in Example 15, the base terminal 82 is commonized between the bipolar transistors $85_1$ and $85_2$. Therefore, the entire transistor area can be reduced in comparison with the case of simple serial connection, as in Example 14.

Example 16

Figure 25:
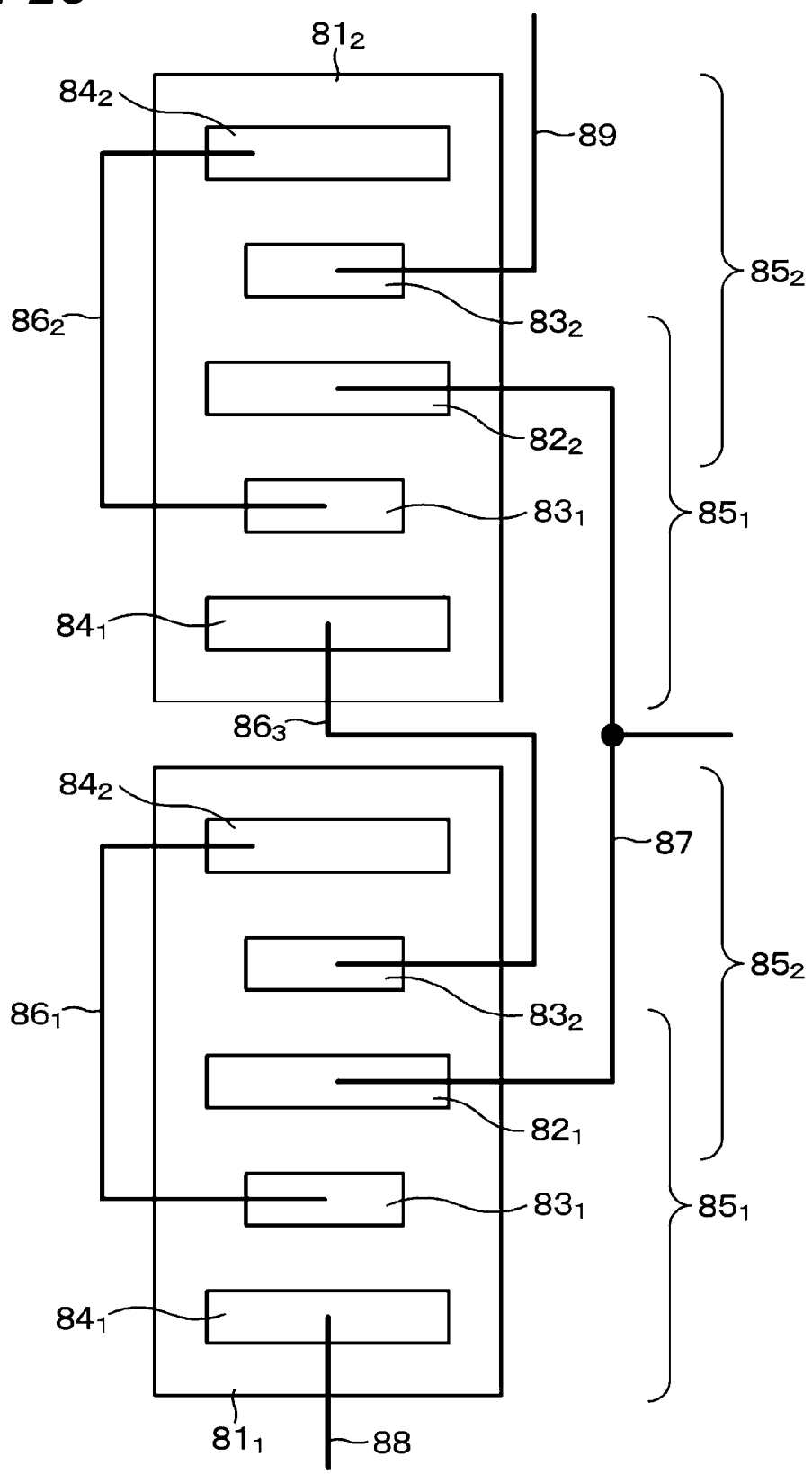
FIG. 25 is a plan view illustrating a layout of a principal part of an active load in Example 15.

Example 16 is a variation of Example 15. FIG. 25 illustrates a layout of a principal part of an active load in Example 16.

A bipolar transistor $Tr_{14}$ that configures an active load 1413 in Example 16 has a structure in which a plurality (for example, two) of bipolar transistors $Tr_{14}$ that each configure the active load 1413 in Example 15 is connected in series and all of the base terminals are commonized. Specifically, for example, two bipolar $85_1$ and $85_2$ are formed in each of the two active regions $81_1$ and $81_2$, common base terminals $82_1$ and $82_2$ of both bipolar transistors $85_1$ and $85_2$ are connected in common by a wiring line 87.

Then, in each of the two active regions $81_1$ and $81_2$, an emitter terminal $83_1$ of the bipolar transistor $85_1$ and a collector terminal $84_2$ of the bipolar transistor $85_2$ are connected by a wiring line $86_1$ or $_2$. Furthermore, in the active regions $81_1$ and $81_2$, an emitter terminal $83_2$ of the bipolar transistor $85_2$ on a side of the active region $81_1$ and a collector terminal $84_1$ of the bipolar transistor $85_1$ on a side of the active region $81_2$ are connected by a wiring line 863.

By employing the bipolar transistor $Tr_{14}$ that configures the active load 1413 in Example 16, a layout of common centroidal arrangement can be employed similarly to the cases of Example 2 to Example 5 described above. By employing the layout of common centroidal arrangement, operation and effects that are similar to operation and effects in the cases of Example 2 to Example 5 can be obtained.

EXAMPLES OF APPLICATION OF COMPARATOR

A case where the comparator 141 that includes the active load 1413 in each of the examples described above is used as a comparator that configures the single slope type analog-to-digital converter 140 in the CMOS image sensor 1, i.e., the case of application to a solid-state imaging element, has been described above as an example. However, this application example is not restrictive. Other application examples of the comparator of the present disclosure are described below as examples. Hereinafter, the comparator 141 is symbolized and illustrated.

Application Example 1

Figure 26A:
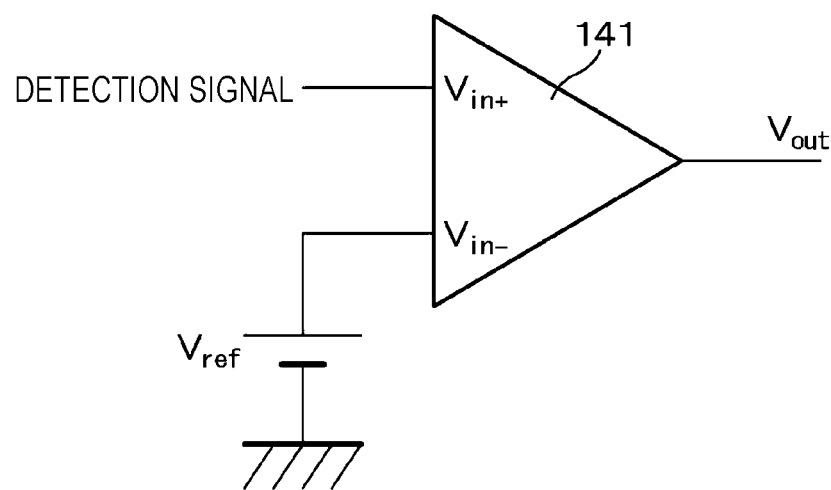
FIG. 26A is a circuit diagram illustrating a circuit example of an analog switch in Application Example 1.
Figure 26B:
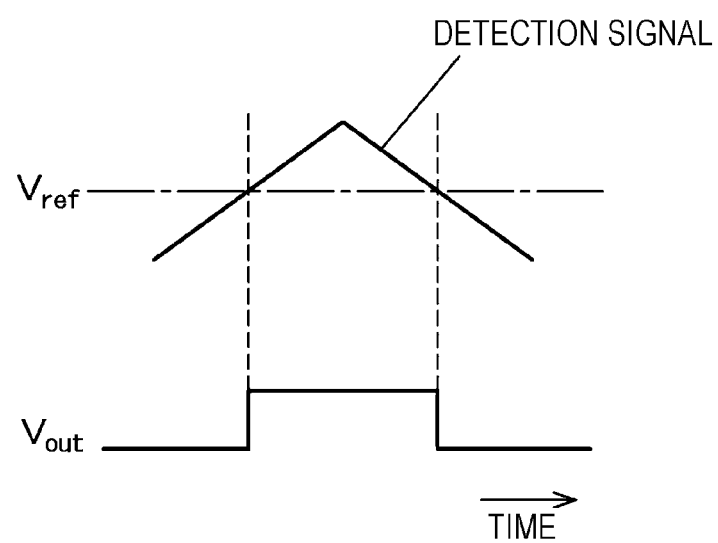
FIG. 26B is a waveform diagram illustrating the waveforms of a detection signal and an output signal of the analog switch.

Another application example is an analog switch that is used, for example, in a variety of sensor circuits of light, temperature, smell, and the like. Application Example 1 is an example of application to an analog switch that is used, for example, in a photodetector. FIG. 26A illustrates a circuit example of an analog switch in Application Example 1, and FIG. 26B illustrates waveforms of a detection signal and an output signal of the analog switch.

The photodetector compares a detection signal detected by using a photodiode (not illustrated) with a reference voltage $V_{ref}$, and determines the presence or absence of the detection of light by an output signal $V_{out}$ responding to a comparison result. The technology of the present disclosure can be applied to a comparator 141 that it is requested to have a high SN ratio due to a feeble detection signal in a variety of sensor circuits such as a photodetector.

Application Example 2

Figure 27A:
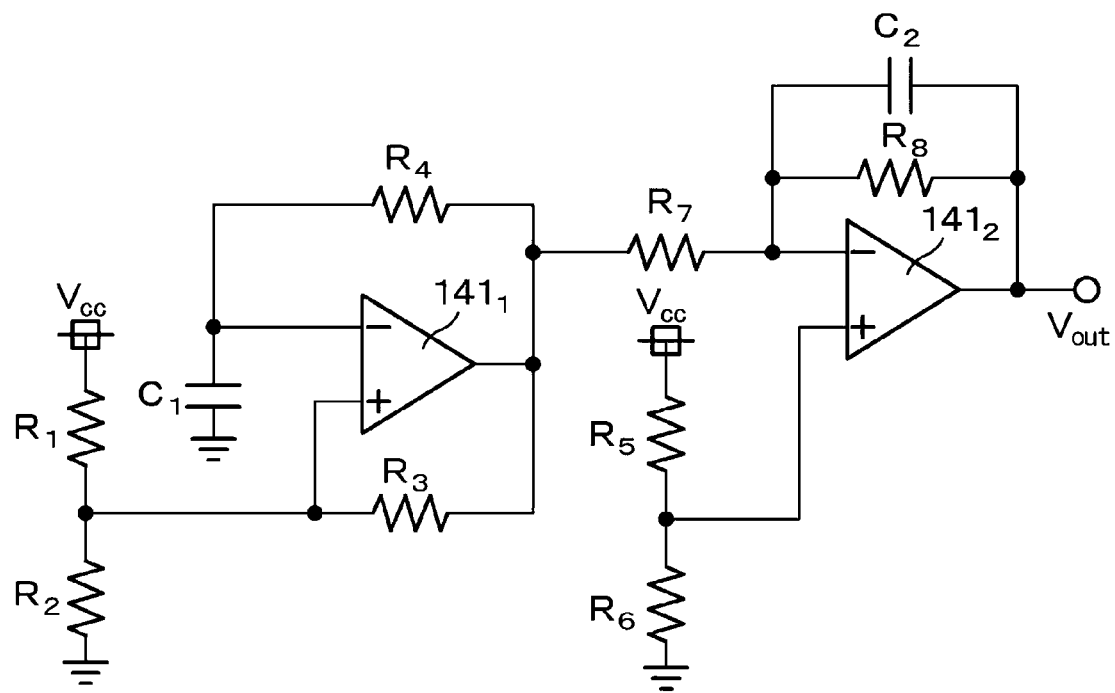
FIG. 27A is a circuit diagram illustrating a circuit example of a triangular wave generation circuit in Application Example 2.
Figure 27B:
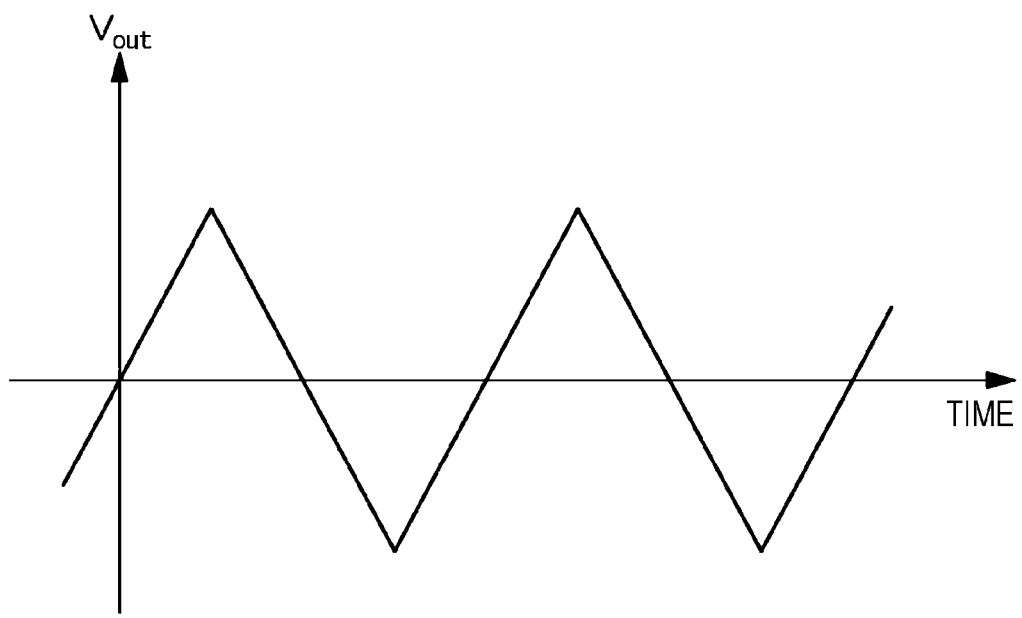
FIG. 27B is a waveform diagram illustrating an output waveform of the triangular wave generation circuit.

Application Example 2 is an example of application to a triangular wave generation circuit that is needed in a case where an electric motor or the like is controlled according to a pulse width modulation (PWM) scheme. FIG. 27A illustrates a circuit example of a triangular wave generation circuit in Application Example 2, and FIG. 27B illustrates an output waveform of the triangular wave generation circuit.

The triangular wave generation circuit in Application Example 2 has a well-known circuit configuration including two comparators $141_1$ and $141_2$, eight resistive elements $R_1$ to $R_2$, and two capacitive elements $C_1$ and $C_2$. The technology of the present disclosure can be applied to the comparators $141_1$ and $141_2$ that configure this triangular wave generation circuit.

Application Example 3

Figure 28:
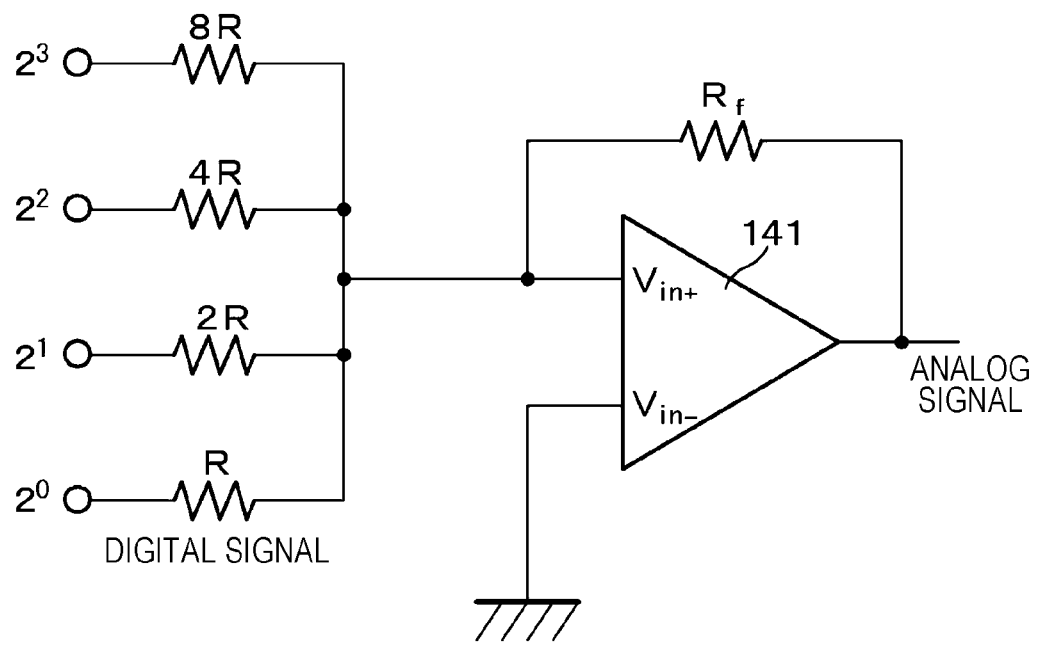
FIG. 28 is a circuit diagram illustrating a circuit example of a digital-to-analog converter in Application Example 3.

Application Example 3 is an example of application to a digital-to-analog converter. FIG. 28 illustrates a circuit example of a digital-to-analog converter in Application Example 3.

The digital-to-analog converter in Application Example 3 is what is called a weight resistance type D/A converter. Specifically, the digital-to-analog converter in Application Example 3 has a well-known circuit configuration in which an addition circuit including a comparator 141 and a resistive element is used to generate a weight of output voltage in proportion to each bit of a digital signal by using the proportion of a resistance value of the resistive element and to perform conversion into an analog signal. The technology of the present disclosure can be applied to the comparator 141 that configures this digital-to-analog converter.

The respective application examples described here are examples. In addition, comparators are currently used in a variety of electronic devices, such as various measuring instruments, AV devices, or consumer electronics, that have been distributed in the world. Experts could easily determine that the technology of the present disclosure can be applied to these comparators.

<Variations>

In the embodiments described above, description has been provided by using, as an example, the case of application to a CMOS image sensor in which unit pixels 2 are arranged in a matrix shape. However, the technology of the present disclosure is not limited to application to the CMOS image sensor. Stated another way, the technology of the present disclosure can be applied to solid-state imaging elements in general of an X-Y address scheme in which the unit pixels 2 are two-dimensionally arranged in a matrix shape.

Furthermore, the technology of the present disclosure is not limited to application to a solid-state imaging element that senses the distribution of an amount of incident light of visible light and captures an image, and can be applied to solid-state imaging elements in general that capture an image of the distribution of an incident amount of infrared rays, X-rays, particles, or the like.

UTILIZATION EXAMPLES

Figure 29:
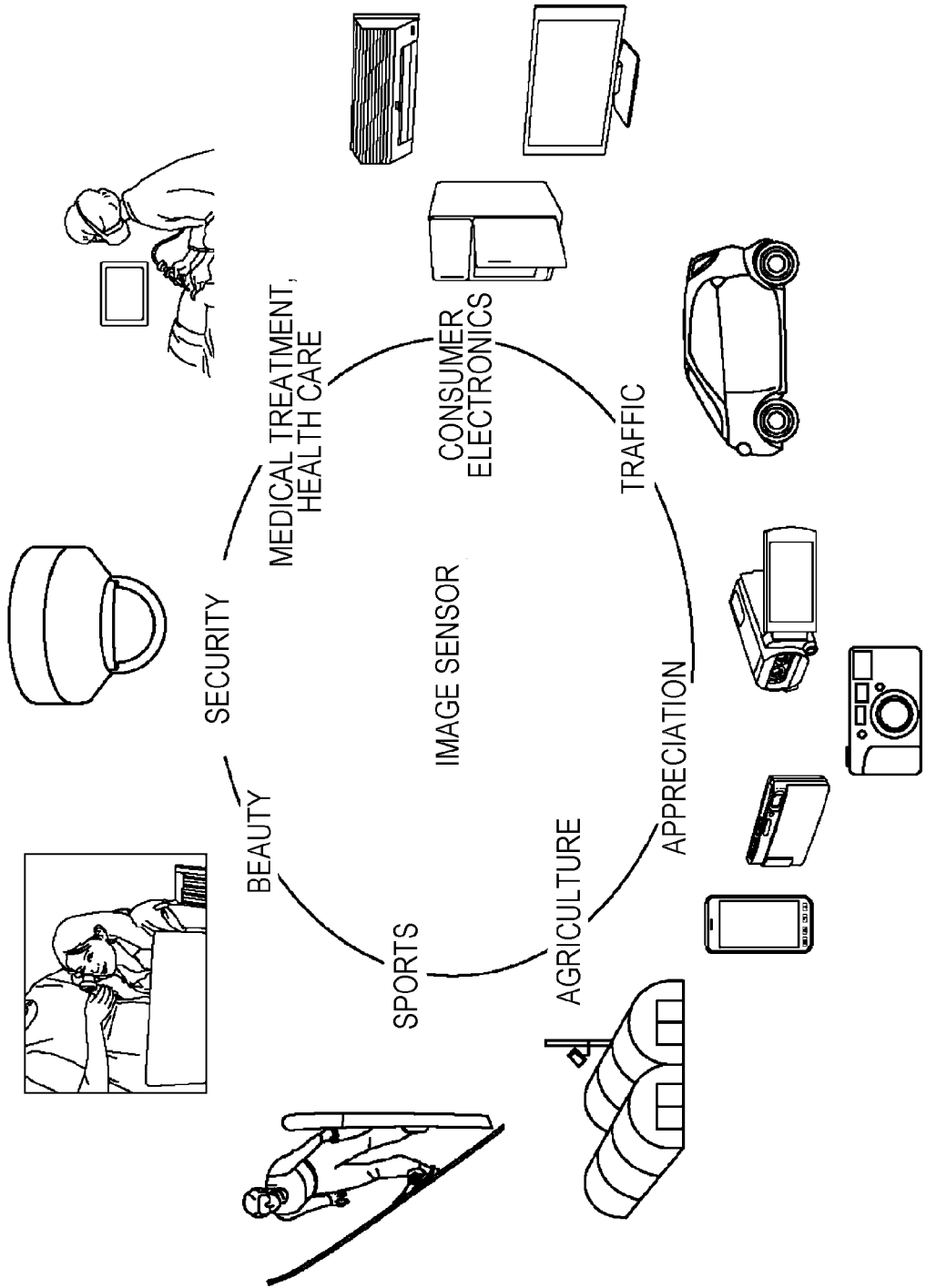
FIG. 29 is a diagram illustrating an application example of a technology according to the present disclosure.

The CMOS image sensors 1 according to the present embodiments described above can be used in a variety of devices that sense light such as visible light, infrared light, ultraviolet light, or X-rays, as illustrated, for example, in FIG. 29. Specific examples of the variety of devices are listed below.

Devices provided for appreciation that capture images, such as digital cameras or portable devices having a camera function Devices provided for traffic, such as on-vehicle sensors that image a front side, a rear side, the periphery, an inside, or the like of an automobile for the purpose of safe driving such as automatic stop, the recognition of the state of a driver, or the like, monitoring cameras that monitor traveling vehicles or roads, or ranging sensors that measure a distance between vehicles or the like Devices provided in consumer electronics, such as TVs, refrigerators, or air conditioners, in order to image a user's gesture and operate a device in accordance with the gesture Devices provided for medical treatment or health care, such as endoscopes or devices that perform angiography by receiving infrared light Devices provided for security, such as monitoring cameras for crime prevention or cameras for personal authentication Devices provided for beauty, such as skin measuring devices that image skin or microscopes that image a scalp Devices provided for sports, such as action cameras or wearable cameras for sport usage or the like Devices provided for agriculture, such as cameras that monitor the state of fields or crops <Examples of Application of Technology According to the Present Disclosure>

The technology according to the present disclosure can be applied to a variety of products. More specific application examples are described below.

[Electronic Device of the Present Disclosure]

Here, the case of application to an electronic device, e.g., imaging devices such as digital still cameras or video cameras, portable terminal devices that have an imaging function, such as portable telephones, copying machines that use a solid-state imaging element in an image reader, and the like, is described.

(Imaging Device)

Figure 30:
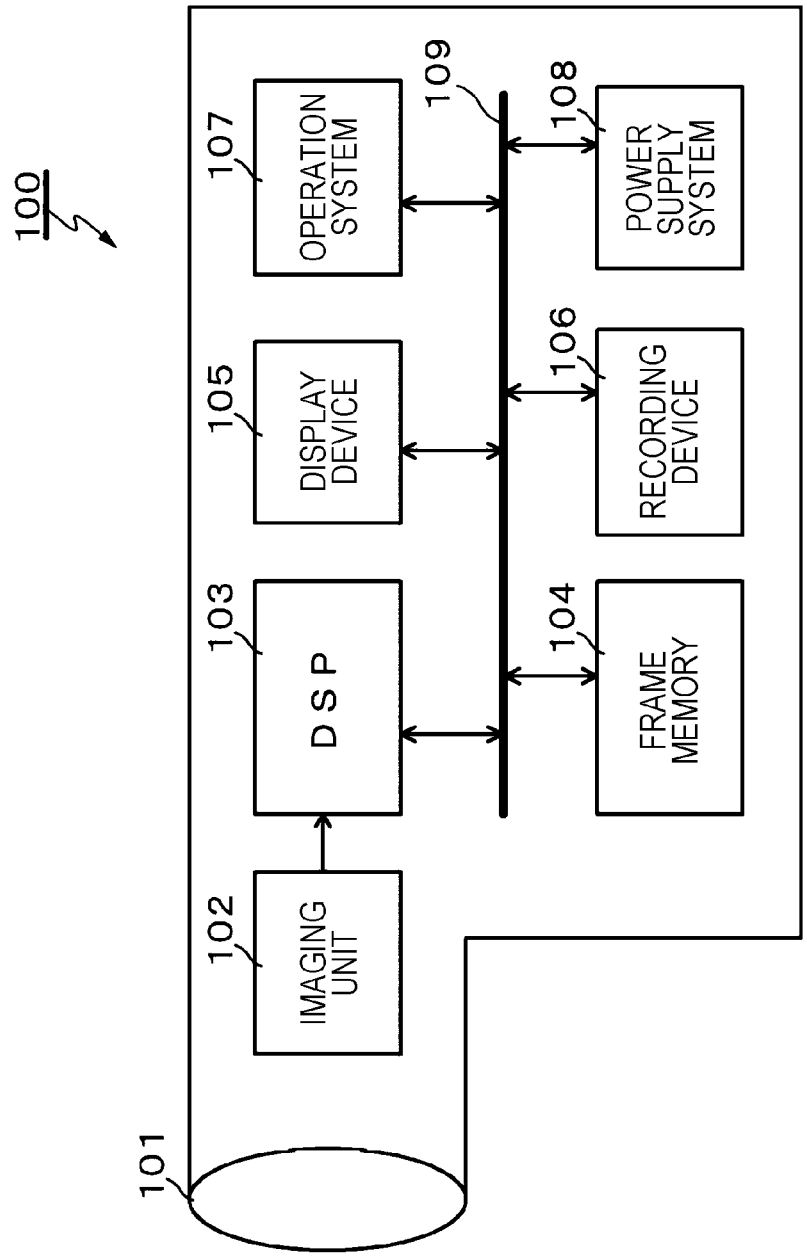
FIG. 30 is a block diagram illustrating a configuration of an imaging device that is one example of an electronic device of the present disclosure.

FIG. 30 is a block diagram illustrating a configuration of an imaging device that is one example of an electronic device of the present disclosure. As illustrated in FIG. 13, an imaging device 100 in the present example includes an imaging optical system 101 including a lens group or the like, an imaging unit 102, a DSP circuit 103, a frame memory 104, a display device 105, a recording device 106, an operation system 107, a power supply system 108, and the like. Then, a configuration is employed in which the DSP circuit 103, the frame memory 104, the display device 105, the recording device 106, the operation system 107, and the power supply system 108 are connected to each other via a bus line 109.

The imaging optical system 101 takes in incident light (image light) from a subject, and forms an image on an imaging plane of the imaging unit 102. The imaging unit 102 converts an amount of incident light for which an image has been formed on the imaging plane by the optical system 101 into an electrical signal for each pixel, and outputs the electrical signal as a pixel signal. The DSP circuit 103 performs general camera signal processing such as white balance processing, demosaic processing, or gamma correction processing, for example.

The frame memory 104 is used to appropriately store data in the process of signal processing in the DSP circuit 103. The display device 105 includes a panel type display device such as a liquid crystal display device or an organic electro luminescence (EL) display device, and displays a moving image or a still image that has been captured by the imaging unit 102. The recording device 106 records the moving image or the still image captured by the imaging unit 102 in a recording medium such as a portable semiconductor memory, an optical disk, or a hard disk drive (HDD).

The operation system 107 issues an operation command relating to various functions that the present imaging device 100 has, in accordance with an operation performed by a user. The power supply system 108 appropriately supplies various types of power serving as operation power of the DSP circuit 103, the frame memory 104, the display device 105, the recording device 106, and the operation system 107, to these supply targets.

In the imaging device 100 having the configuration described above, the CMOS image sensor 1 to which the technology according to the present disclosure described above is applied can be used as the imaging unit 102. By employing the CMOS image sensor 1, noise can be reduced. Therefore, a high-quality captured image with reduced noise can be obtained.

[Example of Utilization in Moving Body]

The technology according to the present disclosure can be utilized in a variety of products. For example, the technology according to the present disclosure may be implemented as a solid-state imaging element that is mounted on any type of moving body of vehicles, electric vehicles, hybrid electric vehicles, motorcycles, bicycles, personal mobilities, airplanes, drones, ships, robots, construction machines, agricultural machines (tractors), and the like.

Figure 31:
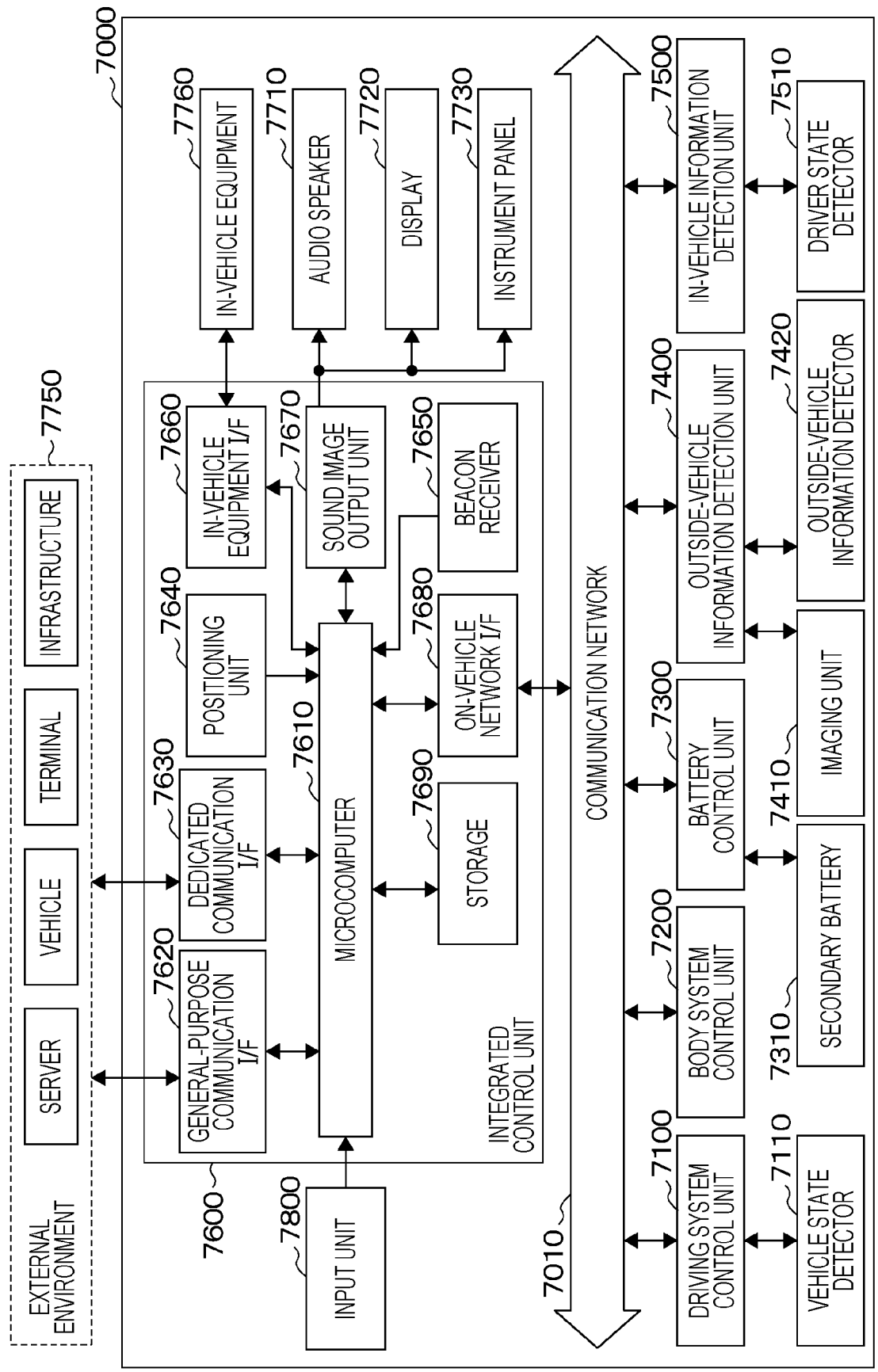
FIG. 31 is a block diagram illustrating a schematic configuration example of a vehicle control system that is one example of a moving body control system to which a technology according to the present disclosure may be applied.

FIG. 31 is a block diagram illustrating a schematic configuration example of a vehicle control system 7000 that is one example of a moving body control system to which the technology according to the present disclosure may be applied. The vehicle control system 7000 includes a plurality of electronic control units that is connected via a communication network 7010. In the example illustrated in FIG. 31, the vehicle control system 7000 includes a driving system control unit 7100, a body system control unit 7200, a battery control unit 7300, an outside-vehicle information detection unit 7400, an in-vehicle information detection unit 7500, and an integrated control unit 7600. The communication network 7010 that connects this plurality of control units may be, for example, an on-vehicle communication network in compliance with an arbitrary standard such as a controller area network (CAN), a local interconnect network (LIN), a local area network (LAN), or FlexRay (registered trademark).

Each of the control units includes a microcomputer that performs arithmetic processing in accordance with various programs, a storage that stores a program that is executed by the microcomputer, a parameter used in various arithmetic operations, or the like, and a driving circuit that drives various devices to be controlled. Each of the control units includes a network I/F that performs communication with another control unit via the communication network 7010, and also includes a communication I/F that performs communication with a device, a sensor, or the like inside or outside a vehicle through wired communication or wireless communication. In FIG. 31, a microcomputer 7610, a general-purpose communication I/F 7620, a dedicated communication I/F 7630, a positioning unit 7640, a beacon receiver 7650, an in-vehicle equipment I/F 7660, a sound or image output unit 7670, an on-vehicle network I/F 7680, and a storage 7690 are illustrated as a functional configuration of the integrated control unit 7600. The other control units similarly include the microcomputer, the communication I/F, the storage, and the like.

The driving system control unit 7100 controls an operation of a device that relates to a driving system of a vehicle in accordance with various programs. For example, the driving system control unit 7100 functions as a control device of a driving force generation device that generates a driving force of a vehicle, such as an internal combustion engine or a driving motor, a driving force transmission mechanism that transmits the driving force to wheels, a steering mechanism that adjusts a steering angle of the vehicle, a braking device that generates a braking force of the vehicle, and the like. The driving system control unit 7100 may have a function of a control device of an antilock brake system (ABS), electronic stability control (ESC), or the like.

A vehicle state detector 7110 is connected to the driving system control unit 7100. The vehicle state detector 7110 includes, for example, at least one of a gyro sensor that detects the angular velocity of a shaft rotary motion of a vehicle body, an acceleration sensor that detects the acceleration of a vehicle, or a sensor that detects an amount of an operation performed on an accelerator pedal, an amount of an operation performed on a brake pedal, a steering angle of a steering wheel, engine speed, the rotational speed of a wheel, or the like. The driving system control unit 7100 performs arithmetic processing using a signal input from the vehicle state detector 7110, and controls the internal combustion engine, the driving motor, an electric power steering device, a brake device, or the like.

The body system control unit 7200 controls the operations of various devices equipped in the vehicle body in accordance with various programs. For example, the body system control unit 7200 functions as a control device of a keyless entry system, a smart key system, a power window device, or various lamps such as a headlamp, a back lamp, a brake lamp, a turn signal, or a fog lamp. In this case, radio waves transmitted from a portable machine that is substituted for a key or signals of various switches may be input to the body system control unit 7200. The body system control unit 7200 receives an input of these radio waves or signals, and controls a door locking device, the power window device, a lamp, or the like of the vehicle.

The battery control unit 7300 controls a secondary battery 7310 serving as a power supply source of the driving motor in accordance with various programs. For example, information relating to battery temperature, a battery output voltage, the residual capacity of a battery, or the like is input to the battery control unit 7300 from a battery device including the secondary battery 7310. The battery control unit 7300 performs arithmetic processing using these signals, and performs temperature regulating control on the secondary battery 7310 or performs control on a cooling device or the like that is included in the battery device.

The outside-vehicle information detection unit 7400 detects information relating to the outside of a vehicle in which the vehicle control system 7000 is mounted. For example, at least one of an imaging unit 7410 or an outside-vehicle information detector 7420 is connected to the outside-vehicle information detection unit 7400. The imaging unit 7410 includes at least one of a time-of-flight (ToF) camera, a stereo camera, a monocular camera, an infrared camera, or another camera. The outside-vehicle information detector 7420 includes, for example, at least one of an environmental sensor that detects current weather or atmospheric phenomena or a surrounding information detection sensor that detects another vehicle, an obstacle, a pedestrian, or the like around the vehicle in which the vehicle control system 7000 is mounted.

The environmental sensor may be, for example, at least one of a raindrop sensor that detects rainy weather, a fog sensor that detects fog, a sunshine sensor that detects a level of sunshine, or a snow sensor that detects snowfall. The surrounding information detection sensor may be at least one of an ultrasonic sensor, a radar device, or a light detection and ranging or laser imaging detection and ranging (LIDAR) device. The imaging unit 7410 and the outside-vehicle information detector 7420 described above may be included as independent sensors or devices, or may be included as a device in which a plurality of sensors or devices has been integrated.

Figure 32:
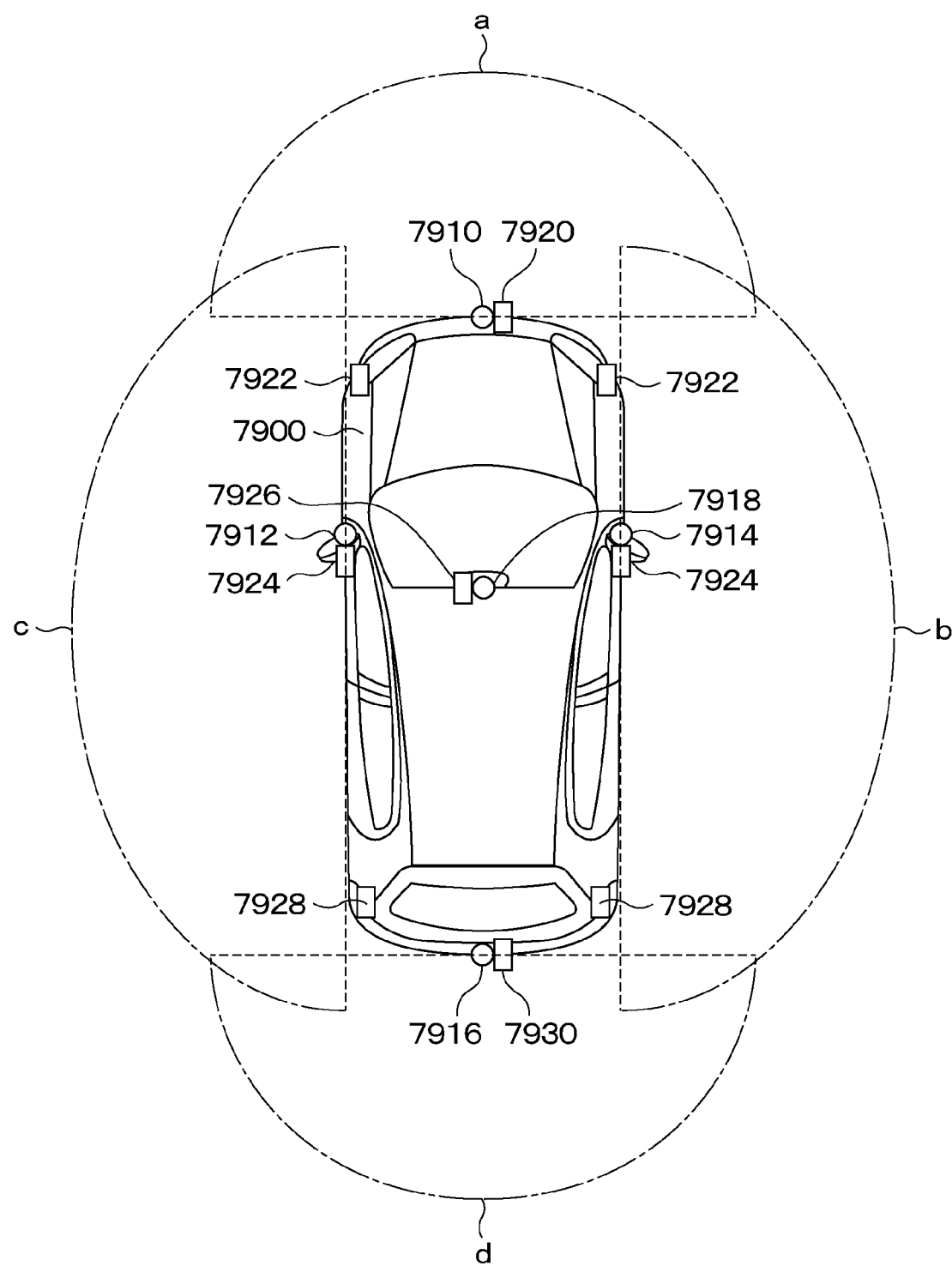
FIG. 32 is a diagram illustrating an example of an installation position of an imaging unit.

Here, FIG. 32 illustrates an example of the installation positions of the imaging unit 7410 and the outside-vehicle information detector 7420. Imaging units 7910, 7912, 7914, 7916, and 7918 are provided, for example, in at least one position of a front nose, a side-view mirror, a rear bumper, a back door, or an upper portion of a windshield in a vehicle cabin of a vehicle 7900. The imaging unit 7910 included in the front nose and the imaging unit 7918 included in the upper portion of the windshield in the vehicle cabin principally obtain an image of a front side of the vehicle 7900. The imaging units 7912 and 7914 included in the side-view mirrors principally obtain images of sides of the vehicle 7900. The imaging unit 7916 included in the rear bumper or the back door principally obtains an image of a rear side of the vehicle 7900. The imaging unit 7918 included in the upper portion of the windshield in the vehicle cabin is principally used to detect a preceding vehicle, a pedestrian, an obstacle, a traffic light, a traffic sign, a traffic lane, or the like.

Note that FIG. 32 illustrates an example of an imaging range of each of the imaging units 7910, 7912, 7914, and 7916. An imaging range a indicates an imaging range of the imaging unit 7910 provided in the front nose, imaging ranges b and c respectively indicate imaging ranges of the imaging units 7912 and 7914 provided in the side-view mirrors, and an imaging range d indicates an imaging range of the imaging unit 7916 provided in the rear bumper or the back door. For example, an overhead image in which the vehicle 7900 is viewed from the above is obtained by superimposing pieces of image data that have been captured by the imaging units 7910, 7912, 7914, and 7916 onto each other.

Outside-vehicle information detectors 7920, 7922, 7924, 7926, 7928, and 7930 that are provided in a front portion, a rear portion, sides, corners, and the upper portion of the windshield in a vehicle cabin of the vehicle 7900 may be, for example, ultrasonic sensors or radar devices. The outside-vehicle information detectors 7920, 7926, and 7930 that are provided in the front nose, the rear bumper, the back door, and the upper portion of the windshield in the vehicle cabin of the vehicle 7900 may be, for example, LIDAR devices. These outside-vehicle information detectors 7920 to 7930 are principally used to detect a preceding vehicle, a pedestrian, an obstacle, or the like.

Return to the description of FIG. 31. The outside-vehicle information detection unit 7400 causes the imaging unit 7410 to capture an image of the outside of the vehicle, and receives captured image data. Furthermore, the outside-vehicle information detection unit 7400 receives detection information from the connected outside-vehicle information detector 7420. In a case where the outside-vehicle information detector 7420 is an ultrasonic sensor, a radar device, or a LIDAR device, the outside-vehicle information detection unit 7400 causes ultrasonic waves, electromagnetic waves, or the like to be transmitted, and receives information relating to received reflected waves. The outside-vehicle information detection unit 7400 may perform object detection processing or distance detection processing on a person, a car, an obstacle, a traffic sign, characters on a road surface, or the like on the basis of the received information. The outside-vehicle information detection unit 7400 may perform environment recognition processing for recognizing rainfall, fog, a road surface condition, or the like on the basis of the received information. The outside-vehicle information detection unit 7400 may calculate a distance to an object outside the vehicle on the basis of the received information.

Furthermore, the outside-vehicle information detection unit 7400 may perform image recognition processing or distance detection processing for recognizing a person, a car, an obstacle, a traffic sign, characters on a road surface, or the like on the basis of the received image data. The outside-vehicle information detection unit 7400 may perform processing such as distortion correction or alignment on the received image data and may combine pieces of image data captured by the imaging units 7410 different from each other to generate an overhead image or a panoramic image. The outside-vehicle information detection unit 7400 may perform viewpoint conversion processing using the image data captured by the imaging units 7410 different from each other.

The in-vehicle information detection unit 7500 detects in-vehicle information. For example, a driver state detector 7510 that detects a state of a driver is connected to the in-vehicle information detection unit 7500. The driver state detector 7510 may include a camera that captures an image of the driver, a biosensor that detects biological information relating to the driver, a microphone that collects sound in the vehicle cabin, or the like. The biosensor is provided, for example, on a seat surface, a steering wheel, or the like, and detects biological information relating to a passenger who is seated on a seat or a driver who is holding the steering wheel. The in-vehicle information detection unit 7500 may calculate a fatigue degree or a concentration degree of the driver or may determine whether or not the driver is dozing on the basis of detection information input from the driver state detector 7510. The in-vehicle information detection unit 7500 may perform processing, such as noise canceling processing, on a collected sound signal.

The integrated control unit 7600 controls the entire operation inside the vehicle control system 7000 in accordance with various programs. An input unit 7800 is connected to the integrated control unit 7600. The input unit 7800 is implemented, for example, by a device, such as a touch panel, a button, a microphone, a switch, or a lever, on which the passenger may perform an input operation. Data obtained by performing sound recognition on sound that has been input from the microphone may be input to the integrated control unit 7600. The input unit 7800 may be, for example, a remote controller that uses infrared rays or other radio waves, or external connection equipment, such as a portable telephone or a personal digital assistant (PDA), that corresponds to an operation performed on the vehicle control system 7000. The input unit 7800 may be, for example, a camera, and in this case, the passenger can input information by using a gesture. Alternatively, data obtained by detecting a movement of a wearable device attached to the passenger may be input. Moreover, the input unit 7800 may include, for example, an input control circuit or the like that generates an input signal on the basis of the information described above that has been input by the passenger or the like by using the input unit 7800 and outputs the input signal to the integrated control unit 7600. The passenger or the like operates this input unit 7800 to input various types of data to the vehicle control system 7000 or issue, to the vehicle control system 7000, an instruction relating to a processing operation.

The storage 7690 may include a read only memory (ROM) that stores various programs executed by the microcomputer and a random access memory (RAM) that stores various parameters, arithmetic results, sensor values, or the like. Furthermore, the storage 7690 may be implemented by a magnetic storage device such as a hard disc drive (HDD), a semiconductor storage device, an optical storage device, a magneto-optical storage device, or the like.

The general-purpose communication I/F 7620 is a general-purpose communication I/F that mediates communication with various pieces of equipment that are present in an external environment 7750. The general-purpose communication I/F 7620 may implement a cellular communication protocol such as global system of mobile communications (GSM (registered trademark)), WiMAX, long term evolution (LTE), or LTE-advanced (LTE-A), or another wireless communication protocol such as a wireless LAN (also referred to as Wi-Fi (registered trademark)) or Bluetooth (registered trademark). The general-purpose communication I/F 7620 may perform connection to equipment (for example, an application server or a control server) that is present on an external network (for example, the Internet, a cloud network, or a company-specific network), for example, via a base station or an access point. Furthermore, the general-purpose communication I/F 7620 may perform connection to a terminal that is present near the vehicle (for example, a terminal of the driver, a pedestrian, or a store, or a machine type communication (MTC) terminal) by using, for example, a peer to peer (P2P) technology.

The dedicated communication I/F 7630 is a communication I/F that supports a communication protocol formulated for the purpose of use in a vehicle. For example, the dedicated communication I/F 7630 may implement a standard protocol such as wireless access in vehicle environment (WAVE) that is a combination of IEEE 802.11p of a lower-order layer and IEEE 1609 of an upper-order layer, dedicated short range communications (DSRC), or a cellular communication protocol. The dedicated communication I/F 7630 typically performs V2X communication that is a concept including one or more of vehicle to vehicle communication, vehicle to infrastructure communication, vehicle to home communication, and vehicle to pedestrian communication.

The positioning unit 7640 receives, for example, a global navigation satellite system (GNSS) signal from a GNSS satellite (for example, a global positioning system (GPS) signal from a GPS satellite), performs positioning, and generates position information including the latitude, longitude, and altitude of a vehicle. Note that the positioning unit 7640 may specify a current position by exchanging signals with a wireless access point, or may obtain the position information from a terminal, such as a portable telephone, a PHS, or a smartphone, that has a positioning function.

The beacon receiver 7650 receives radio waves or electromagnetic waves that have been transmitted from, for example, a wireless station that is provided on a road, or the like, and obtains information relating to a current position, a traffic jam, road closure, a required time, or the like. Note that a function of the beacon receiver 7650 may be included in the dedicated communication I/F 7630 described above.

The in-vehicle equipment I/F 7660 is a communication interface that mediates connection between the microcomputer 7610 and various pieces of in-vehicle equipment 7760 that are present in a vehicle. The in-vehicle equipment I/F 7660 may establish wireless connection by using a wireless communication protocol such as a wireless LAN, Bluetooth (registered trademark), near field communication (NFC), or wireless USB (WUSB). Furthermore, the in-vehicle equipment I/F 7660 may establish wired connection such as a universal serial bus (USB), a high-definition multimedia interface (HDMI (registered trademark)), or a mobile high-definition link (MHL) via a not-illustrated connection terminal (and a cable if necessary). The in-vehicle equipment 7760 may include, for example, at least one of mobile equipment or wearable equipment that the passenger has or information equipment that is carried in or attached to the vehicle. Furthermore, the in-vehicle equipment 7760 may include a navigation device that searches for a route to an arbitrary destination. The in-vehicle equipment I/F 7660 exchanges control signals or data signals with these pieces of in-vehicle equipment 7760.

The on-vehicle network I/F 7680 is an interface that mediates communication between the microcomputer 7610 and the communication network 7010. The on-vehicle network I/F 7680 transmits and receives a signal or the like in accordance with a prescribed protocol supported by the communication network 7010.

The microcomputer 7610 of the integrated control unit 7600 controls the vehicle control system 7000 in accordance with various programs on the basis of information that has been obtained via at least one of the general-purpose communication I/F 7620, the dedicated communication I/F 7630, the positioning unit 7640, the beacon receiver 7650, the in-vehicle equipment I/F 7660, or the on-vehicle network I/F 7680. For example, the microcomputer 7610 may calculate a control target value of the driving force generator, the steering mechanism, or the braking device on the basis of obtained in-vehicle or outside-vehicle information, and may output a control command to the driving system control unit 7100. For example, the microcomputer 7610 may perform cooperative control aiming at implementing a function of an advanced driver assistance system (ADAS) including vehicle collision avoidance or impact mitigation, following traveling based on a distance between vehicles, vehicle speed maintaining traveling, vehicle collision warning, vehicle lane departure warning, or the like. Furthermore, the microcomputer 7610 may cooperative control aiming at automatic driving or the like for autonomously traveling independently of a driver's operation by controlling the driving force generator, the steering mechanism, the braking device, or the like on the basis of obtained information relating to the periphery of the vehicle.

The microcomputer 7610 may generate three-dimensional distance information between the vehicle and a peripheral object such as a structure or a person on the basis of information obtained via at least one of the general-purpose communication I/F 7620, the dedicated communication I/F 7630, the positioning unit 7640, the beacon receiver 7650, the in-vehicle equipment I/F 7660, or the on-vehicle network I/F 7680, and may generate local map information including peripheral information of a current position of the vehicle. Furthermore, the microcomputer 7610 may predict danger such as vehicle collision, the approach of a pedestrian or the like, or entry to a closed road on the basis of the obtained information, and may generate a warning signal. The warning signal may be, for example, a signal that causes warning sound to be emitted or causes a warning lamp to glow.

The sound or image output unit 7670 transmits an output signal of at least one of sound or an image to an output device that can visually or aurally report information to a passenger of a vehicle or the outside of the vehicle. In the example of FIG. 31, an audio speaker 7710, a display 7720, and an instrument panel 7730 are illustrated as the output device. The display 7720 may include, for example, at least one of an on-board display or a head-up display. The display 7720 may have an augmented reality (AR) display function. The output device may be a device other than the devices described above, e.g. a headphone, a wearable device such as an eyeglasses type display that is attached to a passenger, a projector, a lamp, or the like. In a case where the output device is a display device, the display device visually displays a result obtained in various types of processing performed by the microcomputer 7610 or information received from another control unit in various forms such as text, an image, a table, or a graph. Furthermore, in a case where the output device is a sound output device, the sound output device converts a reproduced audio signal including sound data, acoustic data, or the like into an analog signal, and aurally outputs the analog signal.

Note that, in the example illustrated in FIG. 31, at least two control units that are connected via the communication network 7010 may be integrated as a single control unit. Alternatively, an individual control unit may include a plurality of control units. Moreover, the vehicle control system 7000 may include another not-illustrated control unit. Furthermore, in the description above, another control unit may have some or all of the functions of any control unit. That is, prescribed arithmetic processing may be performed by any control unit if information is to be transmitted or received via the communication network 7010. Similarly, a sensor or a device that is connected to any control unit may be connected to another control unit, and a plurality of control units may mutually transmit or receive detection information via the communication network 7010.

An example of a vehicle control system to which the technology according to the present disclosure may be applied has been described above. The technology according to the present disclosure may be applied to, for example, the imaging units 7910, 7912, 7914, 7916, and 7918 or the outside-vehicle information detectors 7920, 7922, 7924, 7926, 7928, and 7930 in the configuration described above. Then, by applying the technology according to the present disclosure to the imaging units 7910, 7912, 7914, 7916, and 7918 or the outside-vehicle information detector 7920, 7922, 7924, 7926, 7928, and 7930, a high-quality captured image with reduced noise can be obtained due to a reduction in noise of a solid-state imaging element. Therefore, for example, a vehicle control system that can detect a target to be imaged with high precision can be constructed.

<Configuration that the Present Disclosure can Employ>

The present disclosure can also employ the configuration described below.

<<A. Solid-State Imaging Element>>

[A-1] A solid-state imaging element including:

a pixel array in which a plurality of unit pixels is arranged in a matrix shape, the plurality of unit pixels each including a photoelectric conversion unit; and an analog-to-digital conversion unit that converts an analog pixel signal into a digital signal, the analog pixel signal being output from each of the plurality of unit pixels of the pixel array, in which the analog-to-digital conversion unit includes a comparator that includes a differential input unit and an active load of the differential input unit, the differential input unit using, as an input, a prescribed reference signal and the analog pixel signal, at least one transistor that configures the active load includes a plurality of control terminals that controls current, and the plurality of control terminals is electrically connected in common.

[A-2] The solid-state imaging element described in [A-1] described above, in which the at least one transistor that configures the active load includes a plurality of field effect transistors that includes the plurality of control terminals.

[A-3] The solid-state imaging element described in [A-2] described above, in which, in the plurality of field effect transistors, drain regions and source regions are alternately connected in series, and all gate terminals are commonized.

[A-4] The solid-state imaging element described in [A-3] described above, in which the plurality of field effect transistors is disposed in an identical active region.

[A-5] The solid-state imaging element described in [A-4] described above, in which the plurality of field effect transistors is connected in series via an active region.

[A-6] The solid-state imaging element described in [A-3] described above, in which the plurality of field effect transistors is dispersedly disposed in active regions different from each other, and the active regions different from each other are connected by a wiring line.

[A-7] The solid-state imaging element described in any of [A-3] described above to [A-5] described above, in which a dummy gate terminal is disposed in an active region in which the field effect transistor is not formed.

[A-8] The solid-state imaging element described in [A-1] described above, in which the at least one transistor that configures the active load includes a plurality of bipolar transistors that includes the plurality of control terminals.

[A-9] The solid-state imaging element described in [A-8] described above, in which, in the plurality of bipolar transistors, emitter regions and collector regions are alternately connected in series, and all base terminals are commonized.

[A-10] The solid-state imaging element described in [A-9] described above, in which the plurality of bipolar transistors is dispersedly disposed in active regions different from each other, and is connected in series by a wiring line.

[A-11] The solid-state imaging element described in [A-10] described above, in which the plurality of bipolar transistors is connected in series by the wiring line, across the active regions different from each other.

[A-12] The solid-state imaging element described in [A-9] described above, in which the plurality of bipolar transistors is disposed in an identical active region, and a base terminal is commonized among the plurality of bipolar transistors.

[A-13] The solid-state imaging element described in [A-1] described above, in which the at least one transistor that configures the active load includes a Fin-FET.

<<B. Comparator>>

[B-1] A comparator including:

a differential input unit that uses, as an input, a prescribed reference signal and an analog pixel signal; and an active load of the differential input unit, in which at least one transistor that configures the active load includes a plurality of control terminals that controls current, and the plurality of control terminals is electrically connected in common.

[B-2] The comparator described in [B-1] described above, in which the at least one transistor that configures the active load includes a plurality of field effect transistors that includes the plurality of control terminals.

[B-3] The comparator described in [B-2] described above, in which, in the plurality of field effect transistors, drain regions and source regions are alternately connected in series, and all gate terminals are commonized.

[B-4] The comparator described in [B-3] described above, in which the plurality of field effect transistors is disposed in an identical active region.

[B-5] The comparator described in [B-4] described above, in which the plurality of field effect transistors is connected in series via an active region.

[B-6] The comparator described in [B-3] described above, in which the plurality of field effect transistors is dispersedly disposed in active regions different from each other, and the active regions different from each other are connected by a wiring line.

[B-7] The comparator described in any of [B-3] described above to [B-5] described above, in which a dummy gate terminal is disposed in an active region in which the field effect transistor is not formed.

[B-8] The comparator described in [B-1] described above, in which the at least one transistor that configures the active load includes a plurality of bipolar transistors that includes the plurality of control terminals.

[B-9] The comparator described in [B-8] described above, in which, in the plurality of bipolar transistors, emitter terminals and collector terminals are alternately connected in series, and all base terminals are commonized.

[B-10] The comparator described in [B-9] described above, in which the plurality of bipolar transistors is dispersedly disposed in active regions different from each other, and is connected in series by a wiring line.

[B-11] The comparator described in [B-10] described above, in which the plurality of bipolar transistors is connected in series by the wiring line, across the active regions different from each other.

[B-12] The comparator described in [B-9] described above,
in which the plurality of bipolar transistors is disposed in an identical active region, and a base terminal is commonized among the plurality of bipolar transistors.

[B-13] The comparator described in [B-1] described above,
in which the at least one transistor that configures the active load includes a Fin-FET.

<<C. Electronic Device>>

[C-1] An electronic device including:
a solid-state imaging element including:
a pixel array in which a plurality of unit pixels is arranged in a matrix shape, the plurality of unit pixels each including a photoelectric conversion unit; and
an analog-to-digital conversion unit that converts an analog pixel signal into a digital signal, the analog pixel signal being output from each of the plurality of unit pixels of the pixel array,
in which the analog-to-digital conversion unit includes a comparator that includes a differential input unit and an active load of the differential input unit, the differential input unit using, as an input, a prescribed reference signal and the analog pixel signal,
at least one transistor that configures the active load includes a plurality of control terminals that controls current, and
the plurality of control terminals is electrically connected in common.

[C-2] The electronic device described in [C-1] described above,
in which the at least one transistor that configures the active load includes a plurality of field effect transistors that includes the plurality of control terminals.

[C-3] The electronic device described in [C-2] described above,
in which, in the plurality of field effect transistors, drain regions and source regions are alternately connected in series, and all gate terminals are commonized.

[C-4] The electronic device described in [C-3] described above,
in which the plurality of field effect transistors is disposed in an identical active region.

[C-5] The electronic device described in [C-4] described above,
in which the plurality of field effect transistors is connected in series via an active region.

[C-6] The electronic device described in [C-3] described above,
in which the plurality of field effect transistors is dispersedly disposed in active regions different from each other, and the active regions different from each other are connected by a wiring line.

[C-7] The electronic device described in any of [C-3] described above to [C-5] described above,
in which a dummy gate terminal is disposed in an active region in which the field effect transistor is not formed.

[C-8] The electronic device described in [C-1] described above,
in which the at least one transistor that configures the active load includes a plurality of bipolar transistors that includes the plurality of control terminals.

[C-9] The electronic device described in [C-8] described above,
in which, in the plurality of bipolar transistors, emitter regions and collector regions are alternately connected in series, and all base terminals are commonized.

[C-10] The electronic device described in [C-9] described above,
in which the plurality of bipolar transistors is dispersedly disposed in active regions different from each other, and is connected in series by a wiring line.

[C-11] The electronic device described in [C-10] described above,
in which the plurality of bipolar transistors is connected in series by the wiring line, across the active regions different from each other.

[C-12] The electronic device described in [C-9] described above,
in which the plurality of bipolar transistors is disposed in an identical active region, and a base terminal is commonized among the plurality of bipolar transistors.

[C-13] The electronic device described in [C-1] described above,
in which the at least one transistor that configures the active load includes a Fin-FET.

REFERENCE SIGNS LIST

| | |
|---|---|
| 1 | CMOS image sensor |
| 2 | Unit pixel |
| 11 | Pixel array |
| 12 | Row selector |
| 13 | Constant current source unit |
| 14 | Analog-to-digital conversion unit |
| 15 | Horizontal transfer scanner |
| 16 | Signal processing unit |
| 17 | Timing controller |
| 18 | Horizontal transfer line |
| 19 | Reference signal generator |
| 21 | Photodiode (photoelectric conversion unit) |
| 22 | Transfer transistor |
| 23 | Reset transistor |
| 24 | Amplification transistor |
| 25 | Selection transistor |
| 31 ($31_1$ to $31_m$) | Pixel driving line |
| 32 ($32_1$ to $32_n$) | Vertical signal line |
| 140 | Single slope type analog-to-digital converter |
| 141 ($141_1$, $141_2$) | Comparator |
| 1411 | Differential input unit |
| 1412 | Constant current source |
| 1413 | Active load |

The invention claimed is:

1. A solid-state imaging element comprising:
a pixel array in which a plurality of unit pixels is arranged in a matrix shape, the plurality of unit pixels each including a photoelectric conversion unit; and
an analog-to-digital converter configured to convert an analog pixel signal into a digital signal, the analog pixel signal being output from each of the plurality of unit pixels of the pixel array, wherein
the analog-to-digital converter includes a comparator that includes a differential input unit and an active load of the differential input unit, the differential input unit including a first input for receiving a prescribed reference signal and a second input for receiving the analog pixel signal, the active load being connected to the first input and the second input of the differential input unit,
at least one transistor that configures the active load includes a plurality of control terminals that controls current, and
the plurality of control terminals is electrically connected in common.

2. The solid-state imaging element according to claim 1, wherein
the at least one transistor that configures the active load includes a plurality of field effect transistors that includes the plurality of control terminals.

3. The solid-state imaging element according to claim 2, wherein,
in the plurality of field effect transistors, drain regions and source regions are alternately connected in series, and all gate terminals are commonized.

4. The solid-state imaging element according to claim 3, wherein
each of the plurality of field effect transistors are respectively disposed in an identical configured active region.

5. The solid-state imaging element according to claim 4, wherein
each of the plurality of field effect transistors are respectively connected in series via an active region.

6. The solid-state imaging element according to claim 3, wherein
each of the plurality of field effect transistors are dispersedly disposed in active regions different from each other, and the active regions different from each other are connected by a wiring line.

7. The solid-state imaging element according to claim 3, wherein
a dummy gate terminal is disposed in an active region in which the plurality of field effect transistors is not formed.

8. The solid-state imaging element according to claim 1, wherein
the at least one transistor that configures the active load includes a plurality of bipolar transistors that includes the plurality of control terminals.

9. The solid-state imaging element according to claim 8, wherein,
in the plurality of bipolar transistors, emitter regions and collector regions are alternately connected in series, and all base terminals are commonized.

10. The solid-state imaging element according to claim 9, wherein
the plurality of bipolar transistors is dispersedly disposed in active regions different from each other, and is connected in series by a wiring line.

11. solid-state imaging element according to claim 10, wherein
the plurality of bipolar transistors is connected in series by the wiring line, across the active regions different from each other.

12. The solid-state imaging element according to claim 9, wherein
the plurality of bipolar transistors is disposed in an identical active region, and a base terminal is commonized among the plurality of bipolar transistors.

13. The solid-state imaging element according to claim 1, wherein
the at least one transistor that configures the active load includes a Fin-FET.

14. A comparator comprising:
a differential input unit including a first input for receiving a prescribed reference signal and a second input for receiving an analog pixel signal; and
an active load of the differential input unit that is connected to the first input and the second input of the differential input unit, wherein
at least one transistor that configures the active load includes a plurality of control terminals that controls current, and
the plurality of control terminals is electrically connected in common.

15. An electronic device comprising:
a solid-state imaging element including:
a pixel array in which a plurality of unit pixels is arranged in a matrix shape, the plurality of unit pixels each including a photoelectric conversion unit; and
an analog-to-digital converter configured to convert an analog pixel signal into a digital signal, the analog pixel signal being output from each of the plurality of unit pixels of the pixel array, wherein
the analog-to-digital converter includes a comparator that includes a differential input unit and an active load of the differential input unit, the differential input unit including a first input for receiving a prescribed reference signal and a second input for receiving the analog pixel signal, the active load being connected to the first input and the second input of the differential input unit,
at least one transistor that configures the active load includes a plurality of control terminals that controls current, and
the plurality of control terminals is electrically connected in common.

* * * * *